US011250175B2

United States Patent
Ishii et al.

(10) Patent No.: US 11,250,175 B2
(45) Date of Patent: Feb. 15, 2022

(54) SPATIAL-INFORMATION GENERATION APPARATUS, SPATIAL-INFORMATION GENERATION METHOD, AND NON-TRANSITORY COMPUTER READABLE MEDIUM

(71) Applicant: KABUSHIKI KAISHA TOSHIBA, Tokyo (JP)

(72) Inventors: Gaku Ishii, Kanagawa (JP); Ena Ishii, Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 1108 days.

(21) Appl. No.: 15/699,022

(22) Filed: Sep. 8, 2017

(65) Prior Publication Data

US 2018/0011950 A1 Jan. 11, 2018

Related U.S. Application Data

(63) Continuation of application No. PCT/JP2015/076178, filed on Sep. 15, 2015.

(51) Int. Cl.
*G06F 30/13* (2020.01)

(52) U.S. Cl.
CPC .................................. *G06F 30/13* (2020.01)

(58) Field of Classification Search
CPC ...... G06F 30/13; G06F 30/20; G06T 2210/04
(Continued)

(56) References Cited

U.S. PATENT DOCUMENTS

| 6,405,142 | B1 | 6/2002 | Ogawa et al. |
| 8,229,713 | B2 | 7/2012 | Hamann et al. |

(Continued)

FOREIGN PATENT DOCUMENTS

| JP | 2000-057127 | 2/2000 |
| JP | 2002-022220 | 1/2002 |

(Continued)

OTHER PUBLICATIONS

Haunert et al, "Optimal simplification of building ground plans", 2008, The International Archives of the Photogrammetry, Remote Sensing and Spatial Information Sciences. Vol. XXXVII. Part B2 (Year: 2008).*

(Continued)

*Primary Examiner* — Kamini S Shah
*Assistant Examiner* — Faraj Ayoub
(74) *Attorney, Agent, or Firm* — Finnegan, Henderson, Farabow, Garrett & Dunner L.L.P.

(57) ABSTRACT

A spatial-information generation apparatus according to an embodiment of the present invention includes a reference-plane acquirer, a simplification-section setter, and a shape simplifier. The reference-plane acquirer acquires, on the basis of a first spatial object related to a first space, first attribute information indicating attributes of the first spatial object, and first relation information indicating a relation between the first spatial object and objects of other constituent elements of the building, a reference plane object related to a plane of a part of the first space from the first spatial object and generates a shape of the reference plane object. The simplification-section setter sets a simplification section, which is a target to be simplified, in the shape of the reference plane object. The shape simplifier simplifies the shape of the reference plane object in the simplification section to thereby generate the reference plane object in the simplified shape.

20 Claims, 38 Drawing Sheets

(58) Field of Classification Search
USPC .......................................................... 703/2
See application file for complete search history.

(56) References Cited

U.S. PATENT DOCUMENTS

| | | | |
|---|---|---|---|
| 8,666,320 B2 | 3/2014 | Motoyoshi et al. | |
| 2010/0081390 A1 | 4/2010 | Motoyoshi et al. | |
| 2013/0211791 A1* | 8/2013 | Tsai | G06T 17/10 |
| | | | 703/1 |

FOREIGN PATENT DOCUMENTS

| | | |
|---|---|---|
| JP | 2002-56039 | 2/2002 |
| JP | 2003-178299 | 6/2003 |
| JP | 2005-157829 | 6/2005 |
| JP | 2007-87331 A | 4/2007 |
| JP | 2007087331 A * | 4/2007 |
| JP | 2008-102843 | 5/2008 |
| JP | 2014-010732 | 1/2014 |
| JP | 5520380 | 6/2014 |
| WO | WO 2008/099927 A1 | 8/2008 |

OTHER PUBLICATIONS

Siddique Baig, "A Three-Step Strategy for Generalization of Three-Dimensional Buildings Modelled in City Geography Markup Language", 2013, Faculty of Geoinformation and Real Estate University Technology Malaysia (Year: 2013).*

International Preliminary Report on Patentability and Written Opinion issued by The International Bureau of WIPO dated Mar. 29, 2018, for International Patent Application No. PCT/JP2015/076178.

Clayton Miller et al., "BIM-Extracted EnergyPlus Model Calibration for Retrofit Analysis of a Historically Listed Building in Switzerland", 2014 ASHRAE/IBPSA-USA Building Simulation Conference, Atlanta, GA Sep. 10-12, 2014, pp. 331-338.

James T. O'Donnell et al., "Transforming BIM to BEM: Generation of Building Geometry for the NASA Ames Sustainability Base BIM", LBNL-6033E, Jan. 2013, pp. 1-26.

English-language International Search Report from the Japanese Patent Patent Office for International Application No. PCT/JP2015/076178, dated Nov. 17, 2015.

* cited by examiner

FIG. 3

SELECTION OF TARGET SPACE
- FLOOR [ ]
  [SELECT ALL] [RELEASE ALL]
  [ ]
  [SELECT ALL] [RELEASE ALL]

SELECTION CONDITION
| | LOWER LIMIT VALUE | UPPER LIMIT VALUE |
|---|---|---|
| · AREA | [ ] ~ | [ ] |
| · NAME | [ ] | |
| · USE | [ ▽] | |
| · STATE | [ ▽] | |

- ADJACENCY [ ]
- RANGE [ ]
  ◉ INCLUDED ○ PART
- SIMILARITY [SHAPE ▽] [STRUCTURE ▽]

[APPLY]

◉ AND ○ OR
◉ 2D ○ 3D

SHAPE MACHINING
- DIRECTION REFERENCE [ ▽]
- OMISSION TARGET [ ▽]
- SHORT-CIRCUIT DISTANCE [ ]
- MACHINING RATIO [ ]
- SHAPE RESTORATION [ ▽]

ZONING
- DIVISION REFERENCE [ ▽]
- ADOPTION REFERENCE [ ▽]
- MAXIMUM AREA [ ]
- MAXIMUM INTERVAL COEFFICIENT [ ▽] (NUMBER OF ELEMENTS)
- SUBDIVIDING METHOD REFERENCE [ ▽] (AREA)
- AGGREGATING METHOD [ ▽]
- SITUATION CONSIDERATION [ ▽]

EXECUTION POINT
- ERROR ALLOWANCE [ ] (LEVEL)

OUTPUT POINT
- SPACE HEIGHT [ ▽]
- SCHEMER ☐ IFC ☐ ifcXML
  ☐ gbXML ☐ COBie
  ☐ MQTT

[CANCEL] [EXECUTE]

FIG. 3

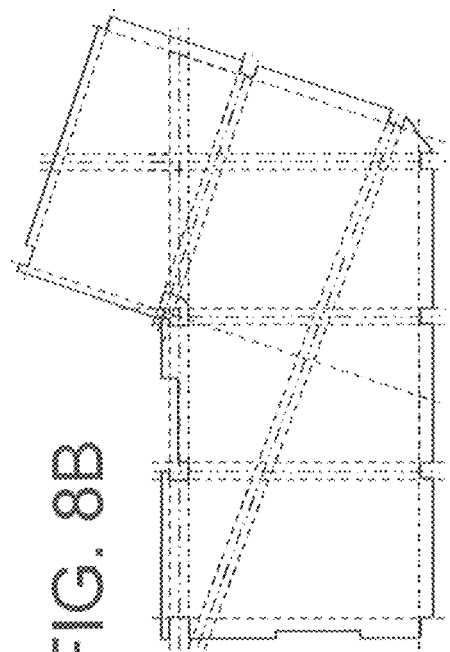
FIG. 8B
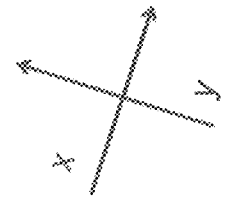
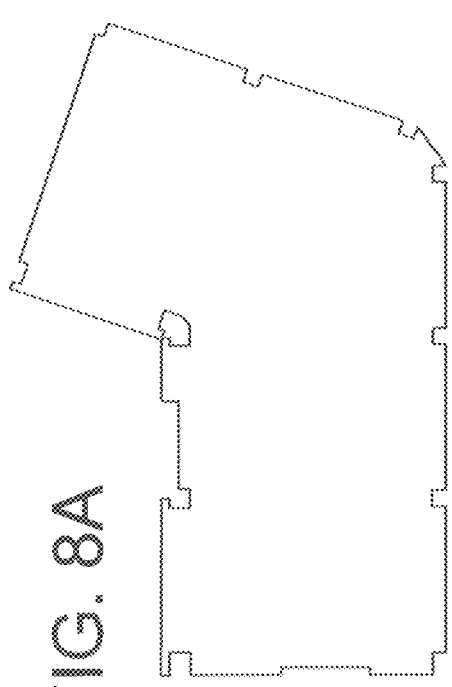
FIG. 8A
FIG. 8D
DIRECTION AXES
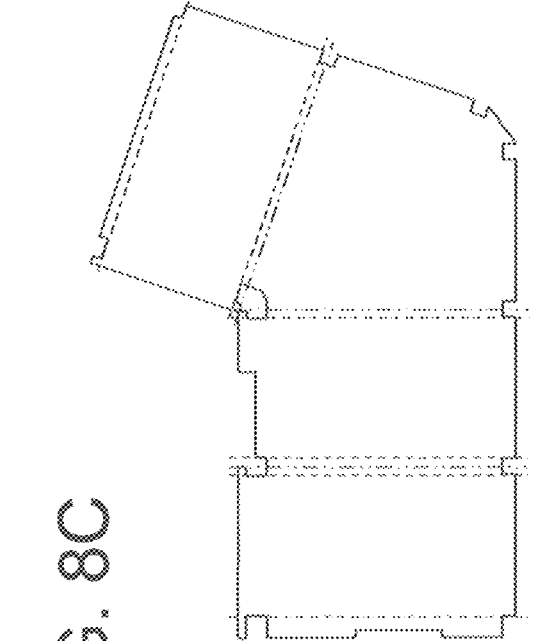
FIG. 8C

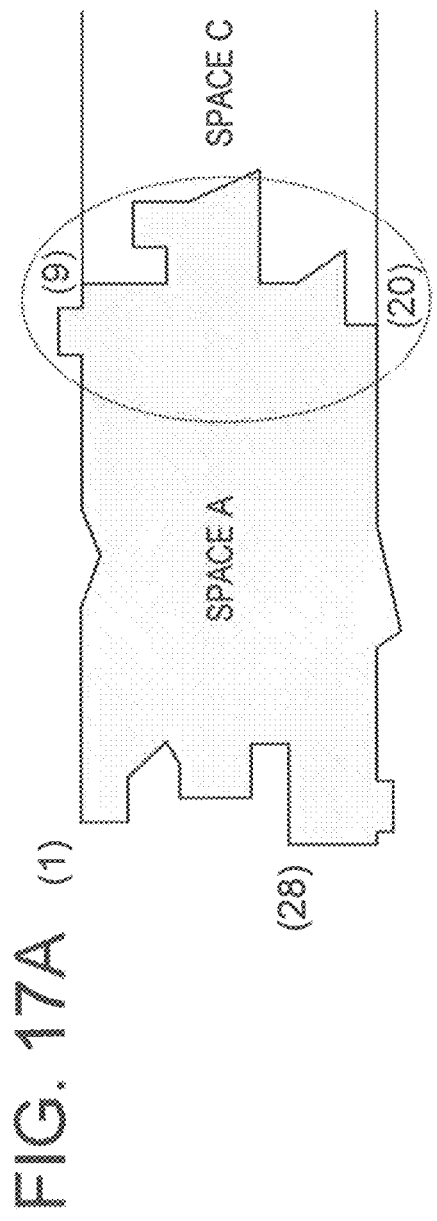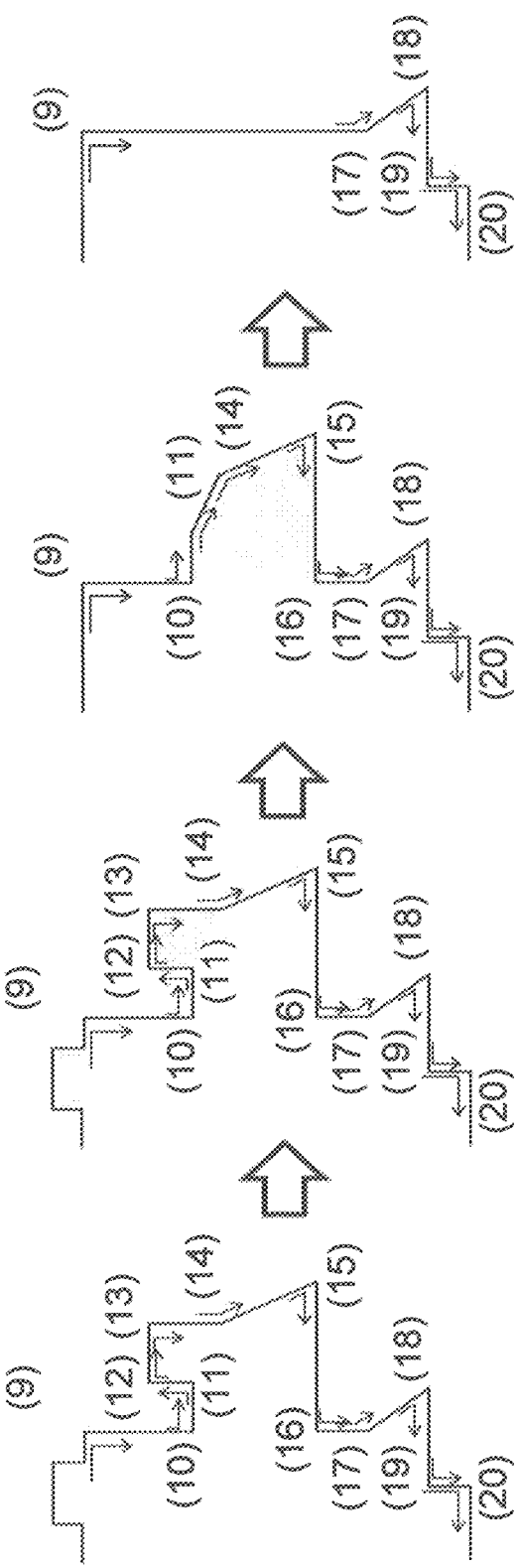

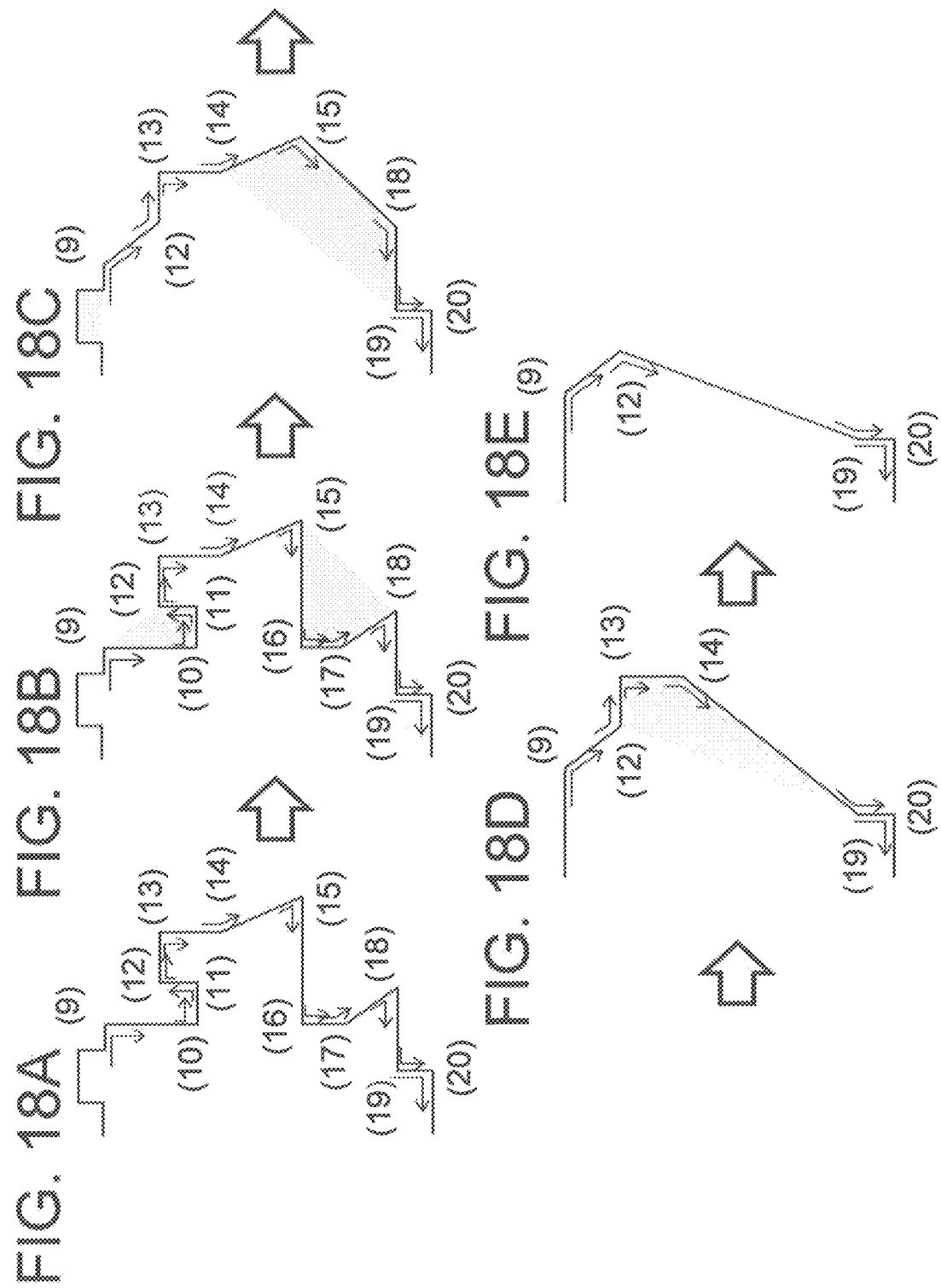

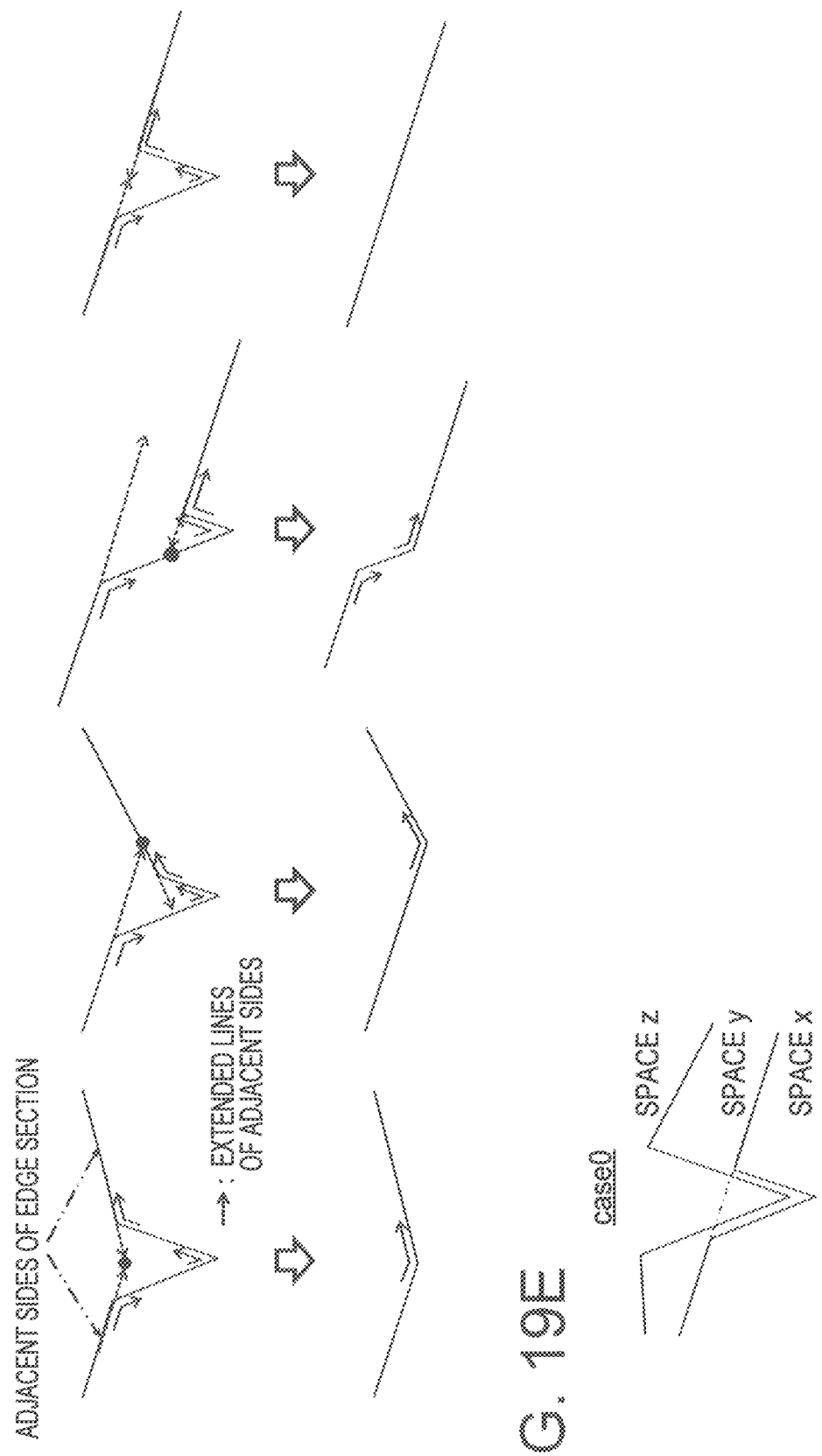

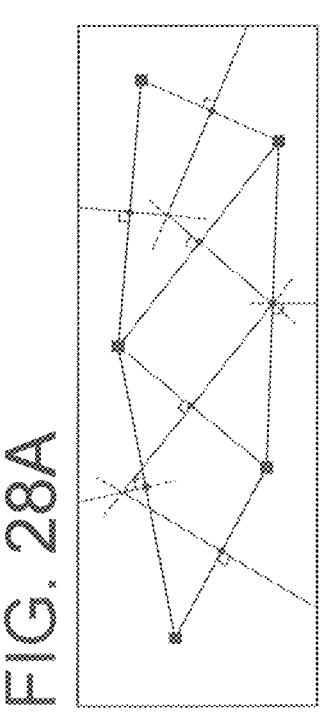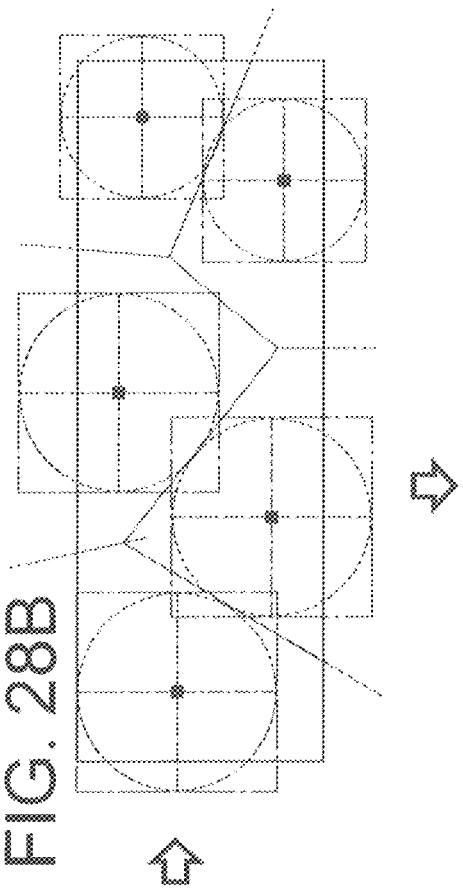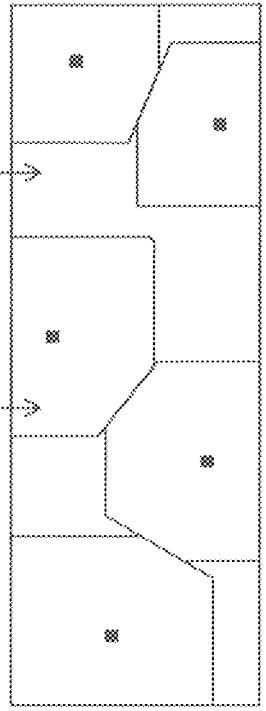

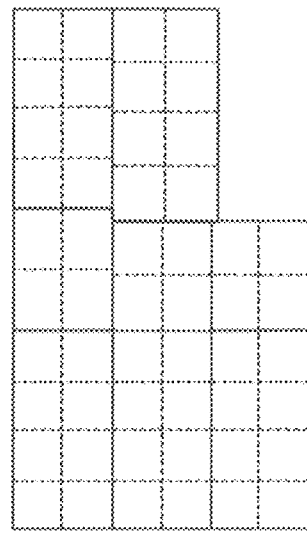
FIG. 32C
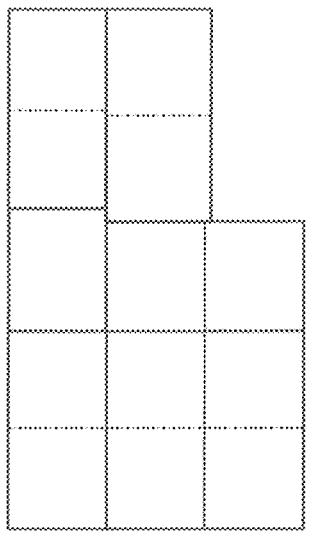
FIG. 32B
▓ DIVISION UNIT
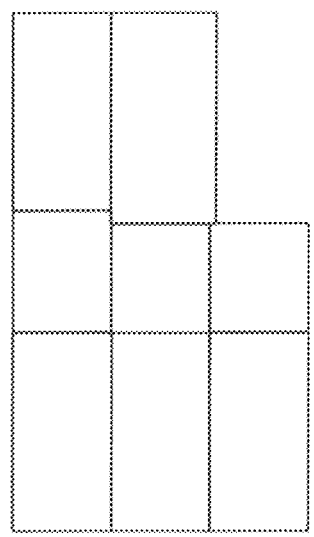
FIG. 32A

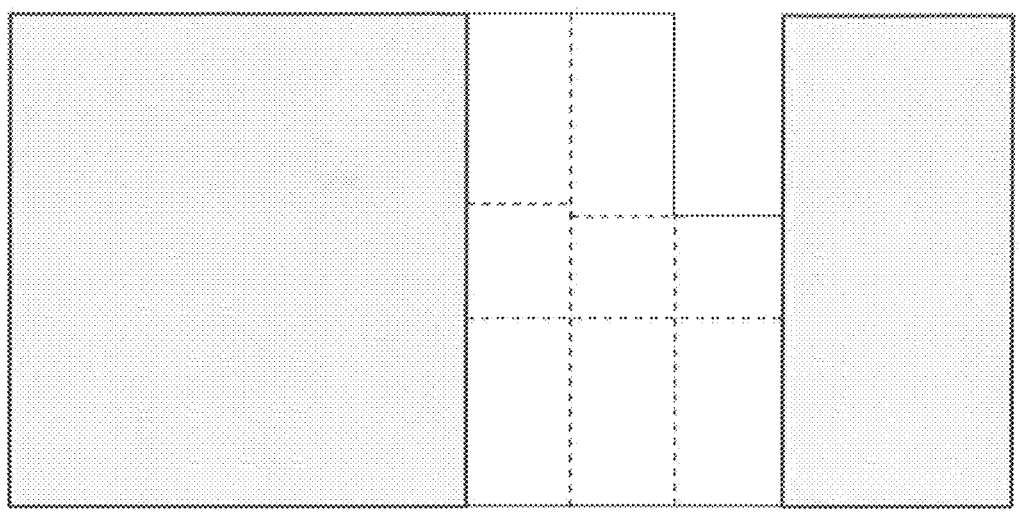
FIG. 33B
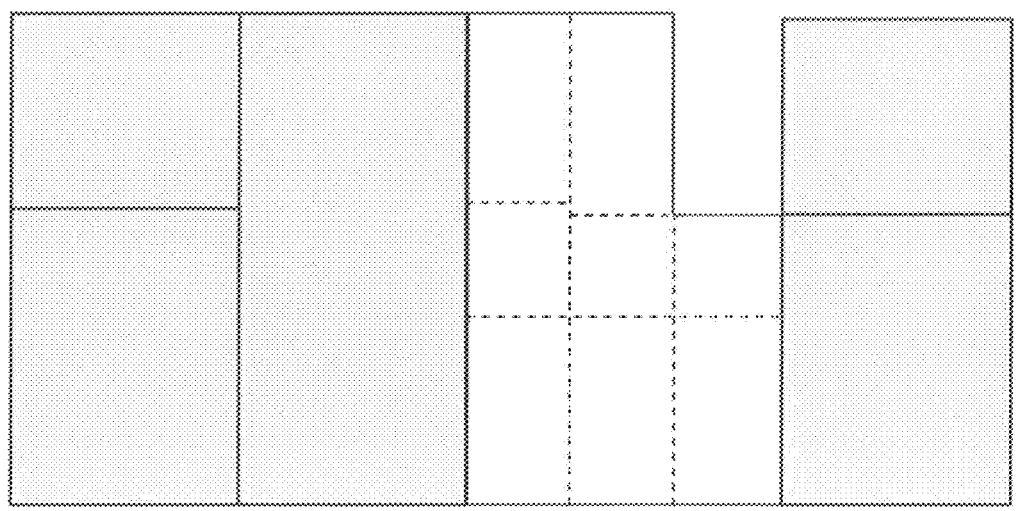
FIG. 33A

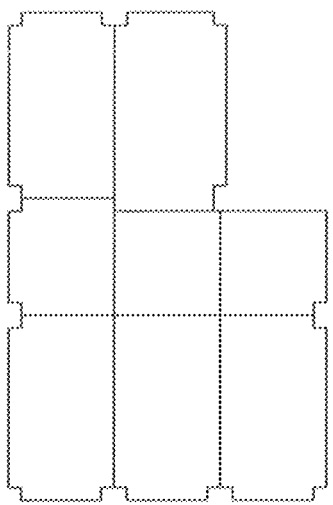
FIG. 35B
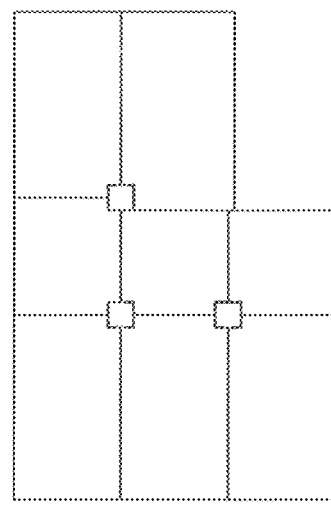
FIG. 35C
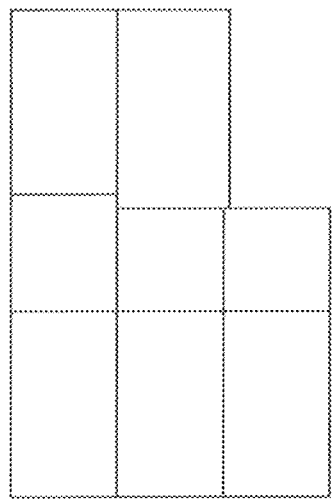
FIG. 35A

SPATIAL-INFORMATION GENERATION APPARATUS, SPATIAL-INFORMATION GENERATION METHOD, AND NON-TRANSITORY COMPUTER READABLE MEDIUM

CROSS-REFERENCE TO RELATED APPLICATION (S)

This application is a Continuation of International Application No. PCT/JP2015/076178, filed on Sep. 15, 2015, the entire contents of which is hereby incorporated by reference.

FIELD

An Embodiment described herein relates generally to a spatial-information generation apparatus, a spatial-information generation method, and a non-transitory computer readable medium.

BACKGROUND

In planning and detailed design of buildings, utilization of BIM (Building Information Modeling) is spreading. BIM means constructing a three-dimensional building information model (a BIM model) on a computer using BIM software. The building information model includes, in addition to three-dimensional shape information, attribute information serving as construction elements such as information concerning rooms, e.g., types, names, areas, materials, and specifications of members and relation information in formation of a building such as a structural relation, a configuration relation, and a connection relation. It is possible to visualize complicated and stereoscopic design conditions by using the BIM model. Advantages such as speedup of examination of plans and a reduction in deviation between design and actual circumstances are obtained.

In order to realize advanced building operation and maintenance, attempts for unitarily managing and utilizing a produced BIM model over a life cycle of a building have been actively performed. The BIM model is utilized for disposition design, analytical evaluation, and the like of building equipment as well. On the other hand, in uses other than the planning and the detailed design, in general, the BIM model is converted into a data format of other software in use and utilized.

Since the BIM model includes various kinds of attribute information and relation information, a lot of information unnecessary for the disposition design, the analytical evaluation, and the like of the facilities is also included. In general, representation is excessively fine concerning the three-dimensional shape Information. Therefore, if data obtained by simply converting the data format of the BIM model is used, there is a problem in that large cost is required for calculation processing such as analyses and simulations. For example, in the building operation and maintenance, it is difficult to obtain a response within a very short control cycle.

The BIM model targets a physical object that is actually produced and constructed. Therefore, virtually designed spaces and the like represented by attributes such as uses and states in analyses, simulations, and the like are often not included in the BIM model. Therefore, when software other than BIM is used, information not included in the BIM model has to be put in order. Problems such as labor and time for putting the Information in order and securing of consistency with the BIM model also occur.

BRIEF DESCRIPTION OF THE DRAWINGS

FIG. 3 is a diagram showing an example of a screen for acquiring an input from a user.

FIGS. 8A to 8D are diagrams showing another example of the method of acquiring direction axes.

FIGS. 17A to 17E are diagrams for explaining simplification of a convex section in linearization.

FIGS. 18A to 18E are diagrams for explaining simplification of a concave section in the linearization.

FIGS. 19A to 19E are diagrams for explaining simplification of a concave edge.

FIGS. 28A to 28C are diagrams for explaining generation and reconfiguration of divided pieces by Voronoi boundaries.

FIGS. 32A to 32C are diagrams for explaining division by divided-piece generating methods 3 and 4.

FIGS. 33A and 33B are diagrams for explaining aggregation.

FIGS. 35A to 35C are diagrams showing an example of a result of restoration processing of a shape restorer 61.

DETAILED DESCRIPTION

An embodiment of the present invention provides a spatial-information generation apparatus that deletes, from spatial information, information unnecessary for processing for utilizing the spatial information and generating spatial information in which an information amount is reduced.

A spatial-information generation apparatus according to an embodiment of the present invention includes: a reference-plane acquirer that acquires, on the basis of a first spatial object related to a first space, which is one of constituent elements configuring a building, first attribute information indicating attributes of the first spatial object, and first relation information indicating a relation between the first spatial object and objects of other constituent elements of the building, a reference plane object related to a plane of a part of the first space from the first spatial object and generates a shape of the reference plane object; a simplification-section setter that sets a simplification section, which is a target to be simplified, in the shape of the reference plane object; and a shape simplifier that simplifies the shape of the reference plane object in the simplification section to thereby generate the reference plane object in the simplified shape.

Below, a description is given of embodiments of the present invention with reference to the drawings. The present invention is not limited to the embodiments.
(Embodiment of the Present Invention)

Figure 1:
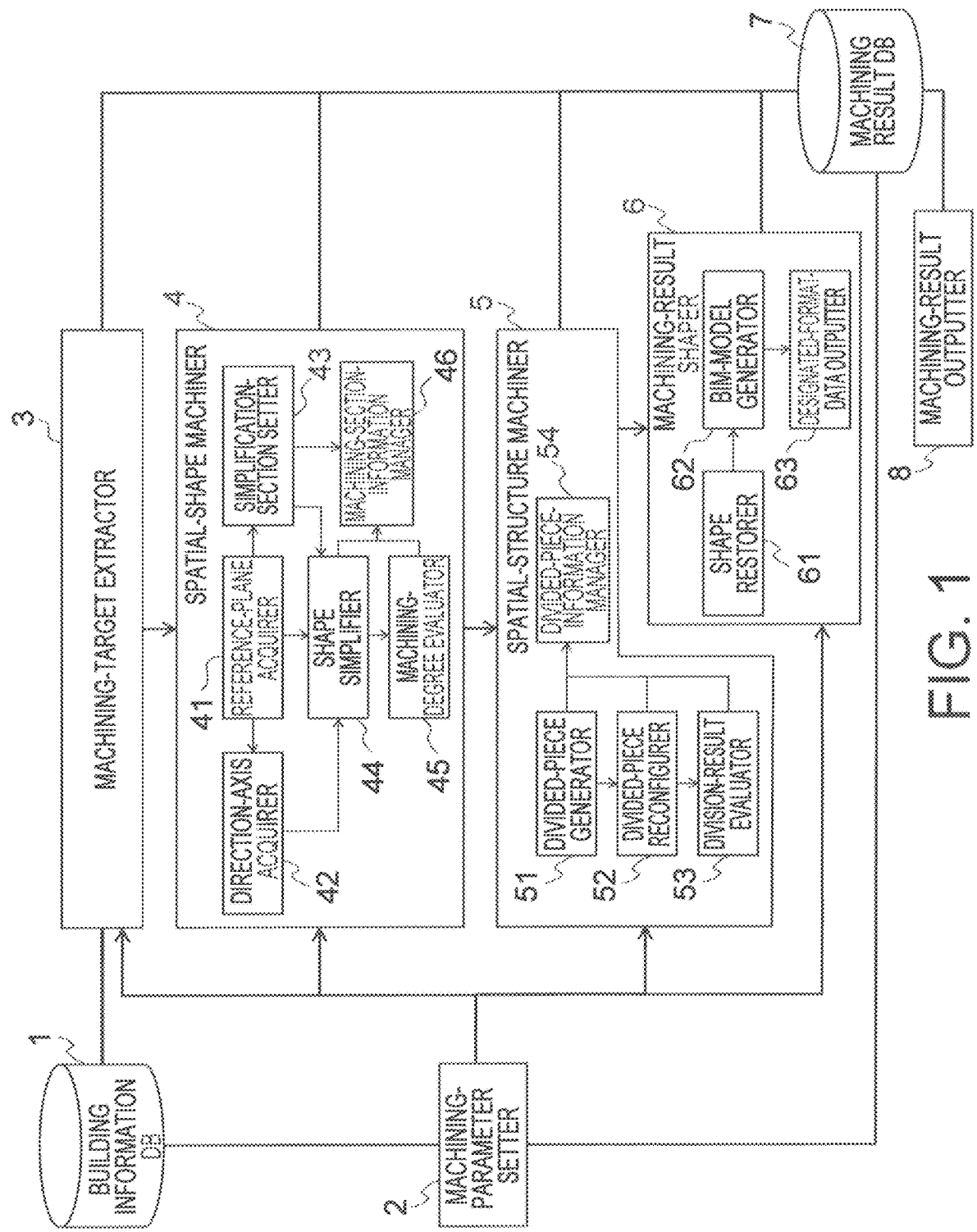
FIG. 1 is a block diagram showing an example of a schematic configuration of a spatial-information generation apparatus according to an embodiment of the present invention.

FIG. 1 is a block diagram showing an example of a schematic configuration of a spatial-information generation apparatus according to an embodiment of the present invention. The spatial-information generation apparatus according to the embodiment of the present invention includes a building information DB 1, a machining-parameter setter 2, a machining-target extractor 3, a spatial-shape machiner 4, a spatial-structure machiner 5, a machining-result shaper 6, a machining result DB 7, and a machining-result outputter 8.

The spatial-shape machiner 4 includes a reference-plane acquirer 41, a direction-axis acquirer 42, a simplification-section setter 43, a shape simplifier 44, a machining-degree evaluator 45, and a machining-section-information manager 46.

The spatial-structure machiner 5 includes a divided-piece generator 51, a divided-piece reconfigurer 52, a division-result evaluator 53, and a divided-piece-information manager 54.

The machining-result shaper 6 includes a shape restorer 61, a BIM-model generator 62, and a designated-format-data outputter 63.

The spatial-information generation apparatus according to the embodiment of the present invention performs several kinds of machining processing on building information such as data, for example, a BIM model stored in the building information DB 1 to thereby reduce an information amount of the building information. Consequently, a load of processing such as a simulation that utilizes the building information decreases.

The machining processing may include a processing to transform or simplify a shape of a designated space. Also, the machining processing may include a processing to divide the space and a processing to combine the spaces. The space on which to the machining processing is performed may be space object of the BIM model.

Figure 2:
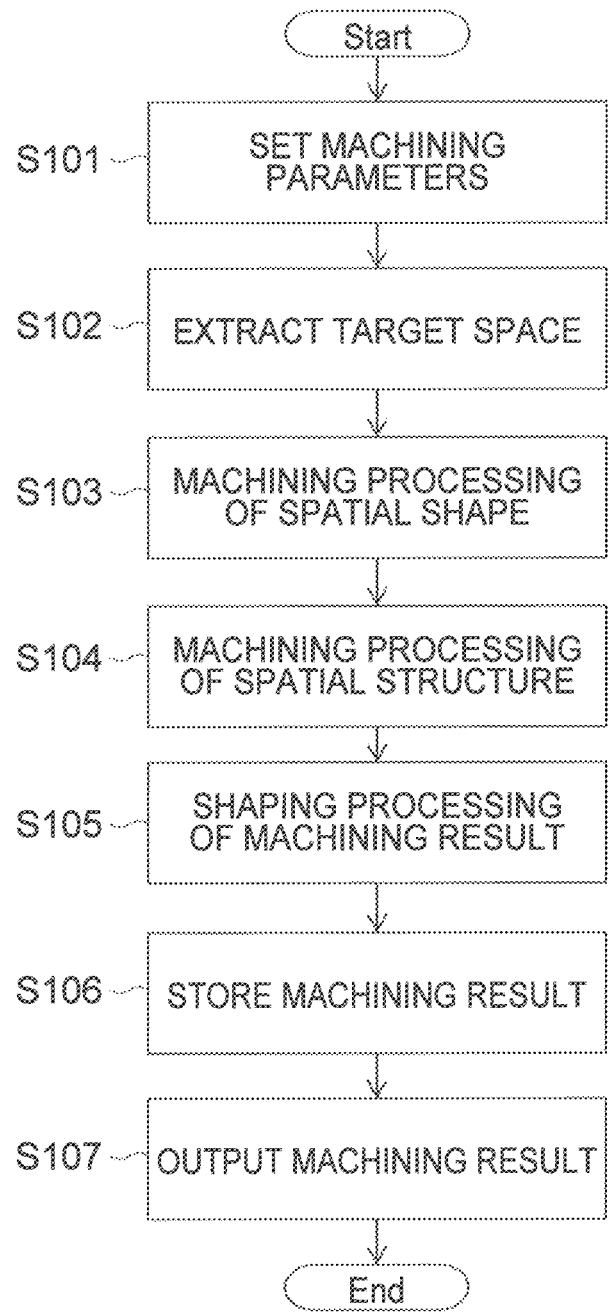
FIG. 2 is a flowchart of schematic processing of the spatial-information generation apparatus according to the embodiment of the present invention.

FIG. 2 is a flowchart of schematic processing of the spatial-information generation apparatus according to the embodiment of the present invention. The machining-parameter setter 2 receives an input from a user and sets machining parameters (S101). The machining parameters are sent to the machining-target extractor 3, the spatial-shape machiner 4, the spatial-structure machiner 5, and the machining-result shaper 6.

The machining-target extractor 3 extracts a space (a room) designated from the machining-parameter setter 2 (S102). The spatial-shape machiner 4 performs, on the space extracted by the machining-target extractor 3, machining processing concerning a shape of the space (S103). The machining concerning a shape is, for example, simplifying shapes of the outer periphery, the inner periphery, and the like of the space.

The spatial-structure machiner 5 performs, on the space machined by the spatial-shape machiner 4, machining processing concerning a structure (S104). The machining concerning a structure is, for example, dividing a space to be machined into a plurality of spaces and aggregating the plurality of spaces into one.

The machining-result shaper 5 performs shaping processing on machining results by the spatial-shape machiner 3 and the spatial-structure machiner 4 (S105). Shaping is, for example, restoring a part of a simplified shape and processing machining result into a necessary data format.

The machining result DB 7 stores the shaped machining results (S106). The machining-result outputter 8 outputs the machining results (S107). A flow of the schematic processing of the spatial-information generation apparatus is as explained above.

Details of the components included in the spatial-information generation apparatus according to the embodiment of the present invention are explained.

The building information DB 1 stores building information. The building information includes an object, attribute information (building attributes) concerning attributes of the object, and relation information representing a relation with other objects. As the object, there are, for example, objects representing spaces, members (components), equipment, and the like configuring a building. The objects include information concerning shapes such as position coordinates of vertexes. The spaces represent spaces (rooms) surrounded by floors, walls, ceilings, imaginary partitions, and the like. Even when a space is not partitioned by a door and the like and there is no building member serving as a boundary of the space, it may be assumed that an imaginary partition is present. The spaces include both of a plane and a solid. As parts or components of the building, there are, for example, windows, columns, and stairs. The equipment only has to be apparatuses present in the building such as air-conditioning apparatuses, lights, sensors, and wireless access points.

As the attribute information, there are, for example, a name, an area, a volume, a material, a quality of the material, performance, a user, and a state of the object and a floor where the object is present. As the relation information, there are a structural relation, a configuration relation, a connection relation, and the like. Details of these kinds of information are explained below.

Note that information used for the machining processing only has to be included in the building information used by the spatial-information generation apparatus according to the embodiment of the present invention. Information not used for the machining processing does not have to be included in the building information. For example, if attributes of a material are unnecessary for the machining processing, values of the attributes of the material may be empty. The building information may be generated by the BIM software or may be machined or created anew for the spatial-information generation apparatus. In the following explanation, it is assumed that a BIM model is machined. However, the building information only has to be data including building information like the BIM model.

The machining-parameter setter 2 receives an input from the user and sets values of parameters used by the machining-target extractor 3, the spatial-shape machiner 4, the spatial-structure machiner 5, and the machining-result shaper 6. As the parameters to be set, there are a machining purpose, a machining range, a machining target, a machining level, a machining method, and the like. As the machining purpose, there is, for example, a name of a simulation or the like in which data machined by the spatial-information generation apparatus is used. As the machining level, there is, for example, a threshold of an area to be machined. As the machining method, there are division, aggregation, and the like. For the division, there are an element reference and references of a use and the like. For the aggregation, there are references of a use and the like.

FIG. 3 is a diagram showing an example of a screen for acquiring an input from the user. The machining-parameter setter 2 generates such an input screen in order to acquire an input from the user. A left half of the input screen is a portion concerning selection of a target space, selection conditions, and the like. Inputs to the portion are converted into values of parameters for the machining-target extractor 3. A right half of the input screen is a portion to which an instruction concerning machining for the selected target space is input. The instruction concerning the machining is converted into parameters for the spatial-shape machiner 4, the spatial-structure machiner 5, and the machining-result shaper 6.

Note that the screen is an example. A form of the screen is not limited to FIG. 3. For example, the screen may be a screen that makes use of a GUI of a CAD system for drawing building information.

Portions concerning selection of a target space, selection conditions, and the like are explained.

The user designates a machining target object from a selection area of a target space. The machining-parameter setter 2 may acquire, from the building information DB 1, one or more kinds of information of selection targets, for example, spaces such as floors or rooms and display the information taking into account convenience of the user to cause the user to select a selection target. To extract and display the selection target information, for example, the machining-parameter setter 2 extracts a Building Storey object of the BIM model from the building information DB 1 and displays a value of a Name attribute of the extracted Building Storey object. Consequently, it is possible to display Information concerning floors of a building. For example, the machining-parameter setter 2 acquires a Space object of the BIM model and relation information of floors and spaces from the building information DB 1 and, when the user selects a floor number, displays a value of a Name attribute of a Space object corresponding to the floor number. Consequently, it is possible to realize display of a space 1 to a space n (n is an integer equal to or larger than 1) present in the selected floor as a list.

The machining-parameter setter 2 may cause the user to input conditions for a selection target and display a selection target matching the conditions. As the conditions, an area, a name, a use, a state, adjacency, a proximity range, similarity, and the like are conceivable. As the conditions, attribute information and relation information of objects only have to be used.

The use represents a purpose or a form of use of a space such as an office, a laboratory, a meeting room, and a cafeteria. As the state, in use (expected), in use (unexpected), unused, and the like are conceivable.

The adjacency means an adjacent distance to a selected spatial object. For example, the adjacency is information concerning adjacent distances to objects such as an adjacent distance 1 to an object present next and an adjacent distance 2 to an object present after the next. Consequently, for example, when an adjacent distance 3 is input as a condition, it is possible to set three objects from the selected spatial object as objects of selection.

The range (the proximity range) is a range within an input physical distance set as proximity. Only a space included in the physical distance may be set as a target (inclusion designation) or a space, at least a part of which is included in the physical distance, may be set as a target (partial designation).

As the similarity (a similar characteristic), for example, taking notice of the shapes of planes such as walls or bottom surfaces, when the shapes of the planes coincide with each other or analogous to each other, the shapes are considered to be similar. The similarity of the shapes of the planes is referred to as shape-based similarity. Coincidence in the shape-based similarity means coincidence of both of shapes and sizes. Analogy in the shape-based similarity means that shapes coincide with each other but sizes are different from each other. The shapes of the planes may include results of the machining processing of the spatial-shape machiner 4 and the spatial-structure machiner 5. Similarity or dissimilarity may be determined on the basis of information calculated in the machining processing.

Taking notice of directions of opening sections such as windows or doors, directions of direction axes, or the like, it is conceivable to determine similarity according to whether the directions coincide with each other. Such similarity concerning the directions of objects is referred to as structure-based similarity. As coincidence and analogy in the structure-based similarity, when a difference between the directions of the direction axes is included in a range corresponding to the coincidence or a range corresponding to the analogy, it is conceivable to determine similarity. For example, the difference of 0 degree to 1 degree may be considered coincidence. The difference of 1 degree to 5 degrees may be considered analogy. Only complete absence of the difference may be considered coincidence. In the structure-based similarity, similarity and dissimilarity may be determined on the basis of the information calculated in the machining processing.

A search condition may be either an AND condition or an OR condition. The search condition may be either 2D designation (plane search) or 3D designation (solid search). The 2D designation (the plane search) is designation for setting, as a search target, only an object present in a floor set as a machining target or a floor where a space set as a machining target is present. In the 3D designation (the solid search), in addition to a search range of the 2D designation (the plane search), floors above and below the floor is included in targets.

An instruction concerning machining for a selected target space on the right side of the screen is explained.

A portion displayed as shape machining at the upper right of the screen is a portion to which parameters used by the spatial-shape machiner 4 are input. As parameters concerning the shape machining, a direction reference, an omission target, a short-circuit distance, a machining ratio, shape restoration, and the like are conceivable. The respective items are explained in explanation of the spatial-shape machiner 4.

A portion displayed as zoning in the middle on the right side of the screen is a portion to which parameters used by the spatial-structure machiner 5 are input. As parameters concerning structure machining, a division reference, an adoption reference, a maximum area, a maximum interval, a subdividing method, an aggregating method, situation consideration, and the like are conceivable. The respective items are explained in explanation of the spatial-structure machiner 5.

A portion displayed as execution point at the lower right of the screen is a portion to which an error allowance level, which is a parameter used for geometric calculation, is input. The error allowance level represents accuracy guaranteed in coordinate calculation and is used in the spatial-shape machiner 4 or the spatial-structure machiner 5 that performs the geometric calculation. As the error allowance level is lower, determination of parallelism, crossing, and overlapping is more strictly performed. As the error allowance level is higher, the determination is further relaxed. In general, by increasing and reducing the number of significant decimal digits in the determination, the strictness of the determination is adjusted.

A portion displayed as output points at the lower right of the screen is a portion to which an output format, which is a parameter used by the machining-result shaper 6, is input. The output format is explained in explanation of the machining-result shaper 6.

Note that, when the BIM model is used, types of items (designated elements) designated in the machining-parameter setter 2 only have to conform to a conceptual system of the BIM model. There is, for example, a conceptual system defined by IFC (Industrial Foundation Classes) or a conceptual system defined by gbXML (The Green Building XML). To display content of building information, for example, a UI in which the conceptual system of the BIM model is displayed as a list or a tree only has to be used.

When extraction of an object or the like matching conditions is instructed from the machining-parameter setter 2, the machining-target extractor 3 extracts the object or the like matching the conditions from the building information stored in the building information DB 1.

For example, when a search condition acquired from the machining-parameter setter 2 is the area, the machining-target extractor 3 refers to an area attribute of a spatial object present in the building information DB 1. When the search condition is the name, the machining-target extractor 3 refers to a name attribute of the spatial object present in the building information DB 1. Besides, the same applies to the use, the state, the adjacency, the proximity range, the similarity, and the like described above. As a search method, a publicly-known BIM model attribute search method such as a BIMQL (building Information Model Query Language) only has to be used.

Note that, assuming that machining processing is performed using the building information stored in the building information DB 1, the machining-target extractor 3 extracts the building information from the building information DB 1. However, the machining-target extractor 3 may extract a machining result from the machining result DB 7.

The machining-target extractor 3 may include a component that performs extraction. The machining-target extractor 3 may include an individual searcher corresponding to a type or the like of information to be searched such as a BIM-model-attribute searcher that searches for attributes of the BIM model or a spatial-object searcher that searches for a spatial object. In order to extract a similar shape or structure, the machining-target extractor 3 may include a similar-shape determiner or a similar-structure determiner. As a determining method, for the shape-based similarity, a publicly-known shape determining method only has to be used. For the structure-based similarity, a publicly-known BIM model attribute searching method such as BIMQL only has to be used. Alternatively, information calculated when the machining processing is performed, for example, direction axes or the like explained below may be used.

The machining-target extractor 3 may individually include a space-use estimator or a spatial-state estimator that estimates a use, a state, or the like of a search target space. For example, when an object, a value of an attribute of a designated search condition of which is not input, is present or when an item itself of the attribute is absent, it is conceivable to estimate the attribute value for each object with the estimator.

For example, when the search condition is the "use (a purpose of use and a form of a space)", the machining-target extractor 3 refers to a use attribute of the spatial object. However, when a value is not input to the use attribute of the spatial object (when the value is empty), the space-use estimator may estimate a "use" of the spatial object.

The machining-target extractor 3 or the space-use estimator estimates a use of the space from time-series data related to the spatial object. As the time-series data for estimating a use, data such as temperature and humidity, $CO_2$ concentration, the number of people present, and power consumption of a room or the like indicated by the object are conceivable. It is assumed that the time-series data related to the spatial object is measured by a measurement sensor or the like and stored in the building information DB 1. Note that the time-series data may be stored in a not-shown storage other than the building information DB 1.

The machining-target extractor 3 or the space-use estimator retains in advance a fluctuation pattern of an attribute value characteristically caused by a way of use of the space. The machining-target extractor 3 or the space-use estimator compares the acquired data and the fluctuation pattern to determine whether the acquired data and the fluctuation pattern coincide with each other, calculates a similarity degree or the like, and estimates a use of the space.

For example, when the search condition is the "state (a use state of the space such as whether an operation load of equipment is within assumption or exceeds assumption)", machining-target extractor 3 refers to a state attribute of the spatial object. However, when a value of the state attribute of the spatial object is empty or when an item of the "state" is absent in the attributes of the spatial object, the spatial-state estimator may estimate the "state" of the spatial object.

As the time-series data for estimating a state, an energy amount such as power consumption, an equipment operation amount such as a flow velocity or a flow rate of an air conditioning and sanitation system, or the like is conceivable. Otherwise, the estimation is the same as the estimation of a use.

The spatial-shape machiner 4 acquires a plane object, which is a part of the spatial object, from the spatial object acquired from the machining-target extractor 3 and generates a shape of the plane object. The shape of the plane object is a reference of a shape of the spatial object. The plane object is herein referred to as reference plane. The spatial-shape machiner 4 generates a shape of the reference plane and, from the shape of the reference plane, simplifies a shape of a portion concerning an element designated from the machining-parameter setter 2 or a portion of an element of a designated type. Consequently, the number of sides concerning the element of the reference plane is reduced. This simplification is herein referred to as element simplification.

The spatial-shape machiner 4 simplifies a convex section or a concave section smaller than a threshold present on an adjacent side on which the spatial object acquired from the machining-target extractor 3 and a spatial object adjacent to the spatial object are in contact on the reference plane. This simplification is herein referred to as linearization.

Figure 4A:
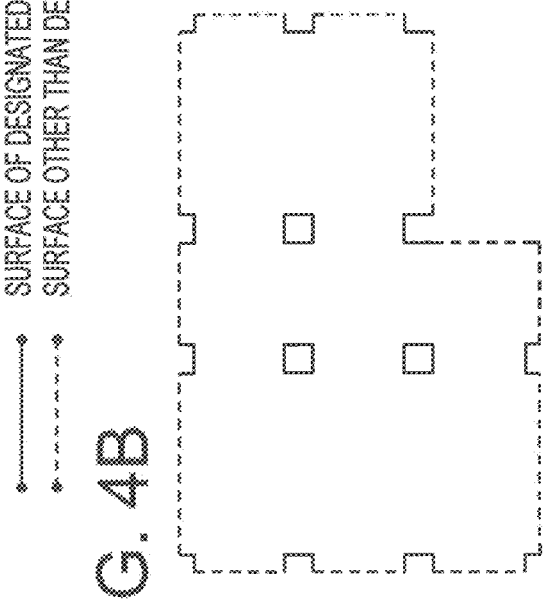
FIGS. 4A to 4D are diagrams showing an example of element simplification.
Figure 4B:
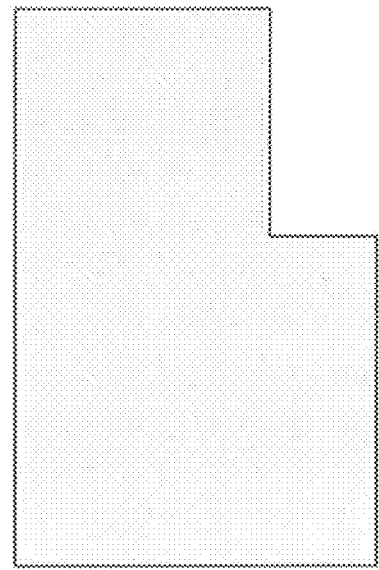
Figure 4C:
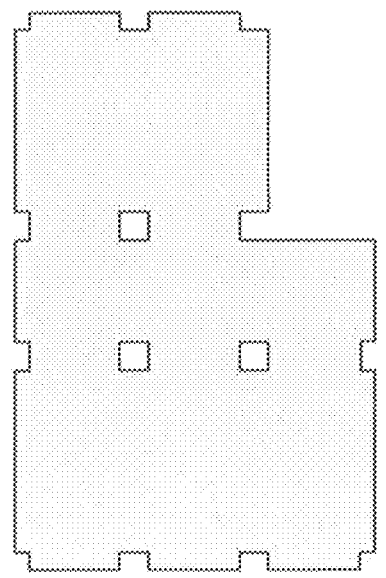
Figure 4D:
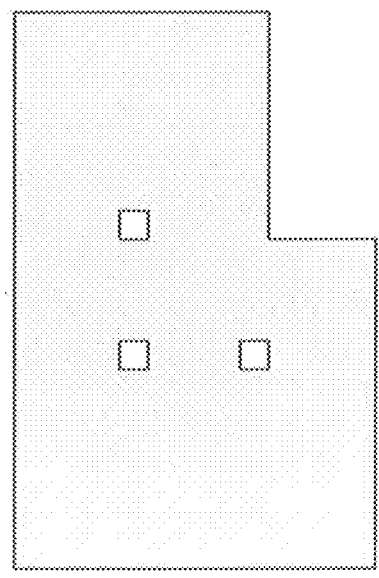

FIGS. 4A to 4D are diagrams showing an example of element simplification. FIG. 4A is a diagram showing a reference plane before machining. In FIG. 4B, sides related to columns, which are designated elements in this example, are indicated by solid lines and lines other than the columns are indicated by dotted lines. FIG. 4C is a diagram showing a halfway process of simplification processing. FIG. 4D shows the reference plane after the machining.

When the element simplification is performed, a designated element set as a target of omission can be designated from the "omission target" displayed on the input screen of the machining-parameter setter 2. For example, when a column is designated, a surface concerning the column is simplified.

On the reference plane before the machining, recesses (concave sections) due to columns are present in the outer periphery and free spaces due to columns are present on the inside. Such recesses, spaces, and the like are important as design elements but may be unnecessary in an analysis and the like. For example, in analyses of an inflow amount of air conditioning from an air-conditioning apparatus and a radio wave state of a wireless antenna, in some case, information concerning the free spaces on the inside due to the columns is necessary but the recesses due to the columns in the outer periphery are unnecessary. If such unnecessary information is granted to the analysis processing, an excess load is applied. Therefore, the spatial-shape machiner 4 deletes designated unnecessary information that should be omitted.

The spatial-shape machiner 4 distinguishes a surface concerning the columns of the designated elements and the other surfaces and simplifies the surface concerning the columns. First, the columns in the outer periphery are simplified. In FIG. 4C, the concave sections in the outer periphery have disappeared. The free spaces due to the columns on the inside are simplified. In FIG. 4D, all surfaces concerning the columns are deleted. In this way, the spatial-shape machiner 4 simplifies the reference plane.

Note that the free spaces due to the columns on the inside are also simplified. However, information concerning the free spaces on the inside due to the columns is sometimes necessary. The free spaces on the inside due to the columns are sometimes restored. Restoration of elements and the like deleted by the machining processing is performed by the machining-result shaper 6.

Figure 5A:
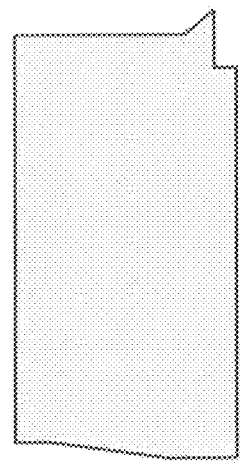
FIGS. 5A to 5D are diagrams showing an example of linearization.
Figure 5B:
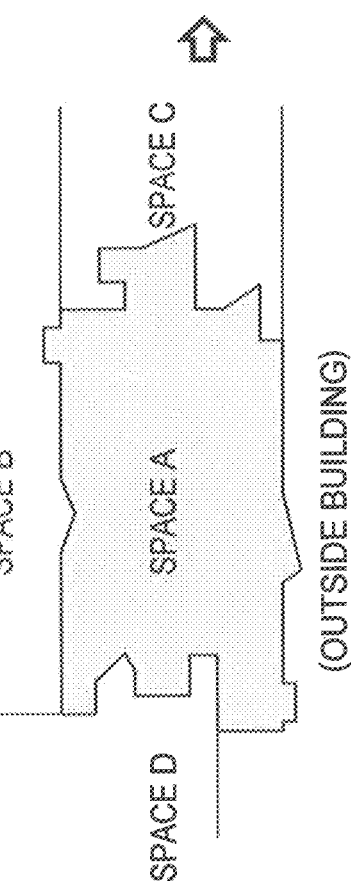
Figure 5C:
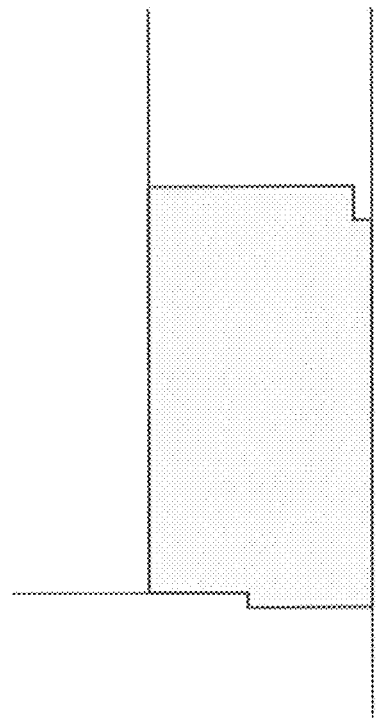
Figure 5D:
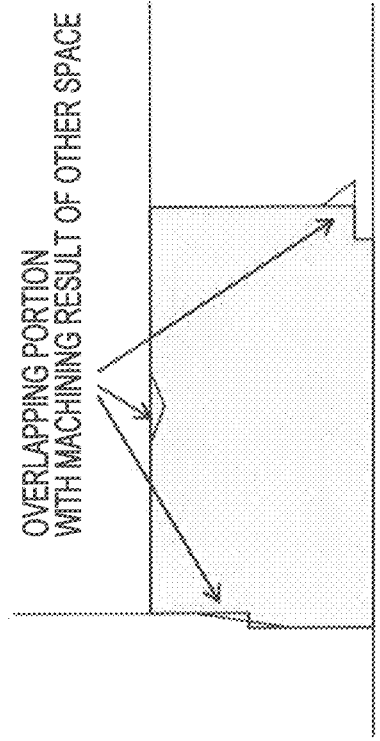

FIGS. 5A to 5D are diagrams showing an example of linearization. Convex sections and recessed sections smaller than a threshold decided in advance present in the outer periphery of a space are linearized and an Information amount of an object is reduced. FIG. 5A is a diagram showing a reference plane before linearization processing. FIG. 5B and FIG. 5C show halfway processes of the linearization processing. In FIG. 5B, convex sections and concave sections are simplified on the basis of a method decided in advance. FIG. 5C shows overlapping portions of simplified spaces and other spaces. Simplification processing is further performed concerning the overlapping portions. FIG. 5D shows a reference plane after simplification. In this way, the spatial-shape machiner 4 linearizes the reference plane.

The spatial-shape machiner 4 performs one or both of the element simplification and the linearization to thereby generate a simplified reference plane from which unnecessary information is excluded. Consequently, it is possible to reduce a load of processing such as a simulation in which a machining result is used. It is possible to reduce a time period until calculation of a calculation result.

Figure 6:
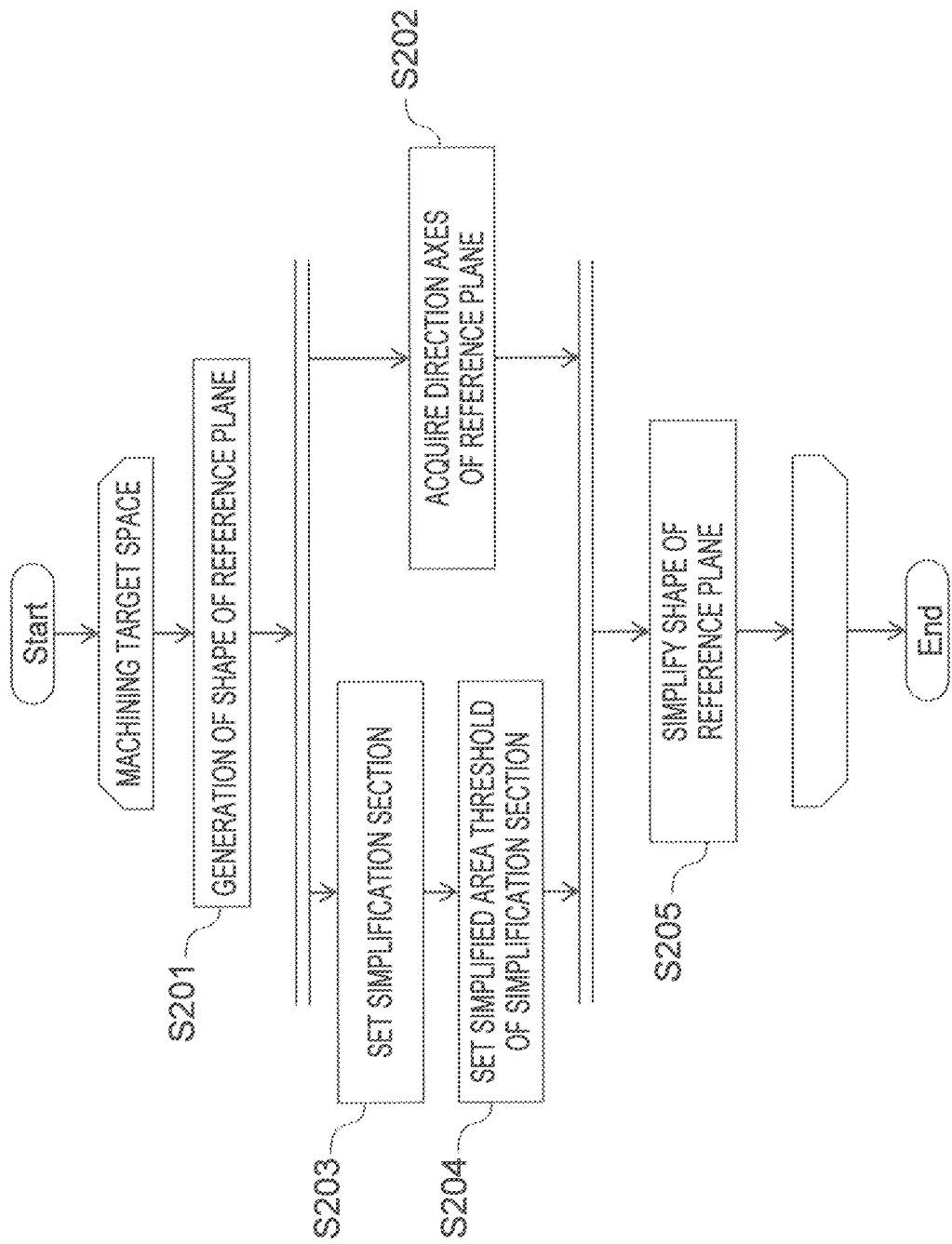
FIG. 6 is a schematic flowchart of spatial-shape machining processing of a spatial-shape machiner.

FIG. 6 is a schematic flowchart of spatial-shape machining processing by the spatial-shape machiner 4. The spatial-shape machiner 4 performs the processing on all machining target spatial objects (machining target spaces). First, the spatial-shape machiner 4 performs generation of a shape of a reference plane (S201). Subsequently, after the generation of the reference plane, the spatial-shape machiner 4 acquires direction axes of the reference plane (S202). The direction axes of the reference plane serve as a reference in performing division and the like of the reference plane.

The spatial-shape machiner 4 sets a simplification section (S203) and a simplified area threshold in the simplification section (S204). The simplification section is a target section of simplification of a shape generated by dividing a side, which forms the reference plane, into a plurality of sections. The simplified area threshold indicates an upper limit value of an area deleted by the simplification by the spatial-shape machiner 4. The simplified area threshold prevents an area from being excessively deleted by the simplification.

The acquisition of the direction axes (S202) may be performed in parallel to the setting of the machining section and the simplified area threshold (S203 and S204) or may be performed before or after the setting of the machining section and the simplified area threshold. After the acquisition of the direction axes (S202) and the setting of the machining section and the simplified area threshold (S203 and S204) are completed, the spatial-shape machiner 4 simplifies the shape of the reference plane (S205). The simplification may be one or both of the element simplification and the linearization. The schematic flowchart of the spatial-shape machining processing is as explained above.

Details of the spatial-shape machiner 4 are further explained.

The reference-plane acquirer 41 generates a shape of the reference plane. A surface serving as the reference plane may be decided in advance or may be designated from the machining-parameter setter 2. In the construction field, the reference plane is often a floor surface (a bottom surface). Therefore, in the following explanation, it is assumed that the reference plane is the floor surface.

When the floor surface is set as the reference plane, the reference-plane acquirer 41 detects the floor surface on the basis of the attribute information and the relation information of the machining target space. After detecting the floor surface, the reference-plane acquirer 41 generates a shape of the reference plane on the basis of a generation method decided in advance. As the generation method, for example, it is conceivable to adopt a method of acquiring two-dimensional coordinates of all vertexes of all elements concerning the floor surface, calculating sides connecting the vertexes, and generating a shape forming a largest closed loop. As another method, only vertexes concerning the floor surface are extracted from all vertexes of all elements concerning side surface surrounding a space, for example, walls and a shape forming a largest closed loop is generated on the basis of two-dimensional coordinates of the vertexes and sides connecting the vertexes. Note that, for example, when there is an error in a coordinate, a connection relation among the walls may be taken into account.

Figure 7:
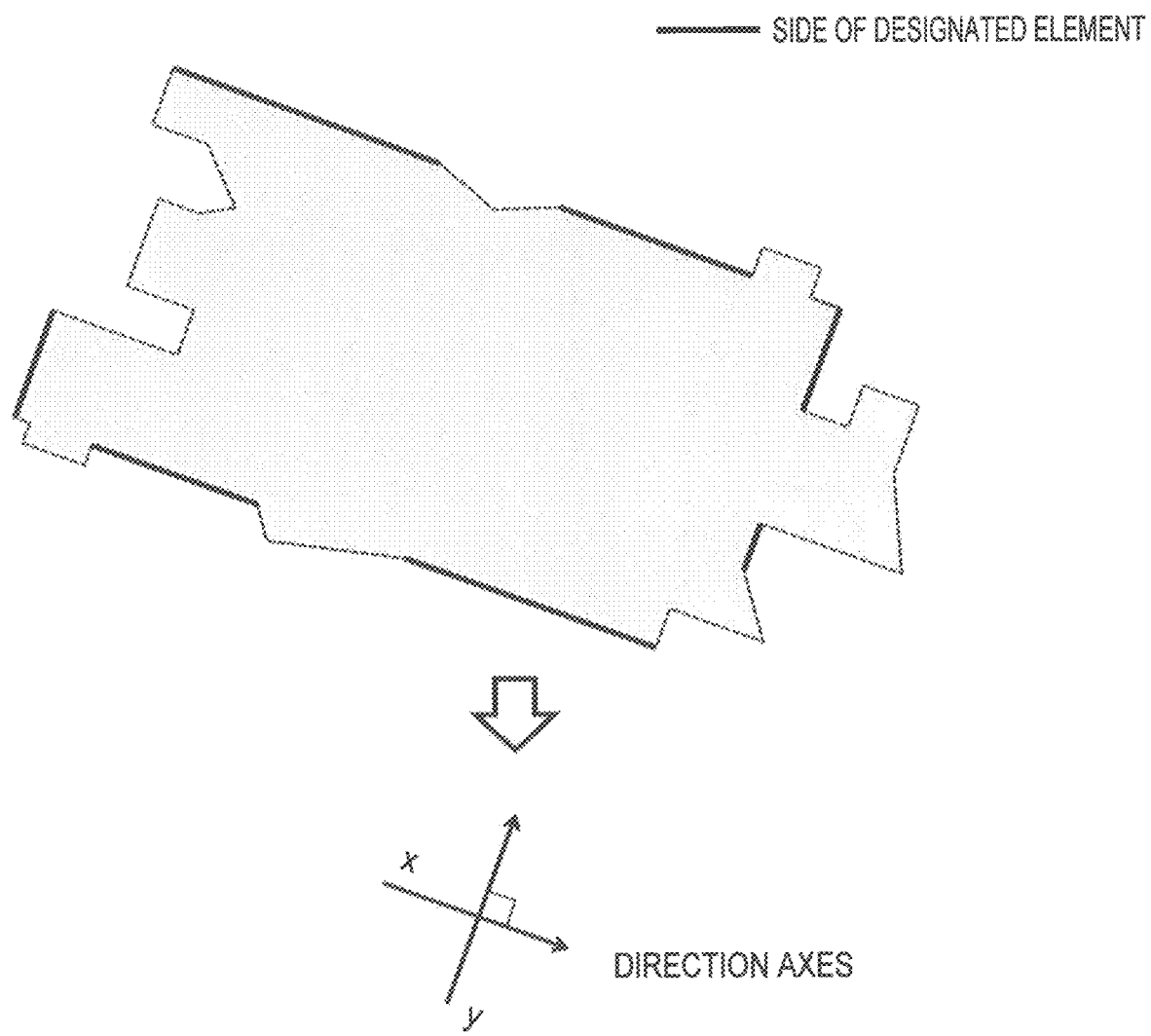
FIG. 7 is a diagram showing an example of a method of acquiring direction axes.

The direction-axis acquirer 42 acquires direction axes for each reference plane. FIG. 7 is a diagram showing an example of a method of acquiring direction axes. The direction-axis acquirer 42 acquires directions (vectors) of sides related to elements designated as direction references among the sides forming the reference plane. In FIG. 7, the sides related to the designated elements are indicated by solid lines. After grasping the directions of the sides in all the sides of the designated elements, the direction-axis acquirer 42 confirms whether there is a combination of orthogonal sides. When a set of orthogonal sides is found, the direction-axis acquirer 42 sets the set of the sides as direction axes. When a plurality of sets of orthogonal sides are found, the direction-axis acquirer 42 may sets a plurality of direction axes or may select one direction axis.

Another method of acquiring direction axes is explained. FIGS. 8A to 8D are diagrams showing another example of the method of acquiring direction axes. In the method explained above, the sides are focused. However, in this method, the positions of elements designated as direction references are focused. In FIGS. 8A to 8D, it is assumed that columns are selected as designated elements. The positions of the columns are set as reference positions. The direction-axis acquirer 42 extracts a plurality of columns, which are reference positions, from a reference plane shown in FIG. 8A and generates division lines shown in FIG. 8B from the respective plurality of columns. After grasping the directions of all the division lines, the direction-axis acquirer 42 confirms whether there is a combination of orthogonal division lines. When there is no orthogonal division line, the direction-axis acquirer 42 deletes the division lines. Consequently, only orthogonal division lines remain as shown in FIG. 8C. The direction-axis acquirer 42 sets the remaining orthogonal division lines as direction axes. When there are a plurality of orthogonal division lines, as shown in FIG. 8D, the direction-axis acquirer 42 may set a plurality of direction axes or may select one direction axis.

Figure 9:
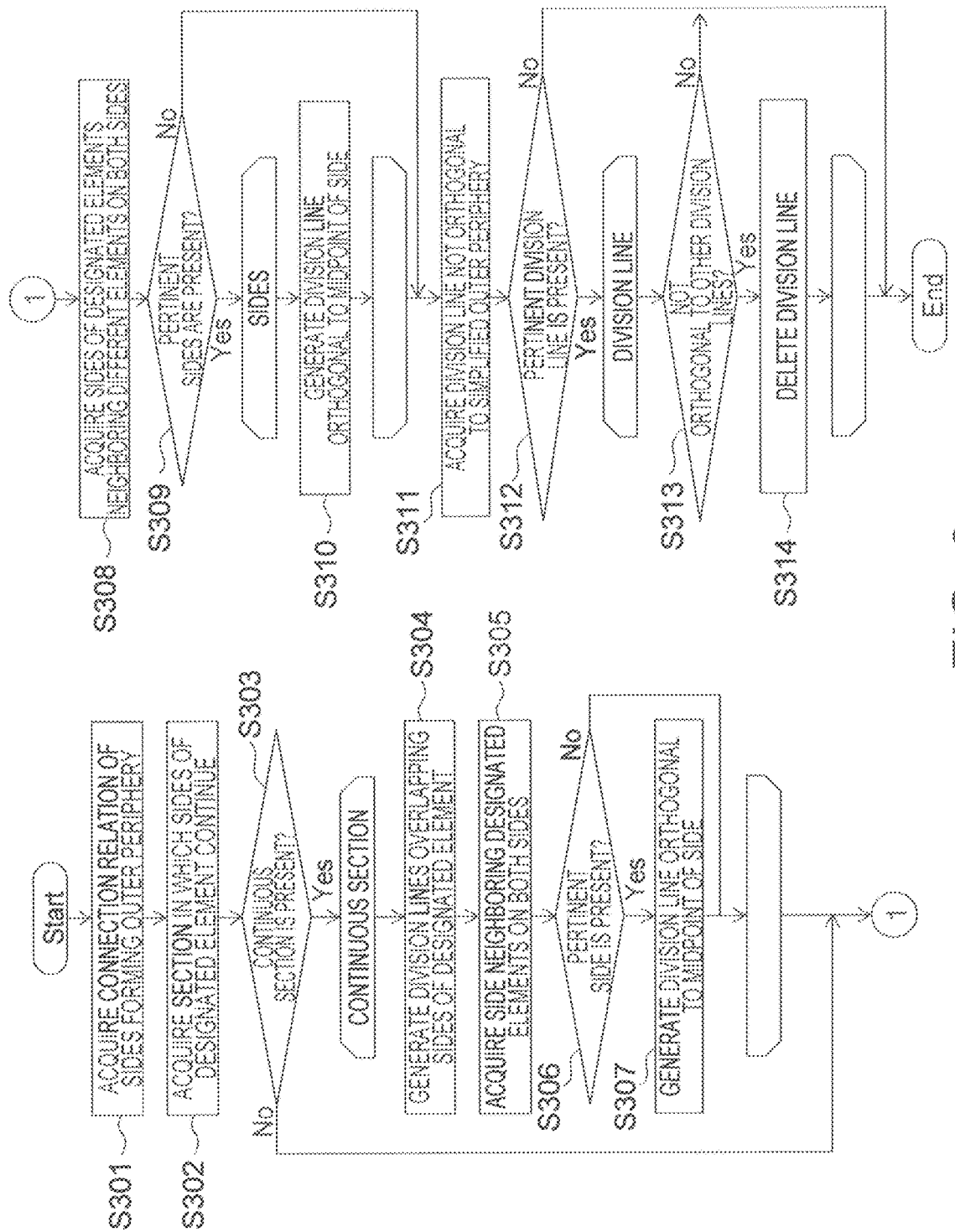
FIG. 9 is a flowchart for generating division lines.

FIG. 9 is a flowchart for generating division lines. The direction-axis acquirer 42 acquires a connection relation of sides forming the outer periphery of a reference plane (S301) and acquires, on the basis of the connection relation, sections in which sides of designated elements such as columns continue (S302). When continuous sections are present (YES in S303), the direction-axis acquirer 42 performs generation of division lines with respect to the respective continuous sections. Specifically, the direction-axis acquirer 42 generates division lines overlapping the sides of the designated elements (S304). The direction-axis acquirer 42 acquires a side neighboring designated elements on both sides (S305). The side means a side in a recessed portion of a concave section (a side not in contact with the outer periphery of the reference plane). If the side can be acquired (YES in S306), the direction-axis acquirer 42 generates a division line orthogonal to a midpoint of the side (S307). Consequently, the direction-axis acquirer 42 generates division lines of continuous sections.

When there is no continuous section (NO in S303) or after performing generation processing (S307) of division lines for all the continuous sections, the direction-axis acquirer 42 acquires sides of designated elements neighboring different elements on both sides (S308). If the sides can be acquired (YES in S309), with respect to the respective acquired sides, the direction-axis acquirer 42 generates division lines orthogonal to a midpoint of the side (S310). When there is no relevant side (NO in S309) or after performing generation processing (S310) of division lines for all the acquired sides, the direction-axis acquirer 42 acquires a division line not orthogonal to the outer periphery after simplification (S311). When there is no division line (NO in S312), the direction-axis acquirer 42 ends the processing. After the division line is acquired (YES in S312), the direction-axis acquirer 42 confirms whether the division line is orthogonal to another division line. When the division line is not orthogonal to another division line (YES in S313), the direction-axis acquirer 42 deletes the division line (S314). Consequently, it is possible to delete an unnecessary division line that cannot be set as direction axes. When the confirmation and the deletion are finished for all the division lines, this flow ends.

When direction axes cannot be acquired by the method decided in advance explained above, for convenience, direction axes in an adjacent space are acquired. When the direction axes of the adjacent space cannot be acquired either, a search range is gradually expanded to find an acquirable space.

Note that a designated element necessary in generating direction axes can be designated from a "direction reference" displayed on the input screen of the machining-parameter setter 2.

The simplification-section setter 43 sets (generates) simplification sections with respect to respective sides forming a reference plane on the basis of an adjacent relation with other spaces.

Figure 10:
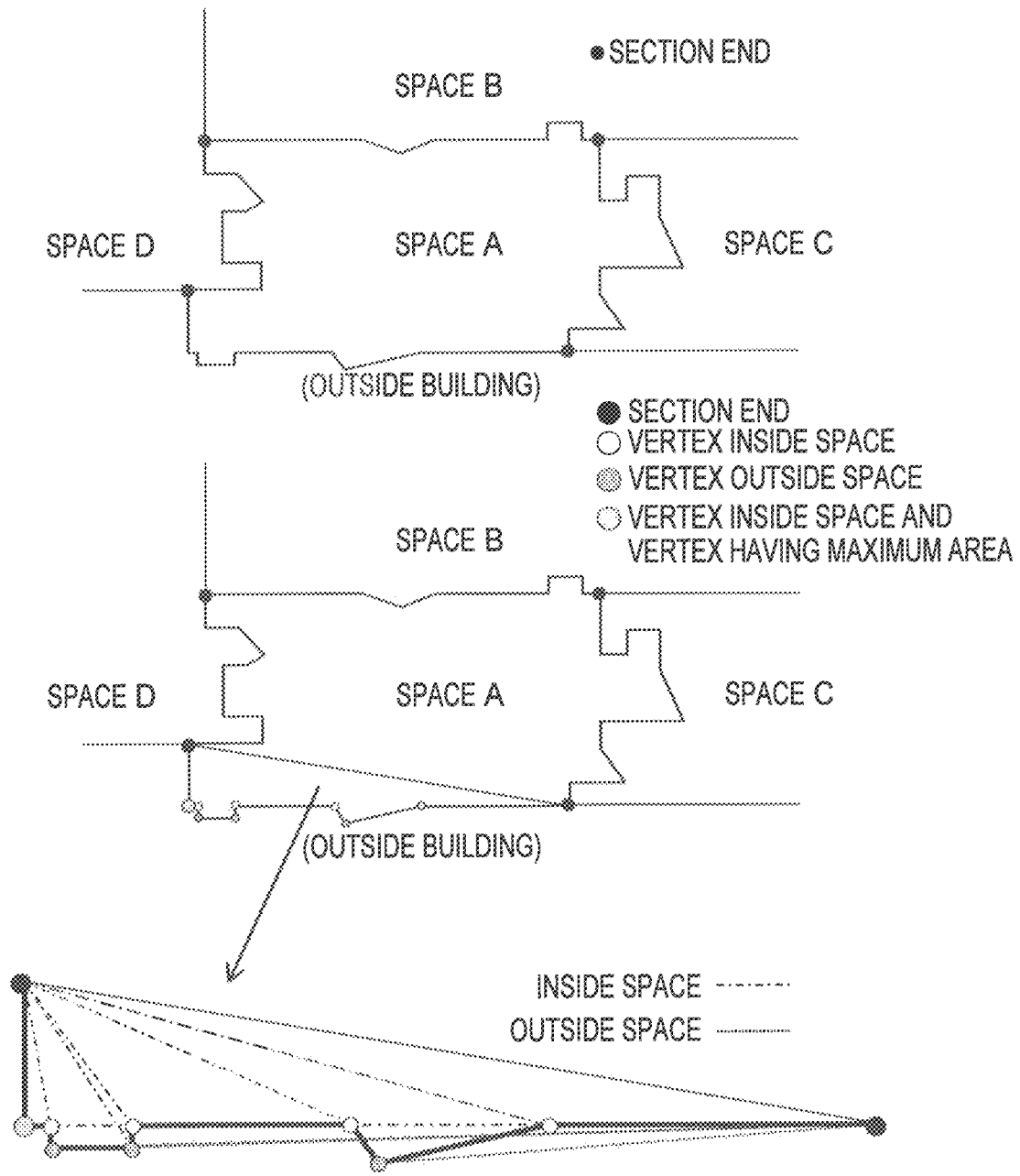
FIG. 10 is a diagram for explaining processing for simplification section setting.

FIG. 10 is a diagram for explaining processing of simplification section setting. It is assumed that a space A, which is a machining target, is adjacent to the outside of a building and spaces B, C, and D. The simplification-section setter 43 sets both ends of a section (a side) in which the target space A is adjacent to another space respectively as section ends. In FIG. 10, the section ends are indicated by black circles. Consequently, simplification sections of adjacent sides of spaces adjacent to each other coincide with each other in both the adjacent spaces. Even in the same side, if both ends of a simplification section are different, a machining result could be different. Consequently, results of machining processing performed on the respective spaces can have consistency in the adjacent sides.

The simplification-section setter 43 acquires a section without an adjacent space, that is, a side facing the outside of the building and acquires vertexes present on the side. The simplification-section setter 43 connects the acquired vertexes and two section ends adjacent to each other with connection lines and confirms whether two connection lines are present in a space. In FIG. 10, connection lines present in the space are indicated by alternate long and short dash lines and connection lines sticking out of the space are indicated by broken lines. Note that, when the connection lines are present on lines connecting the section ends, the connection lines are also regarded as being within the space. When both of two connection lines extended from a vertex are present in the space, the vertex is set as an intra-space vertex. In FIG. 10, intra-space vertexes are indicated by white circles and a circle hatched on the inside. When at least one of two connection lines extended from a vertex is not present in the space, the vertex is set as an extra-space vertex. In FIG. 10, extra-space vertexes are indicated by circles grayed on the inside.

The simplification-section setter 43 adds, among the intra-space vertexes, an intra-space vertex having a maximum area of a range surrounded by lines connecting the intra-space vertex and the adjacent two section ends to section ends. In FIG. 10, the circle hatched on the inside Indicates a vertex having a maximum area. The vertex added to the section ends is not deleted by the simplification processing.

After adding the section end as explained above, the simplification-section setter 43 optionally selects one of the section ends as a base point, traces the outer periphery clockwise, and sets a section between the section end and the section end as a simplification section. Note that the simplification-section setter 43 traces the outer periphery clockwise but may trace the outer periphery counterclockwise. Note that processing performed in the following explanation is based on the premise that the processing is performed clockwise. When the processing is set in counterclockwise, the direction of the processing is reversed.

The simplification-section setter 43 generates machining section information for each of simplification sections. The machining section information includes information concerning the simplification section and information concerning machining processing performed on the simplification section. The machining section information includes, for example, an ID of the simplification section, an ID and a position coordinate of a vertex present on the simplification section, a machining area threshold set for each of the simplification sections, the number of machining steps representing the order of performed machining processing (machining steps), an area of a part added or deleted in the machining steps, an integrated value of areas of parts added or deleted in machining steps performed to the present, and a restoration flag.

The restoration flag is a flag for determining whether the machining-result shaper 6 restores a part, a section, or the like deleted by the simplification processing. When a designated element set as a restoration target is deleted, a value of the restoration flag only has to be set to true. The designated element can be designated from the "shape restoration" displayed on the input screen of the machining-parameter setter 2. A restoration target designated element may be a part or all of the designated elements designated in the omission target explained above.

Figure 11:
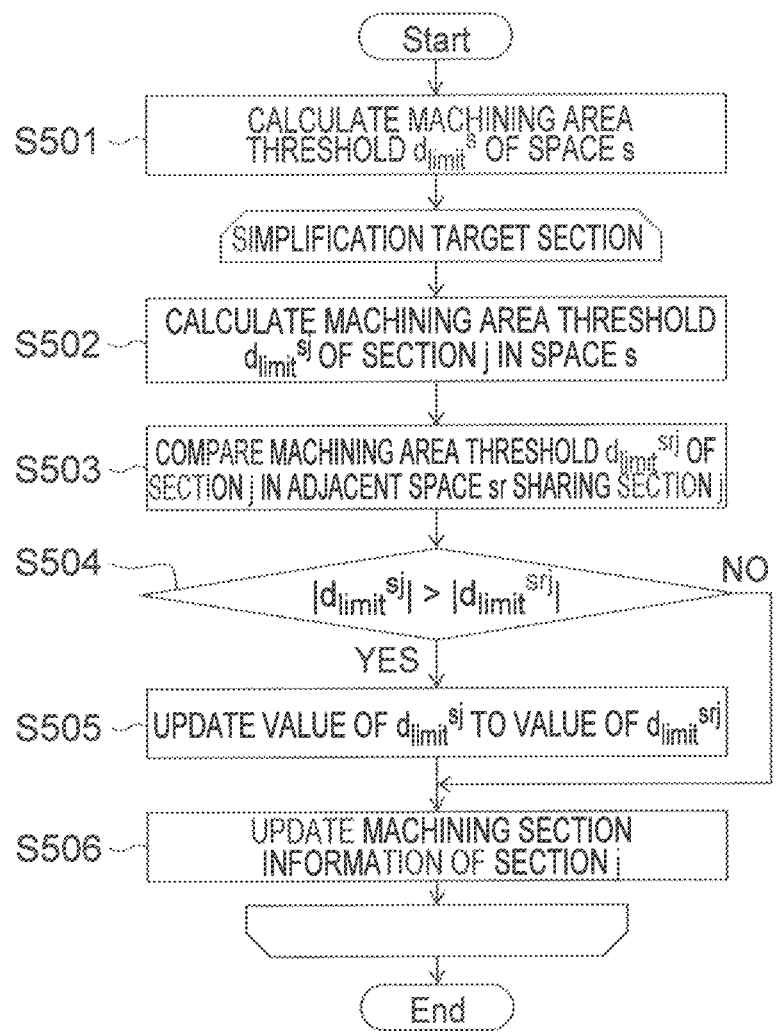
FIG. 11 is a flowchart for calculating a simplified area threshold.

The simplification-section setter 43 sets a simplified area threshold with respect to the respective calculated simplification sections. FIG. 11 is a flowchart for calculating the simplified area threshold. First, the simplification-section setter 43 calculates a simplified area threshold $d_{limit}^{s}$ of an entire space of the processing target (S501). The simplified area threshold $d_{limit}^{s}$ is calculated as a product of an area of a target space S and a machining ratio.

The machining ratio can be designated from the "machining ratio" displayed on the input screen of the machining-parameter setter 2. The machining ratio is a ratio of an area of an added or deleted portion to an original area of an uneven portion set as a simplification target. A value of the machining ratio may be optionally decided.

The simplification-section setter 43 calculates simplified area thresholds of sections with respect to the respective simplification sections (S502). When a simplified area threshold of a certain section j is represented as $d_{limit}^{sj}$, $d_{limit}^{sj}$ is calculated by multiplying $d_{limit}^{s}$ with a ratio of the length of the section j to an outer peripheral length of a machining target space.

Subsequently, the simplification-section setter 43 compares a simplified area threshold $d_{limit}^{srj}$ of the section j in an adjacent space sr, which shares the section j, and $d_{limit}^{sj}$ in absolute values (S503). When the absolute value of $d_{limit}^{sj}$ is larger (YES in S504), the simplification-section setter 43 replaces a value of $d_{limit}^{sj}$ with $d_{limit}^{srj}$. Otherwise (NO in S504), the simplification-section setter 43 keeps the value of $d_{limit}^{sj}$. Consequently, it is possible to prevent a situation in which simplified area thresholds of the section j are different in the spaces including the section j. Note that, when $d_{limit}^{srj}$ is not calculated yet, a value of $d_{limit}^{srj}$ may be set to an extremely large value and compared or the comparison may be omitted. The simplification-section setter 43 updates a machining area threshold of machining section information of the simplification section (S506) and shifts to processing of the next section. When the processing ends in all the simplification sections, this flow ends. Note that, the simplified area thresholds are compared in the absolute values. However, an allowable range of a negative value to a positive value with respect to an increase or decrease amount of an area may be decided.

Note that the machining section information includes, for each machining step, information concerning a simplification section at the time of the machining step. Therefore, by referring to the machining section information, it is possible to refer to not only a state of the simplification section after the last machining processing but also states in machining steps.

When a designated element that should be simplified is designated, the simplification-section setter 43 may set, as a simplification section, a part or all of a shape of a surface (a side) related to the designated element.

The shape simplifier 44 performs element simplification or linearization on a target reference plane. Either one of the element simplification and the linearization may be performed or both of the element simplification and the linearization may be performed. It may be decided in advance whether either one of these kinds of processing is performed or both of these kinds of processing is performed. Alternatively, a determination standard may be decided. The determination standard may be, for example, a type of a designated element or an area of a simplification target.

Figure 12:
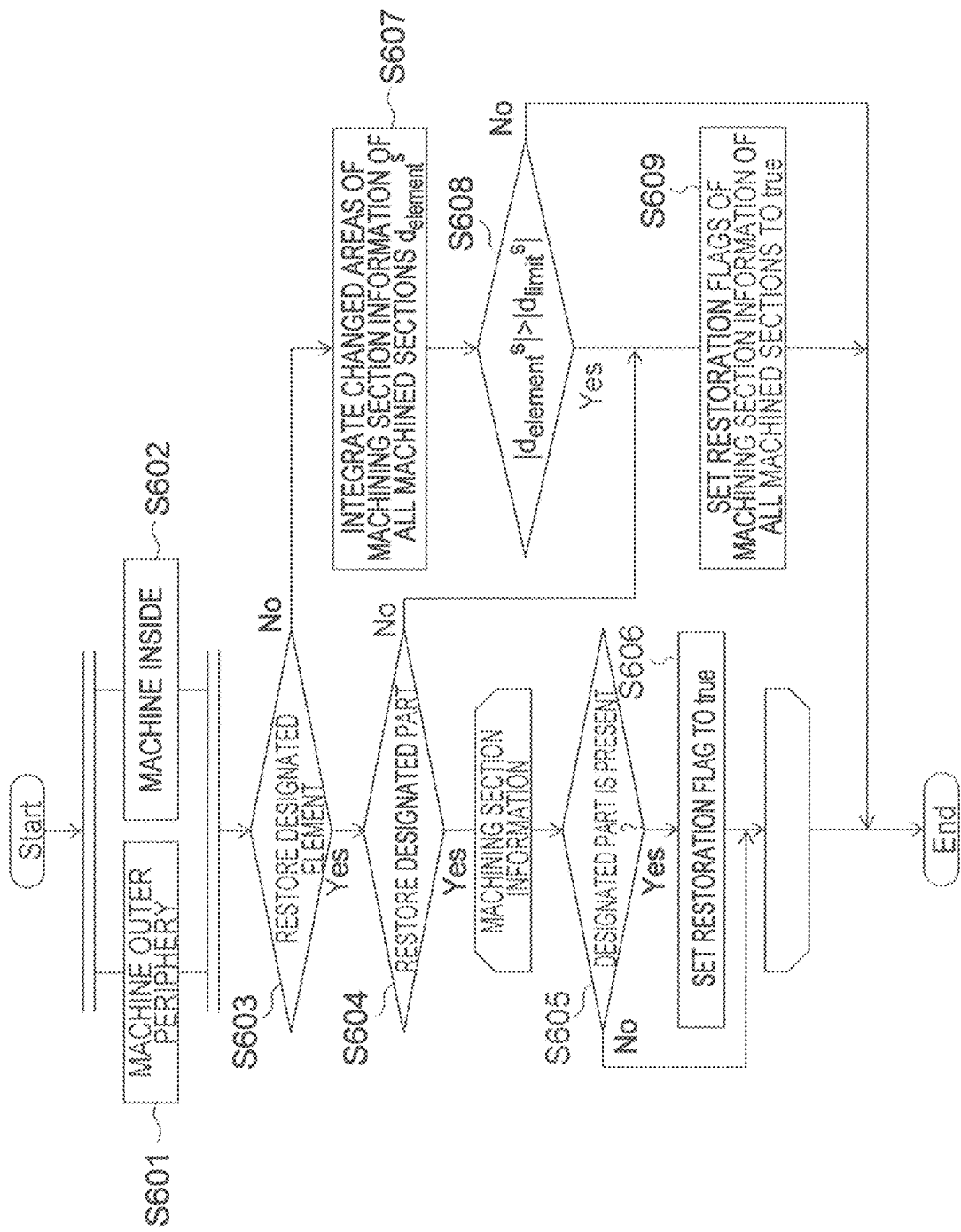
FIG. 12 is a flowchart of element simplification processing.

Details of the element simplification are explained. FIG. 12 is a flowchart of element simplification processing. The shape simplifier 44 performs machining of an outer periphery (S601) or machining of an inside (S602) or performs both of these kinds of machining. The machining of the outer periphery and the machining of the inside are explained below. After one or both of the kinds of processing are performed, processing is different according to whether a designated element deleted by these kinds of processing is restored later or not.

When the designated element is restored later (YES in S603), the shape simplifier 44 confirms whether or not the designated element is restored in units of designated parts. When the designated element is restored in units of designated parts (YES in S604), the shape simplifier 44 confirms whether a designated part to be restored for each kind of machining section information is included in the machining section information. When the designated part is included in the machining section information (YES in S605), the shape simplifier 44 sets a restoration flag of the part to true (S606). Consequently, it is possible to restore only a designated specific part. When the processing is finished for all kinds of machining section information, the shape simplifier 44 ends the processing.

When the designated element is not restored later (NO in S603), the shape simplifier 44 integrates changed areas of machining section information of all machined sections to calculate $d_{element}^s$ (S607). When the absolute value of calculated $d_{element}^s$ exceeds an upper limit value (YES in S608), since it is necessary to restore the designated element, the shape simplifier 44 sets restoration flags of the machining section information of all the machined sections to true (S609) and ends the processing. Consequently, all parts of the designated element are restored. When the absolute value of calculated $d_{element}^s$ does not exceed the upper limit value (YES in S608), since it is unnecessary to restore the designated element, the processing ends.

When the designated element is restored later but is not restored in units of designated parts (NO in S604), that is, when all the parts of the designated element are restored, the shape simplifier 44 sets the restoration flags of the machining section information of all the machined sections to true (S609) and ends the processing. Consequently, it is possible to restore all the parts of the designated elements. The flowchart of the element simplification processing is as explained above.

Details of the machining of the outer periphery are explained. As shown in FIGS. 5A to 5D, the machining of the outer periphery is simplifying a surface concerning a designated element present on the outer circumference. A method of the simplification only has to be decided in advance according to the shape of a surface that should be simplified. FIGS. 13A to 13D are diagrams for explaining simplification of a concave section in element simplification. Four patterns of cases 1 to 4 are shown. Note that the patterns are examples. The simplification is not limited to the patterns.

Figure 13:
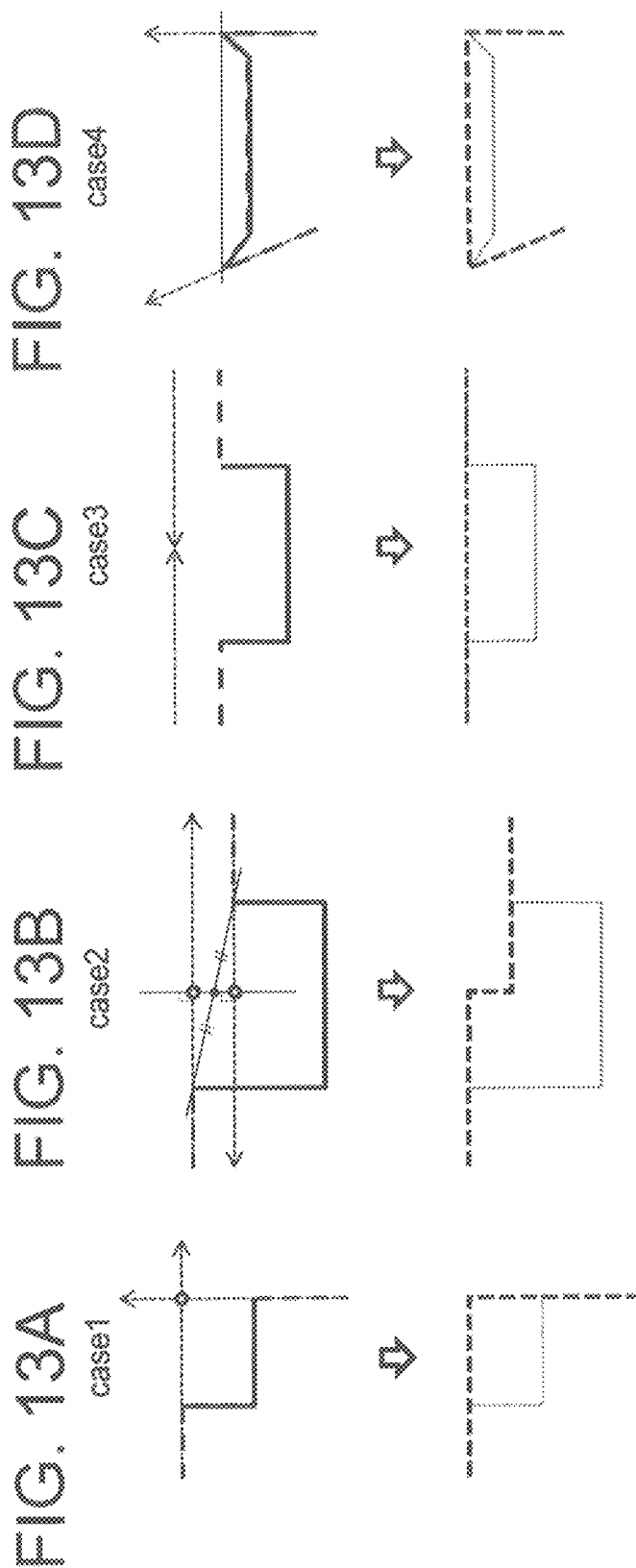
FIGS. 13A to 13D are diagrams for explaining simplification of a concave section in element simplification.

The case 1 shown in FIG. 13A is a pattern for extending two sides (dotted lines), which are connected to a side (a solid line) of a designated element that should be omitted, to an intersection of the two sides to thereby simplify the concave section. The case 2 shown in FIG. 13B is a pattern for, when the two sides are parallel, simplifying the concave section with perpendiculars of the two sides, which are at an equal distance from contact points of the side of the designated element that should be omitted and the two sides, and extended lines of the two sides. The case 3 shown in FIG. 13C is a pattern for, when one of the two sides is extended and the extended side overlaps the remaining one side, simplifying the concave section with the extended lines of the two sides. The case 4 shown in FIG. 13D is a pattern for, when the two sides are not parallel but the extended lines of the two sides do not cross, simplifying the concave section with lines connecting the side of the designated element that should be omitted and the contact points of the two sides.

Figure 14:
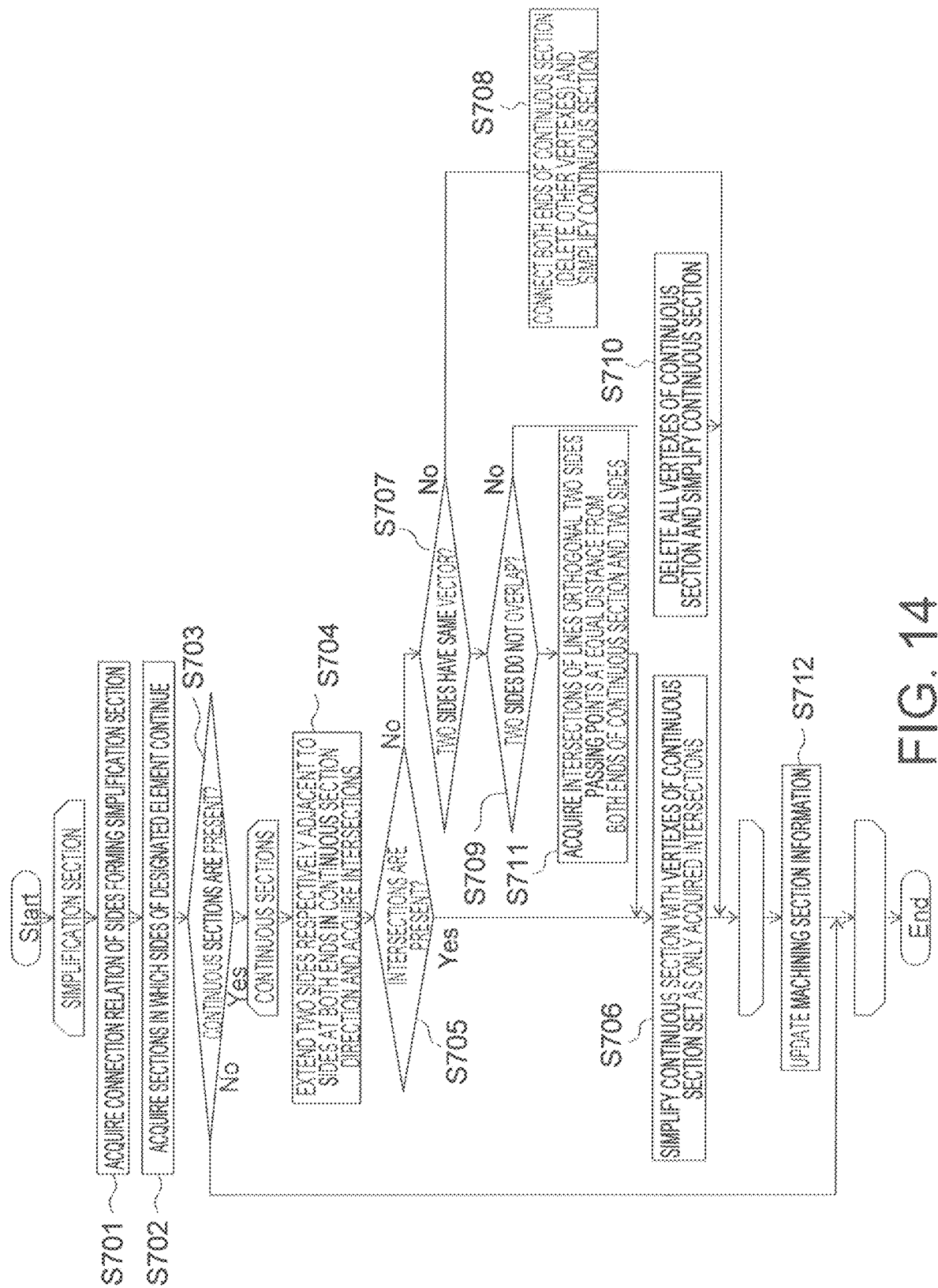
FIG. 14 is a flowchart of machining processing for an outer periphery.

FIG. 14 is a flowchart of the machining processing of the outer periphery. The shape simplifier 44 acquires a connection relation of sides on which the simplification section is formed (S701). The shape simplifier 44 acquires sections in which sides of the designated element continue (S702). When continuous sections cannot be acquired (NO in S703), the shape simplifier 44 shifts to the next simplification section. When the continuous sections can be acquired (YES in S703), the shape simplifier 44 performs the processing on the respective continuous sections.

First, the shape simplifier 44 extends the two sides adjacent to respective sides at both ends in a continuous section direction and acquires intersections of the two sides (S704). When the intersections can be acquired (YES in S705), the shape simplifier 44 simplifies the continuous section with vertexes of the continuous section set as only the acquired intersections (S706). The simplification corresponds to the case 1 shown in FIG. 11.

When the intersections cannot be acquired (NO in S705), the shape simplifier 44 confirms whether vectors of both the sides are the same. When the vectors are not the same (NO in S707), the shape simplifier 44 connects both the ends of the continuous section, deletes other vertexes, and simplifies the continuous section (S708). The simplification corresponds to the case 4 shown in FIG. 11.

When the vectors of both the sides are the same (YES in S707), the shape simplifier 44 confirms whether or not the two sides overlap. When the two sides overlap (NO in S709), the shape simplifier 44 deletes all the vertexes of the continuous section and simplifies the continuous section (S710). The simplification corresponds to the case 3 shown in FIG. 11. When the two sides do not overlap (YES in S709), the shape simplifier 44 acquires intersections of lines, which pass points at an equal distance from the continuous section both ends and are orthogonal to the two sides, and the two sides and simplifies the continuous section with vertexes of the continuous section set to only the acquired intersections (S711). The simplification corresponds to the case 2 shown in FIG. 11. Consequently, it is possible to simplify the continuous section according to any one of the four methods.

The shape simplifier 44 performs the processing of the simplification in all the continuous sections. After the processing for all the continuous sections is completed, the shape simplifier 44 updates the machining section information of the simplification section (S712) and shifts to processing for the next simplification section. Note that the update of the machining section information means adding information concerning a result of the machining in the machining step performed by the shape simplifier 44 rather than overwriting the machining section information. Therefore, the machining section information includes information before and after the machining step. If the processing is finished for all the simplification sections, this flow ends.

Note that a target of the continuous section to be simplified may be limited. For example, an end-to-end distance of the continuous section is set as a short-circuit distance and an upper limit value of the short-circuit distance is decided. A continuous section equal to or smaller than the upper limit value of the short-circuit distance may be set as a machining target. The upper limit value of the short-circuit distance may be optionally decided. Finally, the upper limit value only has to be decided on the basis of a simulation or the like in which a machining result generated by the spatial-information generation apparatus according to the embodiment of the present invention is used. The upper limit value of the short-circuit distance can be designated from the "short-circuit distance" displayed on the input screen of the machining-parameter setter 2.

Figure 15:
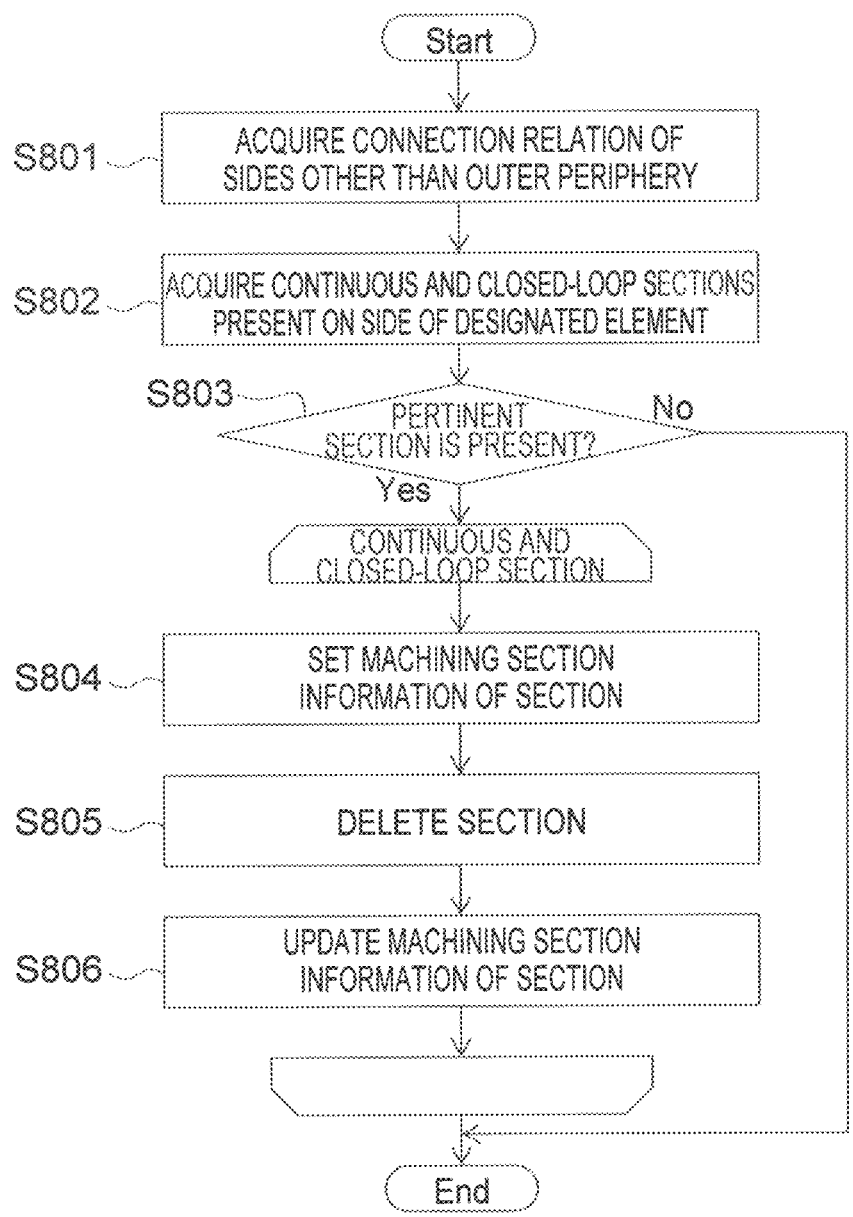
FIG. 15 is a flowchart of machining processing for an inside.

Details of the machining of the inside are explained. FIG. 15 is a flowchart of machining processing of the inside. The simplification-section setter 43 acquires a connection relation of sides other than the outer periphery (S801) and searches for continuous and closed-loop sections present on a side of a designated element (S802) on the basis of the acquired connection relation. When a relevant section is absent (NO in S803), the processing ends. When a relevant section is present (YES in S803), the simplification-section setter 43 sets the section as a simplification section and sets machining section information (S804). The shape simplifier 44 deletes the section (S805). The shape simplifier 44 updates machining section information of the deleted simplification section (S806). When other continuous and closed-loop sections are present, the processing is applied to the other sections. When the processing for all the continuous and closed-loop sections is completed, this flow ends. Note that the processing by the simplification-section setter 43 and the processing by the shape simplifier 44 may be divided.

Figure 16:
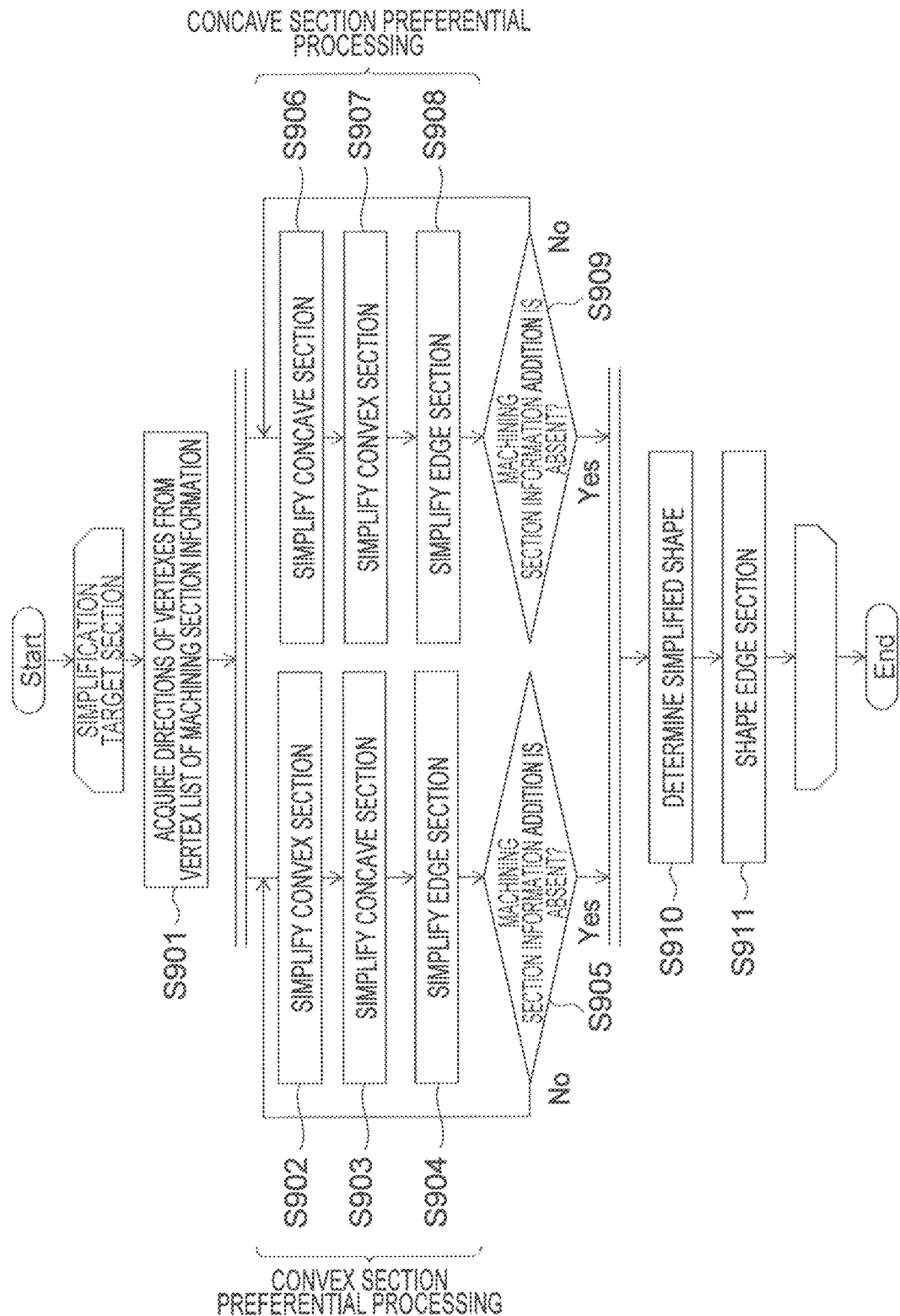
FIG. 16 is a flowchart of linearization processing.

Details of the linearization are explained. FIG. 16 is a flowchart of the linearization processing. The flow is performed on respective simplification sections.

The shape simplifier 44 acquires the directions of vertexes from a list of vertex IDs of machining section information (S901). The direction of a vertex means, when the simplification-section setter 43 traces the outer periphery clockwise from a section end set as a base point and sets simplification sections, a turning direction at the vertex is clockwise or counterclockwise. Details are explained below.

Subsequently, the shape simplifier 44 performs convex section preferential processing and concave section preferential processing. The convex section preferential processing is to perform processing in the order of simplification of a convex section (S902), simplification of a concave section (S903), and simplification of an edge section (S904). The concave section preferential processing is to perform processing in the order of simplification of a concave section (S906), simplification of a convex section (S907), and simplification of an edge section (S908). The convex section, the concave section, and the edge section are explained below. Simplification methods of the respective kinds of processing are the same. However, processing results are different depending on which of the simplification of the convex section and the simplification of the concave section is performed first. Therefore, the shape simplifier 44 performs both of the convex section preferential processing and the concave section preferential processing. The convex section preferential processing and the processing of simplification of the concave section may be performed in parallel or may be performed separately. Whichever of the convex section preferential processing and the processing of simplification of the concave section may be performed first.

After the convex section preferential processing and the concave section preferential processing, the shape simplifier 44 confirms whether information to be added to the machining section information is present (S905 and S909). When information to be added to the machining section information is present (NO in S905 and NO in S909), it is likely that a portion that should be further linearized remains. Therefore, the shape simplifier 44 returns to the convex section preferential processing and the concave section preferential processing (S902 and S906).

When both of the convex section preferential processing and the concave section preferential processing are completed, the shape simplifier 44 determines a simplified shape (S910). The determination of a simplified shape is to compare machining results by the convex section preferential processing and the concave section preferential processing and determine a more suitable one of the machining results as a simplified shape. The machining-degree evaluator 45 performs the determination of a simplified shape. Details are explained in explanation of the machining-degree evaluator 45.

After the simplified shape is determined, the shape simplifier 44 performs shaping of an edge section (S911). The shaping of the edge section is to change a side of an edge section not parallel to an X axis or a Y axis of direction axes to a line parallel to the X axis or the Y axis. When shaping processing of the edge section is completed, the shape simplifier 44 shifts to processing of the next simplification section. When the shape simplifier 44 repeats this and finishes the processing for all the simplification sections, the linearization processing ends.

Simplification of a convex section and a concave section is explained. FIGS. 17A to 17E are diagrams for explaining the simplification of the convex section in linearization. As shown in FIGS. 17 A to 17E, a simplification section adjacent to the space A and the space C and having a vertex (9) and a vertex (20) as section ends is simplified.

The convex section is defined as, when a start end to a terminal end of the simplification section is traced, in vertexes present on the simplification section, a portion where two or more vertexes turning to a clockwise (CW) direction continue, the portion being sandwiched by vertexes turning to a counterclockwise (CCW) direction. As shown in FIG. 17B, vertexes (10) to (19) are present on the simplification section excluding section ends. In the respective vertexes, arrows of directions turning the vertexes in tracing a start end (9) to a terminal end (20) of the simplification section are shown. The direction of the arrow of the vertex (11) is CCW. The directions of the arrows of the vertexes (12) and (13) are CW. The direction of the arrow of the vertex (14) is CCW. Therefore, the vertexes (12) and (13) turning to the direction CW continue and the vertexes (12) and (13) are sandwiched by the vertexes (11) and (14) turning to the direction of CW. Therefore, according to the definition of the convex section, a portion from the vertex (11) to the vertex (14) (a hatched portion in FIG. 17C) is a convex section. In this way, the shape simplifier 44 recognizes the convex section on the simplification section and performs the simplification processing.

The simplification is to generate a line connecting a start end and a terminal end of a convex section and deleting vertexes present between the start end and the terminal end. The start end of the convex section is a vertex closest to a start end of the simplification section. The start end of the convex section is a vertex closest to a terminal end of the simplification section. In the example explained above, the vertexes (11) and (14) are connected and the vertexes (12) and (13) are deleted. Consequently, a shape shown in FIG. 17D is obtained. After the simplification, the shape simplifier 44 confirms again whether a convex section is present. Then, it is possible to recognize that a portion from the vertex (10) to the vertex (16) is a new convex section. As in the above explanation, the start end (10) to the terminal end (16) of the concave section are connected by a line and the vertexes (11), (14), and (15) are deleted. Consequently, a shape shown in FIG. 17E is obtained. The shape is not a convex section because the shape does not meet the definition of the convex section, although the vertex 18 projects. Since a convex section is absent, the processing of simplification of the convex section ends. Note that a projecting portion like the vertex 18 or, conversely, a buried portion, which is a shape cutting into a space inside, is referred to as edge section.

After the machining, the shape simplifier 44 updates the machining section information of the simplification section. When the convex section is simplified, the shape simplifier 44 calculates an area of the simplified convex section and a total area $d_{convex}^{sj}$ of the convex section simplified by the simplification processing performed to that point.

FIGS. 18A to 18E are diagrams for explaining simplification of a concave section in linearization. FIG. 18A is the same as FIG. 17B. The concave section is defined as, when a start end to a terminal end of the simplification section is traced, in vertexes present on the simplification section, a portion where two or more vertexes turning to the CCW direction continue, the portion being sandwiched by vertexes turning to the CW direction. Therefore, gray portions shown in FIGS. 18B, C, and D are concave sections. The simplification of the concave section is the same as the simplification of the convex section except that a target is the concave section. The shape simplifier 44 recognizes a concave section on the simplification section and repeats the simplification processing to obtain a simplification result shown in FIG. 18E. As it is seen from FIG. 17E and FIG. 18E, the simplification result of the convex section and the simplification result of the concave section are different. Therefore, as explained above, a processing result is different depending on which of the simplification of the convex section and the simplification of the concave section is performed first.

Simplification of an edge section is explained. Even if the simplification of the convex section or the concave section is performed as shown in FIG. 17E, an edge portion, which is a projecting or buried portion sometimes remains. In order to cope with such a case, the shape simplifier 44 simplifies the edge section according to a method decided in advance.

Note that it is assumed that the edge portions are two edges of a concave edge and a convex edge. The concave edge is defined as, when a start end to a terminal end of the simplification section is traced, in vertexes present on the simplification section, a portion where vertexes turning to the CCW direction is sandwiched by vertexes turning to the CW direction. The convex edge is defined as, in vertexes present on the simplification section, a portion where vertexes turning to the CW direction is sandwiched by vertexes turning to the CCW direction.

A method of the simplification only has to be decided in advance according to the shape of a portion that should be simplified. FIGS. 19A to 19E are diagrams for explaining simplification of a concave edge. Four patterns of cases 1 to 4 are shown. Note that the patterns are examples. The simplification is not limited to the patterns. Note that, in FIGS. 19A to 19E, the concave edge is shown. However, the patterns are the same in a convex edge.

The case 1 shown in FIG. 19A is a pattern for, when an intersection at the time when two sides adjacent to an edge section are extended is absent on lines of the two sides, extending the two sides to the intersection to thereby simplify the edge section. The case 2 shown in FIG. 19B is a pattern for, when an intersection at the time when two sides adjacent to an edge section are extended is present on a line of either one of the two sides, extending one of the two sides to the intersection to thereby simplify the edge section. The case 3 shown in FIG. 19C is a pattern for, if an intersection is absent even if two sides adjacent to an edge section are extended, when an extended line of one of the two sides is in contact with a side of the edge section, simplifying the edge section with the extended line. The case 4 shown in FIG. 19D is a pattern for, when one of two sides adjacent to an edge section is extended, if the one side overlaps the other side, simplifying the edge section with an extended line of the one side.

In the simplification of the edge section, consistency with other spaces is also taken into account. For example, a simplified shape could be inappropriate because of a relation with the other spaces. A case 0 in FIG. 19E is an example of the case in which a simplified shape is inappropriate. The case 0 is a pattern obtained by simplifying an edge section of an adjacent side of a space X and a space Y is simplified by the case 4. However, when the edge section is simplified in this way, an adjacent side of the space Y and a space Z is divided and consistency cannot be secured. In this way, the simplified edge section is sometimes restored taking into account consistency with the adjacent side.

Figure 20A:
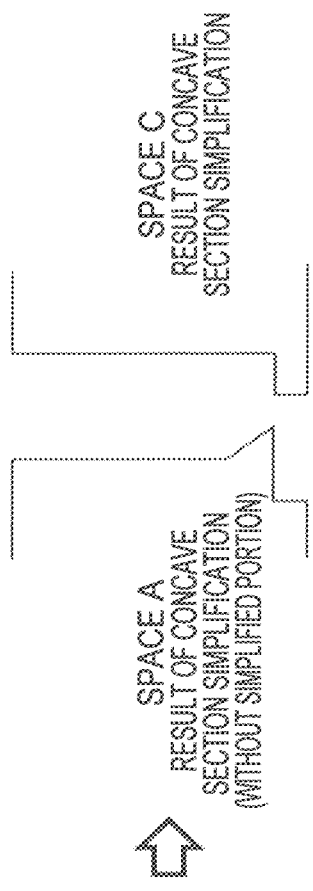
FIGS. 20A to 20D are diagrams for explaining both-edge simplification.
Figure 20C:
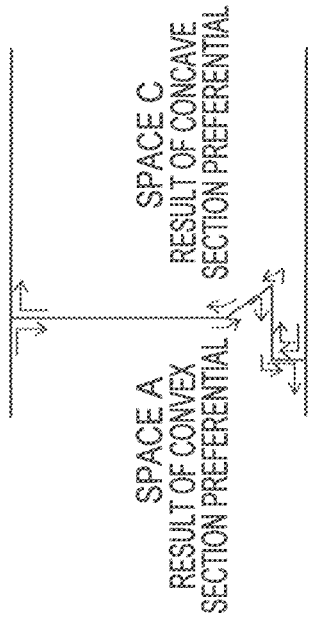
Figure 20B:
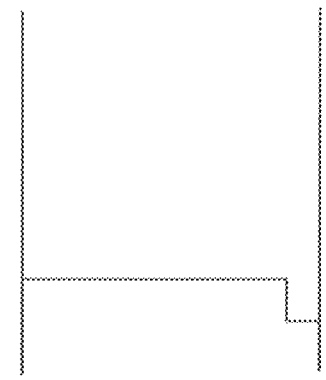
Figure 20D:
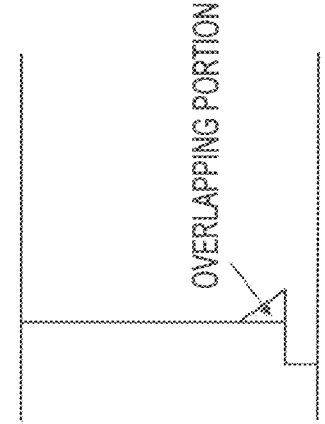

When there are adjacent spaces, a simplification processing result of one space and a simplification processing result of the other space do not always coincide with each other. Therefore, both-edge simplification is performed. FIGS. 20A to 20D are diagrams for explaining the both-edge simplification. FIG. 20A shows a result obtained by performing simplification on the space A in the convex section preferential processing and a result obtained by performing simplification on the space C in the concave section preferential processing. An edge portion is present on an adjacent side of the space A and the space C. FIG. 20B shows a result obtained by performing concave edge simplification processing on the space A and the space C. For the concave edge simplification processing, a projecting portion on the space A side is not deleted. On the other hand, a buried portion on the space C side is deleted. When the space A and the space C are joined, an overlapping portion is formed as shown in FIG. 20C. In both both-edge simplification processing, the overlapping portion is deleted. FIG. 20D shows a state after the both-edge simplification processing. Consequently, a shape in which consistency of the spaces is secured is obtained while being simplified.

Figure 21:
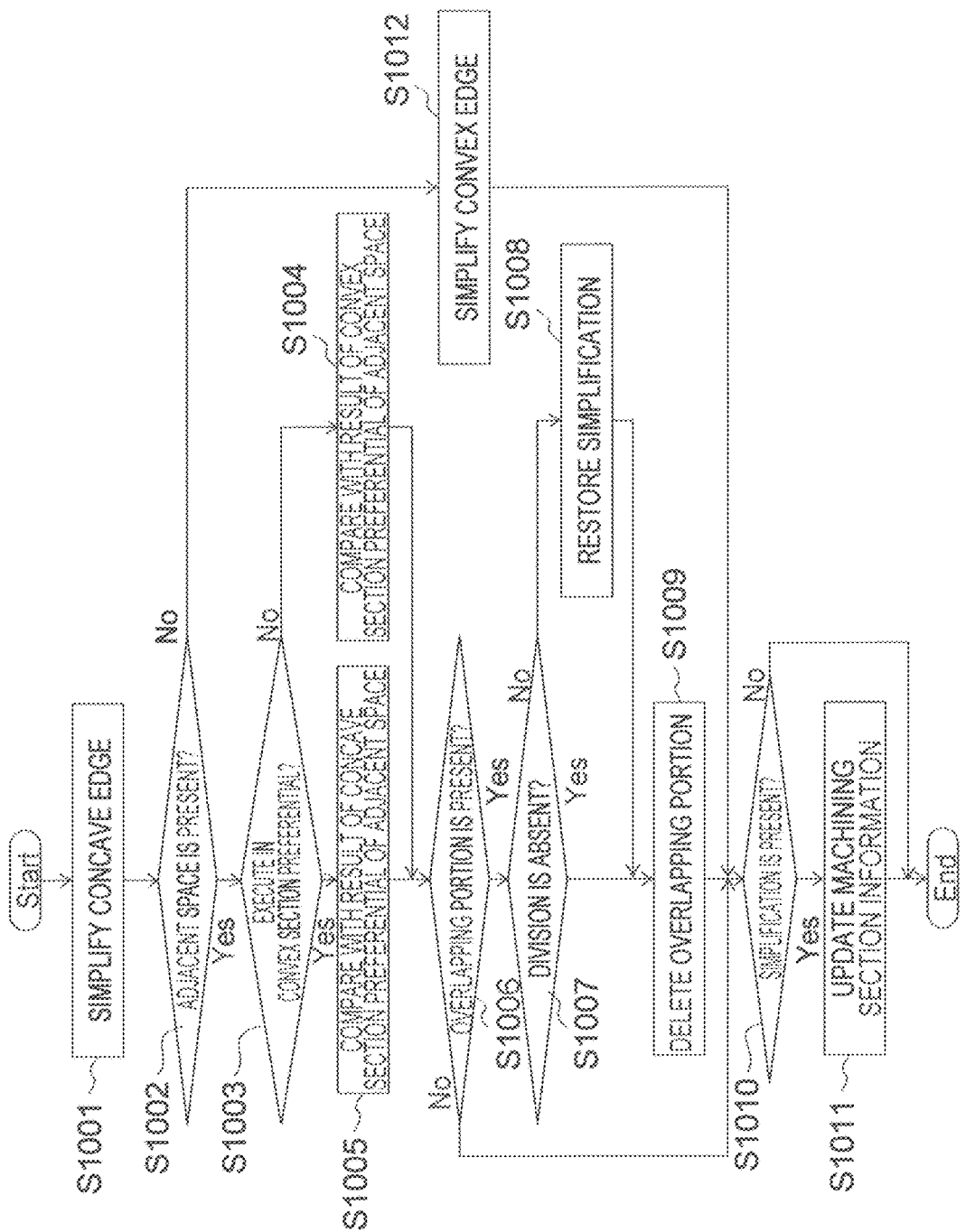
FIG. 21 is a flowchart of simplification of an edge section.

FIG. 21 is a flowchart of the simplification of an edge section. First, the shape simplifier 44 performs simplification of a concave edge (S1001). The shape simplifier 44 confirms presence or absence of an adjacent space. When an adjacent space is present (YES in S1002), the shape simplifier 44 performs both-edge simplification with the adjacent space is performed. In the both-edge simplification, processing is different depending on which of simplification of a convex section and simplification of a concave section performed before the simplification of the edge section is performed first. When the concave section is simplified first (NO in S1003), the shape simplifier 44 compares the adjacent space with a result obtained by simplifying the convex section first (S1004). Conversely, when the convex section is simplified first (YES in S1003), the shape simplifier 44 compares the adjacent space with a result obtained by simplifying the concave section first (S1005).

As a result of the comparison with the adjacent space (S1004 and S1005), when an overlapping portion is absent (NO in S1006), only when a portion simplified by the processing of this time is present (YES in S1010), the shape simplifier 44 updates the machining section information (S1011).

As a result of the comparison with the adjacent space (S1004 and S1005), when an overlapping portion is present (YES in S1006), the shape simplifier 44 confirms whether a simplification result that divides the adjacent space is present. When a simplification result that divides the adjacent space is present (NO in S1007), the shape simplifier 44 restores the simplification of the edge. When a portion that divides the adjacent space is absent (YES in S1007) or after restoring the simplification (S1008), the shape simplifier 44 deletes the overlapping portion of the adjacent spaces (S1009). When there is a portion simplified by the processing of this time (YES in S1010), the shape simplifier 44 updates the machining section information (S1011).

When an adjacent space is absent (NO in S1002), the shape simplifier 44 performs simplification of a convex edge (S1012). When an adjacent space is present, since the convex edge is removed by adjustment with the adjacent space, it is unnecessary to perform simplification of the convex edge. However, when an adjacent space is absent, it is necessary to perform simplification of the convex edge. After simplification processing of the convex edge (S1012), when a simplified concave edge or convex edge is present (YES in S1010), the shape simplifier 44 updates the machining section information of the simplification section (S1011). A flow of the simplification of the edge section is as explained above.

Simplification of a concave edge and simplification of a convex edge are explained. An only difference between the simplification of a concave edge and the simplification of a convex edge is whether a target of the simplification is a convex section or a concave section. Therefore, the simplification of a concave edge is explained. Explanation of the convex section simplification is omitted.

Figure 22:
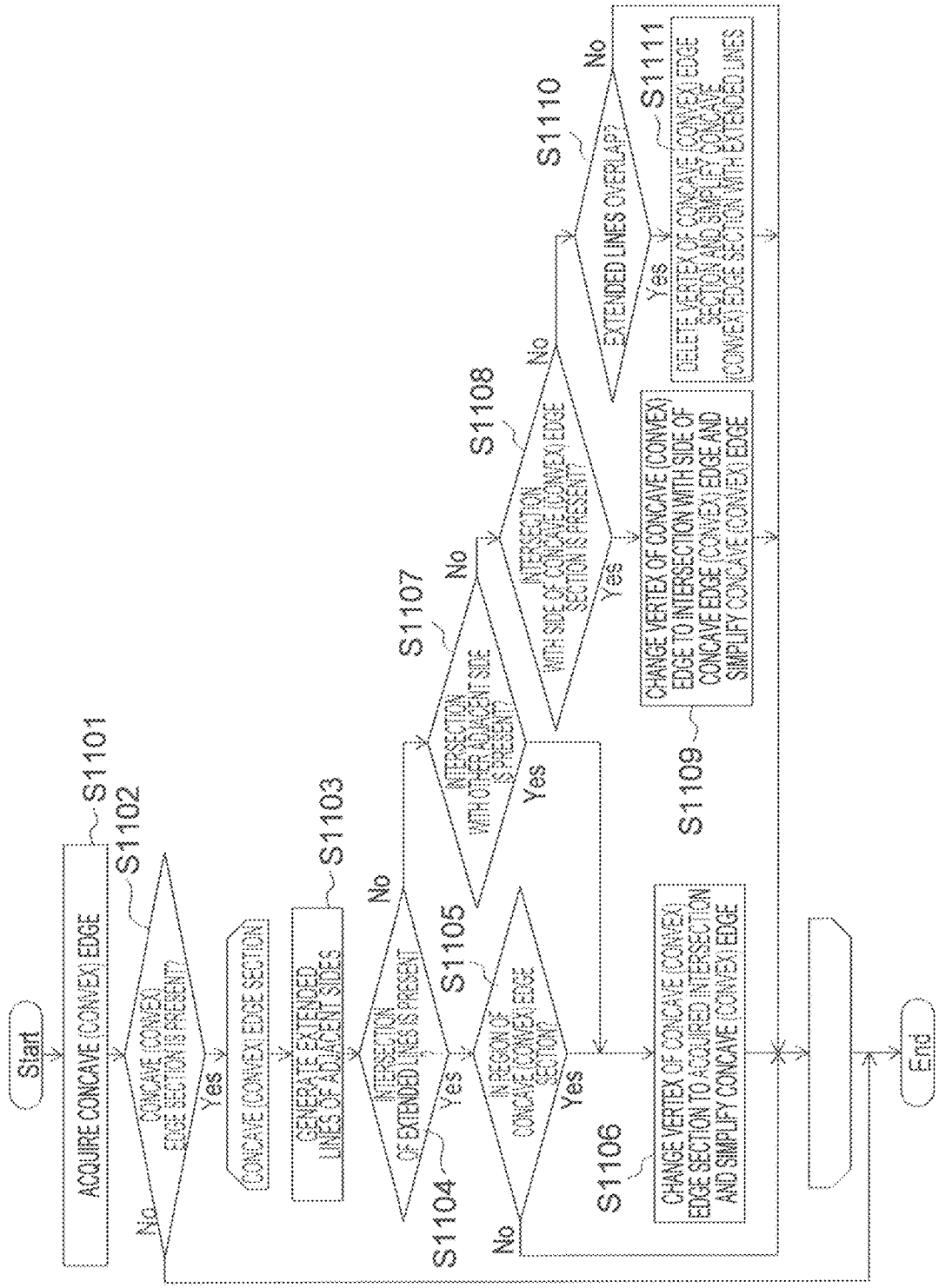
FIG. 22 is a flowchart of the simplification of the concave edge.

FIG. 22 is a flowchart of the simplification of a concave edge. First, the shape simplifier 44 acquires a concave edge (S1101). When a concave edge cannot be acquired (NO in S1102), processing ends. When concave edges can be acquired (YES in S1102), the shape simplifier 44 performs the processing on the respective acquired concave edges.

First, the shape simplifier 44 extends two sides adjacent to respective sides at both ends of the concave edge in a continuous section direction and generates extended lines (S1103). When an intersection of the two extended lines is present (YES in S1104), the shape simplifier 44 checks whether the intersection is in a concave edge region. When the intersection is not in the concave edge region (NO in S1105), the shape simplifier 44 shifts to processing of the next concave edge. When the intersection is in the concave edge region (YES in S1105), the shape simplifier 44 changes a vertex of the concave edge to the acquired intersection and simplifies the concave edge (S1106). The shape simplifier 44 shifts to processing of the next concave edge. The simplification corresponds to the case 1 shown in FIGS. 19A to 19E.

When an intersection of the two extended lines is absent (NO in S1104), the shape simplifier 44 confirms whether an intersection with the other adjacent side is present. When an intersection with the other adjacent side is present (YES in S1107), the shape simplifier 44 changes the vertex of the concave edge to the acquired intersection and simplifies the concave edge (S1106). The shape simplifier 44 shifts to processing of the next concave edge. The simplification corresponds to the case 2 shown in FIGS. 19A to 19E. When an intersection with the other adjacent side is absent (NO in S1107), the shape simplifier 44 confirms that an intersection with a side of the concave edge is present.

When an intersection with the side of the concave edge is present (YES in S1108), the shape simplifier 44 changes the vertex of the concave edge to the intersection with the side of the concave edge, simplifies the concave edge (S1111), and shifts to processing of the next concave edge. The simplification corresponds to the case 3 shown in FIGS. 19A to 19E. When an intersection with the side of the concave edge is absent, the shape simplifier 44 confirms whether the extended lines generated earlier overlap each other (S1110). When the extended lines overlap (YES in S1110), the shape simplifier 44 deletes the vertex of the concave edge, simplifies the concave edge with the extended lines (S1111), and shifts to processing of the next concave edge. The simplification corresponds to the case 4 shown in FIGS. 19A to 19E. When the extended lines do not overlap (NO in S1110), the shape simplifier 44 shifts to processing of the next concave edge without simplifying the edge.

When the processing for all the acquired concave edges is completed, this flow ends.

Figure 23:
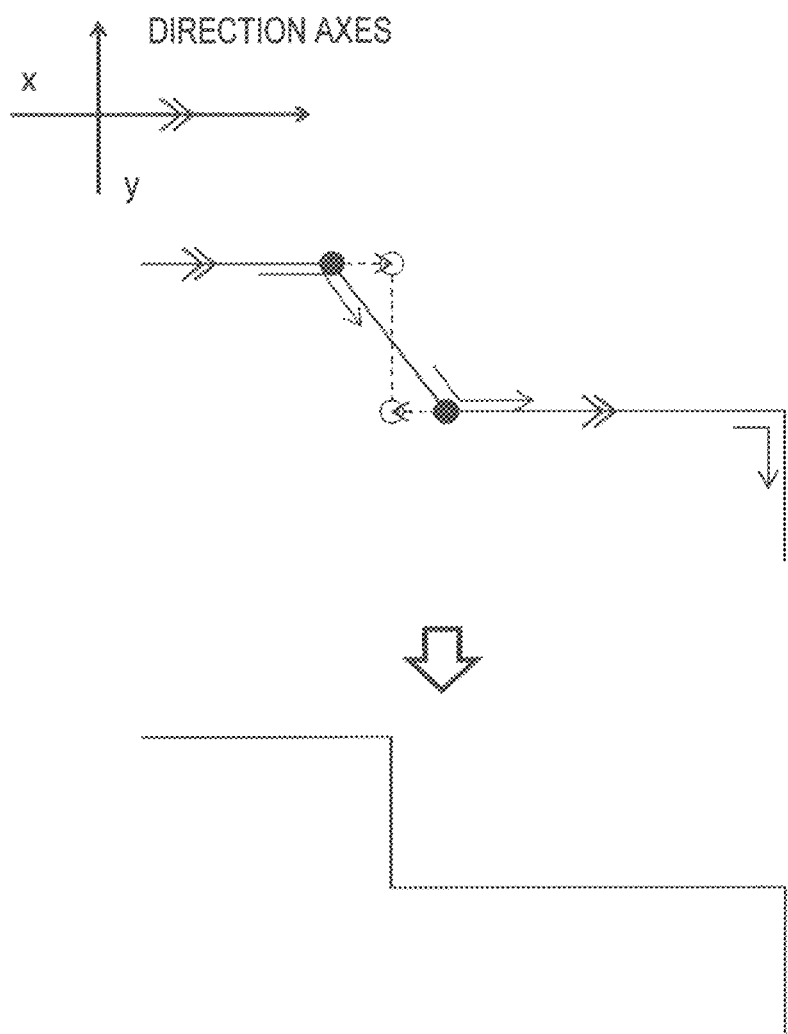
FIG. 23 is a diagram for explaining shaping of the edge section.

Shaping of an edge section is explained. The shape simplifier 44 changes a side of an edge section not parallel to the X axis or the Y axis of the direction axes to a line parallel to the X axis or the Y axis. FIG. 23 is a diagram for explaining the shaping of an edge section. The upper portion of FIG. 23 is an edge section before shaping. Black circles are two of three vertexes of the edge section. A side between the two vertexes is not parallel to both of the X axis and the Y axis of the direction axes. Therefore, the shape simplifier 44 performs shaping processing on the side. However, the shape simplifier 44 performs the shaping processing only when two sides connected to a side of a target edge section are parallel to the direction axes. Note that, in the case of this method, since a simplified area does not fluctuate, the method can also be performed after a simplified shape is determined.

When both of the two sides connected to the side of the target edge section are parallel to the X axis or the Y axis of the direction axes, the shape simplifier 44 generate a perpendicular to extended lines of the two sides passing a midpoint of the side of the target edge section. The shape simplifier 44 acquires intersections (white circles shown in FIG. 23) where the perpendicular crosses the extended lines of the two sides. The shape simplifier 44 replaces the side of the target edge section with the acquired line connecting the two intersections and the extended lines of the two sides extended to the intersections. The lower portion of FIG. 23 is the edge section after the shaping. Consequently, it is possible to reduce shapes of reference planes not parallel to the X axis or the Y axis of the direction axes.

The machining-degree evaluator 45 determines whether a result of simplification machining is within a limitation range of shape machining. Specifically, in the linearization by the shape simplifier 44, the shape simplifier 44 compares the calculated machining result by the convex section preferential processing and the machining result by the concave section preferential processing and determines a simplified shape. However, it is likely that the machining result by the convex section preferential processing and the machining result by the concave section preferential processing exceed the simplified area threshold calculated by the simplification-section setter 43. Therefore, the machining-degree evaluator 45 confirms whether the machining results exceed the simplified area threshold. When the machining results exceed the simplified area threshold, the machining-degree evaluator 45 traces back the machining steps one by one and confirms whether a result of the machining processing in the traced-back step exceeds the simplified area threshold. Consequently, it is possible to recognize a nearest machining step in which a result of the machining processing is smaller than the simplified area threshold and a machining result in the machining step. The machining-degree evaluator 45 compares the machining result by the convex section preferential processing that is smaller than the simplified area threshold and the machining result by the concave section preferential processing that is smaller than the simplified area threshold and determines a simplified shape.

The machining-degree evaluator 45 calculates an evaluation value for a machining result and determines a simplified shape on the basis of the evaluation value. An evaluation value may be optionally decided according to a purpose of use. For example, a method of calculating an evaluation value on the basis of a basic axis is conceivable. The machining-degree evaluator 45 may calculate a difference (a deviation) between a direction (a vector) of a basis axis of a plane and a direction (a vector) of a simplification section and, for example, set an evaluation value to an inverse of the difference to set the evaluation value higher as the difference is smaller. When there are a plurality of basic axes, the machining-degree evaluator 45 may calculate differences between the basic axes and the simplification section and set the evaluation value higher as a sum of the absolute values of the differences is smaller. The machining-degree evaluator 45 may set the evaluation value higher as an area added or subtracted by simplification is smaller. The machining-degree evaluator 45 may set the evaluation value higher as the number of vertexes present in the simplification section is smaller. A method of calculating an evaluation value may be one method or a plurality of methods may be combined. When the plurality of methods are combined, weighting may be performed for each of the methods. Weight may be optionally decided.

Note that the evaluation value calculated by the machining-degree evaluator 45 may be used as a similarity degree used for extraction conditions of the machining-parameter setter 3. When the difference from the direction of the basic axis is set as the evaluation value as explained in the example above, if the evaluation value is used as the similarity degree, it is possible to extract an object having a fixed difference from the direction of the basic axis.

Figure 24:
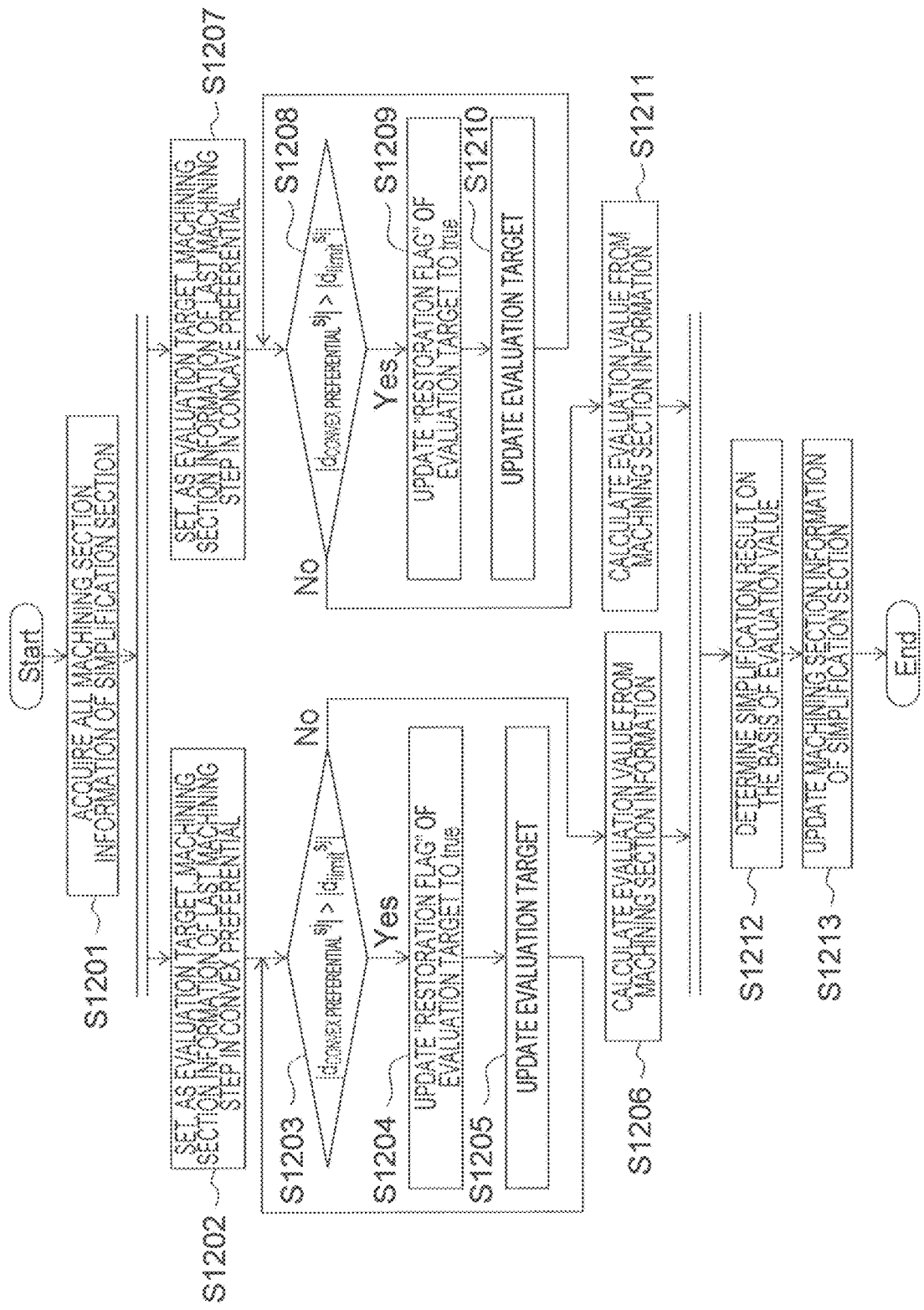
FIG. 24 is a flowchart of determination of a simplified shape.

FIG. 24 is a flowchart of determination of a simplified shape. The machining-degree evaluator 45 acquires all kinds of machining section information of a simplification section (S1201). The machining-degree evaluator 45 sets, as an evaluation target, machining section information of a last machining step in the convex preferential processing (S1202). The machining section information of the last machining step of the convex section preferential processing includes a simplified area $d_{convex\ preferential}^{sj}$ in the last machining step and a simplified area threshold $d_{limit}^{sj}$ of simplification sections calculated by the simplification-section setter 43. The machining-degree evaluator 45 compares the absolute value of $d_{convex\ preferential}^{sj}$ and the absolute value of $d_{limit}^{sj}$ (S1203). In the case of $|d_{convex\ preferential}^{sj}| > |d_{limit}^{sj}|$ (YES in S1203), the machining-degree evaluator 45 updates a restoration flag of the machining step to true (S1204). Consequently, it is possible to restore a part simplified in the machining step. The machining-degree evaluator 45 updates the evaluation target to the immediately preceding machining step (S1205). In the immediately preceding machining step, the machining-degree evaluator 45 confirms whether a simplified area exceeds a simplified area threshold (S1203). By repeating this processing, it is possible to grasp a machining step in which a simplified area does not exceed the simplified area threshold. When the simplified area does not exceed the simplified area threshold, the machining-degree evaluator 45 calculates an evaluation value on the basis of a machining result in the machining step (S1206).

The machining-degree evaluator 45 sets, as an evaluation target, machining section information of the last machining step in the concave section preferential processing (S1207). The machining section information of the last machining step of the concave section preferential processing includes a simplified area $d_{concave\ preferential}^{sj}$ in the last machining step and the simplified area threshold $d_{limit}^{sj}$ of the simplification sections calculated by the simplification-section setter 43. The machining-degree evaluator 45 compares the absolute value of $d_{concave\ preferential}^{sj}$ and the absolute value of $d_{limit}^{sj}$ (S1208). In the case of $|d_{convex\ preferential}^{sj}| > |d_{limit}^{sj}|$ (YES in S1208), the machining-degree evaluator 45 updates a restoration flag of the machining step to true (S1209). The machining-degree evaluator 45 updates the evaluation target to the immediately preceding machining step (S1210). In the immediately preceding machining step, the machining-degree evaluator 45 confirms whether a simplified area exceeds a simplified area threshold (S1208). By repeating this processing, it is possible to grasp a machining step in which a simplified area does not exceed the simplified area threshold. When the simplified area does not exceed the simplified area threshold, the machining-degree evaluator 45 calculates an evaluation value on the basis of a machining result in the machining step (S1207).

The processing in S1202 to S1206 and the processing in S1207 to S1211 may be performed in parallel. Whichever of the processing in S1202 to S1206 and the processing in S1207 to S1211 may be performed first.

After calculating both of the evaluation value of the machining result by the convex section preferential processing smaller than the simplified area threshold and the evaluation value of the machining result by the concave section preferential processing smaller than the simplified area threshold, the machining-degree evaluator 45 compares both of the evaluation values and determines either one of the machining results as a simplified shape (S1212). The machining-degree evaluator 45 updates the machining section information of the simplified sections (S1213). A flow of the determination of a simplified shape ends.

The machining-section-information manager 46 manages machining section information. The machining-section-information manager 46 stores calculated machining section information in the machining result DB. The machining-section-information manager 46 acquires machining section information from the machining result DB.

The spatial-structure machiner 5 performs division or aggregation of a machining target space (a reference plane) on the basis of a designated machining method. By performing the division or the aggregation, it is possible to generate a machining result suitable for a simulation or the like in which the machining result is utilized.

The division means dividing a reference plane into a plurality of divided pieces. The aggregation means combining a plurality of reference planes into one. A method of the division and a method of the aggregation are explained below.

The divided-piece generator 51 sets, as a division reference, a position of an object of a type of a designated element designated in advance and generates lines for dividing a reference plane, which is a machining target. The divided-piece generator 51 sets, as divided pieces, regions surrounded by the division lines or regions surrounded by a contour line of the shape of the reference plane and the division lines.

The designated element serving as the division reference may be a structure element of a building such as a structure wall or a column or may be an equipment element of a building such as equipment. The division reference can be designated from the "division reference" displayed on the input screen of the machining-parameter setter 2. A dividing method may be decided in advance, may be able to be selected from the machining-parameter setter 2, or may be uniquely determined from a plurality of dividing methods on the basis of a selected division reference.

The divided-piece reconfigurer 52 reconfigures divided pieces on the basis of a designated machining method and a designated machining limitation. The reconfiguration means combining a plurality of divided pieces.

The division-result evaluator 53 manages a result of structural machining as divided piece information. Specifically, the division-result evaluator 53 performs storage of the divided piece information in the machining result DB and acquisition of the divided piece information from the machining result DB. The divided piece information is generated by the divided-piece generator 51 during generation of divided pieces. It is conceivable that the divided piece information includes IDs associated with divided pieces, the number of machining steps in which the divided pieces are generated, IDs and position coordinates of vertexes included in the divided pieces, a combined piece ID list, which is a list of combined pieces obtained by combining the divided pieces, an adjacent piece ID list, which is a list of adjacent divided pieces, original space IDs, and a section ID list representing a simplified section overlapping the shapes of the divided pieces.

Note that the divided piece information includes, for each of the machining steps, information concerning divided pieces during the machining step. Therefore, by referring to the divided piece Information, it is possible to refer to not only a state of the divided pieces after the last machining processing but also states in the machining steps.

When a plurality of results of structural machining are obtained, the divided-piece-information manager 54 performs comparative evaluation and ordering on the plurality of results of the structural machining on the basis of the designated quantitative evaluation criteria.

Figure 25:
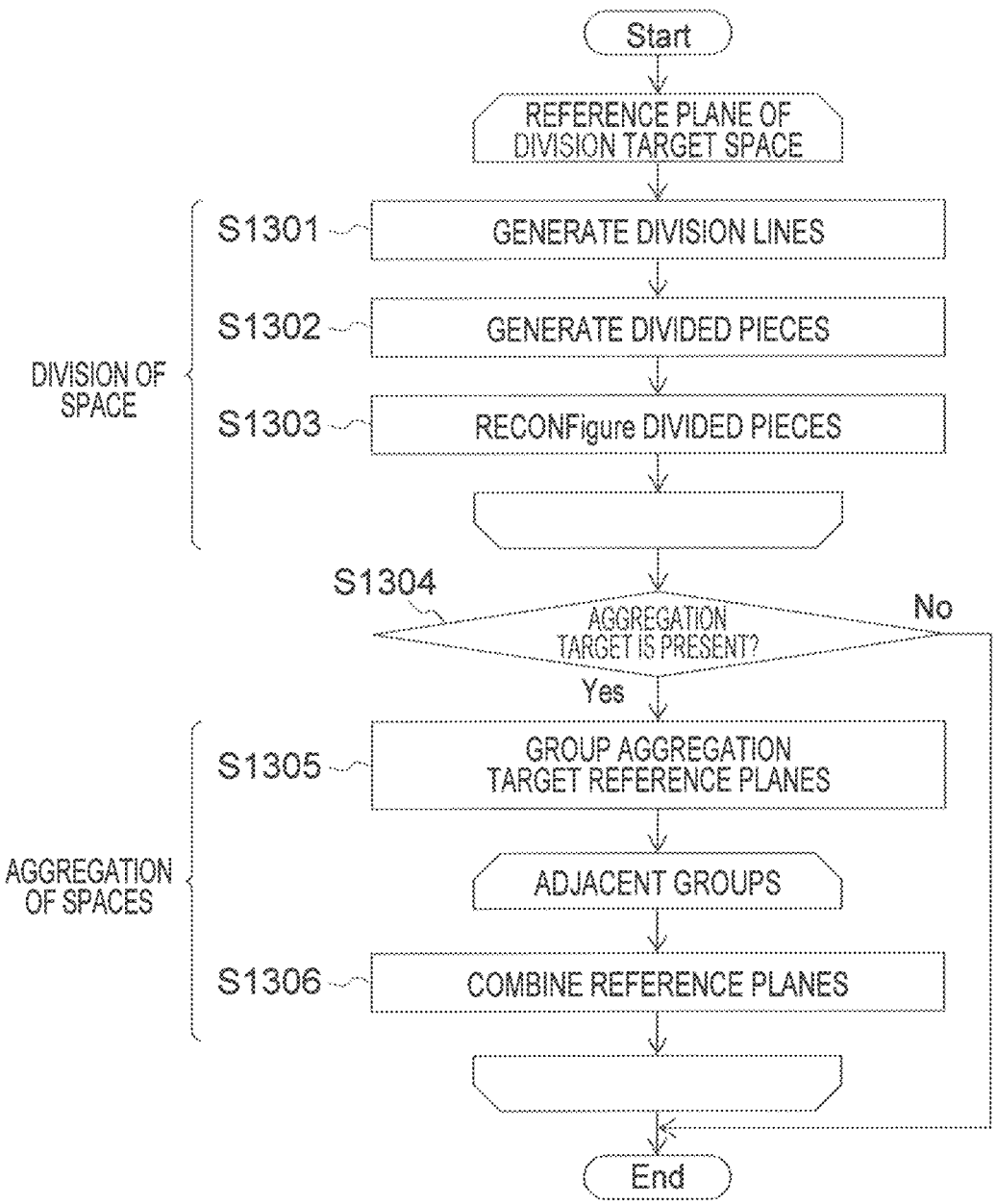
FIG. 25 is a schematic flowchart of spatial-structure machining processing of a spatial-structure machiner.

FIG. 25 is a schematic flowchart of spatial-structure machining processing of the spatial-structure machiner 5. First, the spatial-structure machiner 5 performs, on respective reference planes, which are division targets, processing concerning division of a space. The processing concerning division of a space includes three kinds of processing, that is, generation of division lines (S1301), generation of divided pieces (S1302), and reconfiguration of divided pieces (S1303). The divided-piece generator 51 performs the generation of division lines and the generation of divided pieces. The divided-piece reconfigurer 52 performs the reconfiguration of divided pieces.

Subsequently, the spatial-structure machiner 5 performs processing concerning aggregation of spaces. The aggregation is performed targeting reference planes other than the division target. When aggregation targets are absent or the aggregation is not performed (NO in S1304), the aggregation processing is omitted. When aggregation targets are present (YES in S1304), first, the spatial-structure machiner 5 groups reference planes that are the aggregation targets and adjacent to one another (S1305). The spatial-structure machiner 5 combines reference planes with respect to the respective groups (S1306). The divided-piece reconfigurer 52 performs these kinds of aggregation processing.

A method of generating divided pieces is explained.
(Divided-Piece Generating Method 1)

Figure 26A:
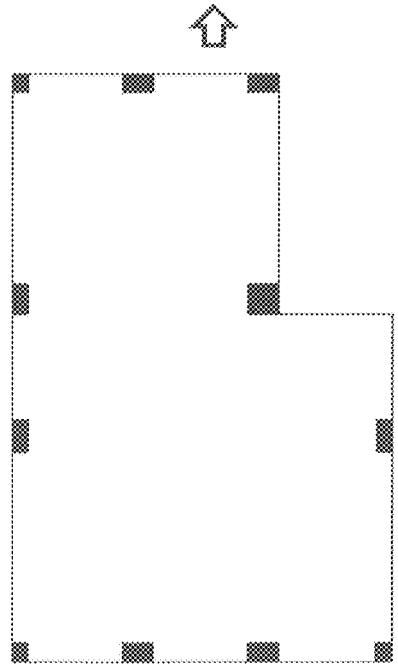
FIGS. 26A to 26C are diagrams showing an example of a method of generating divided pieces.
Figure 26B:
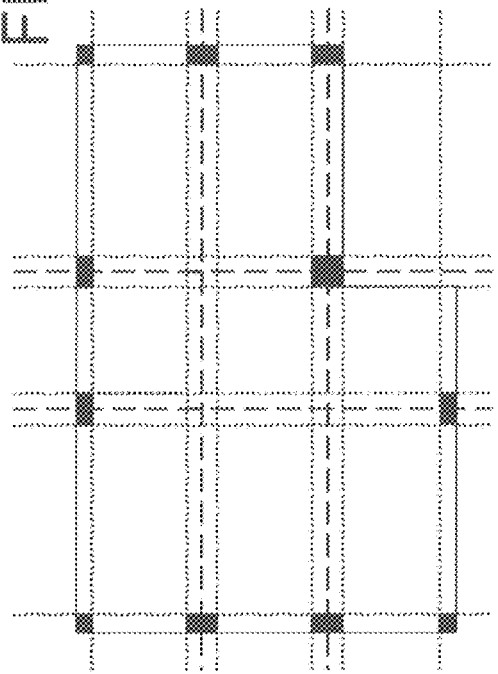
Figure 26C:
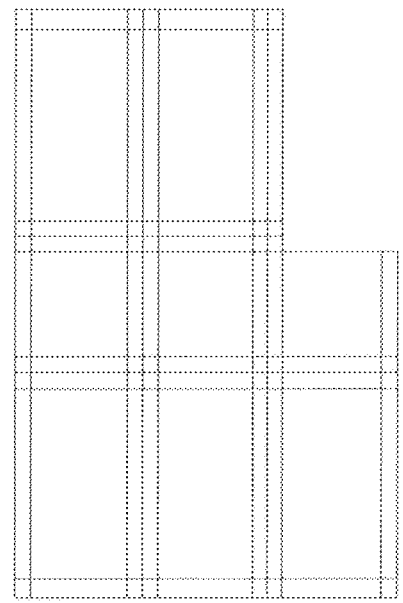

FIGS. 26A to 26C are diagrams showing an example of the method of generating divided pieces. FIG. 26A is a diagram showing a reference plane simplified in shape by the spatial-shape machiner 4. FIG. 26B is a diagram in which division lines are drawn on the reference plane. FIG. 26C is a diagram showing generated divided pieces. In the reference plane shown in FIG. 26A, concave sections by columns in contact with an outer periphery are simplified by the spatial-shape machiner 4. Black squares in contact with the outer periphery indicate the simplified concave sections and are shown for convenience. Designated elements are set as the columns, that is, the concave sections are set as references to generate division lines.

The divided-piece generator 51 generates division lines overlapping sides of the simplified columns. In FIG. 26B, the division lines generated in this way are represented by dotted lines. The divided-piece generator 51 generates perpendiculars passing midpoints of sides (sides not in contact with the outer periphery of the reference plane) of recessed portions of the concave sections present before being simplified. In FIG. 26B, the perpendiculars are represented by broken lines. Among the division lines generated in this way, the division lines not orthogonal to the outer periphery of the reference plane and the other division lines are deleted. As shown in FIG. 26C, regions surrounded by the division lines or regions surrounded by a contour line of the shape of the reference plane are divided pieces. When the divided pieces are generated, the divided-piece generator 51 generates divided piece information. The method of generating divided lines is the same as one of the methods of acquisition of direction axes performed by the direction-axis acquirer 42 of the spatial-shape machiner 4 explained above. Note that division lines may be generated by a method different from the method of acquisition of direction axes.

Figure 27A:
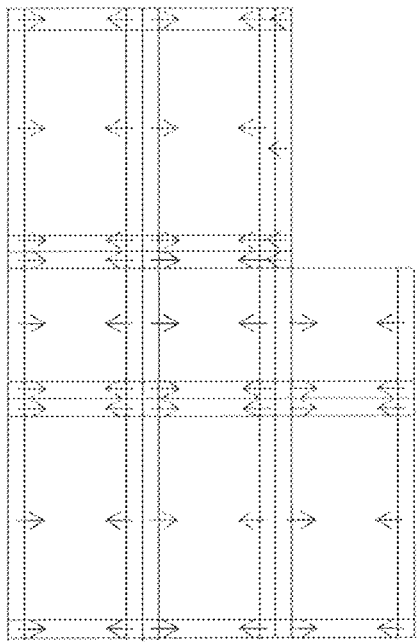
FIGS. 27A to 27D are diagrams for explaining reconfiguration of divided pieces.
Figure 27B:
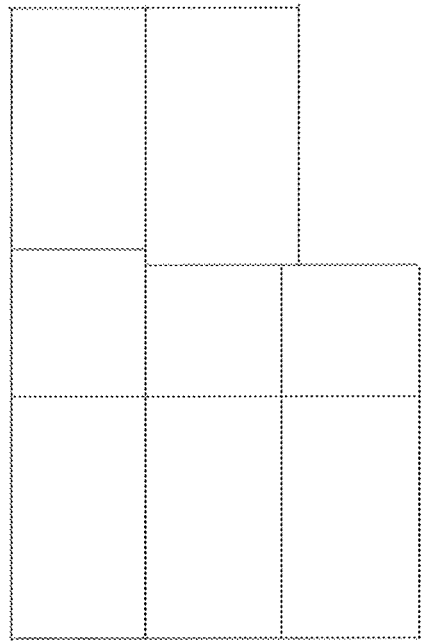
Figure 27C:
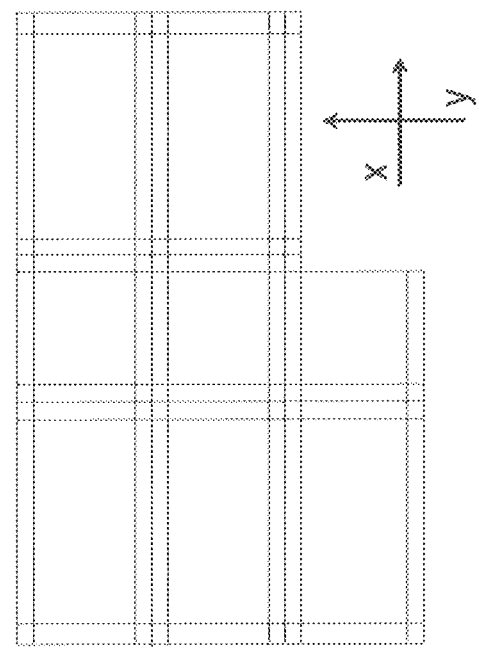
Figure 27D:
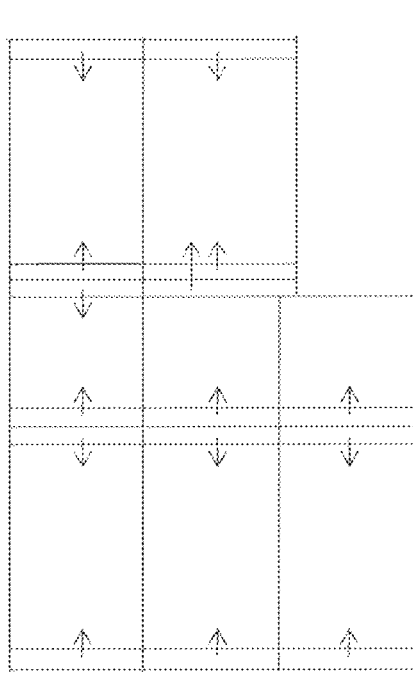

FIGS. 27A to 27D are diagrams for explaining reconfiguration of divided pieces. FIG. 27A is the same as the diagram shown in FIG. 26C and shows divided pieces. The divided-piece reconfigurer 52 performs combination processing on the divided pieces. The combination processing is processing for combining (absorbing) a divided piece having a minimum area with (into) divided pieces adjacent to the divided piece in the direction of the X axis or the Y axis of basic axes. FIG. 27B shows a case in which divided pieces adjacent to one another in the X-axis direction are combined. When a divided piece is adjacent to a plurality of divided pieces, divided pieces to be combined with the divided piece may be optionally selected. However, it is assumed that the divided piece is combined with a divided piece having a larger area. The combination is repeated as long as an area of a divided piece generated anew by the combination does not exceed a threshold designated in advance. Consequently, only divided pieces having areas equal to or larger than a fixed value remain. Subsequently, the same combination processing is performed on divided pieces adjacent to one another in an axis direction different from the axis direction in the combination processing explained above. FIG. 27C shows a case in which divided pieces adjacent to one another in the Y-axis direction are combined after the divided pieces adjacent to one another in the X-axis direction are combined. It is seen that small divided pieces present in FIG. 27B disappear. In FIG. 27C, the divided pieces are further combined in the Y-axis direction to generate larger divided pieces. FIG. 27D shows a result of the reconfiguration.

Note that, as explained in the method of determining direction axes, when there are a plurality of direction axes, combination of divided pieces is performed for each of the direction axes.

Note that a result of combination is different depending on which of the X axis and the Y axis the combination is performed. Therefore, the divided-piece reconfigurer 52 calculates evaluation values of combination results after performing both of the combination performed on the X axis first and the combination performed on the Y axis first. The divided-piece reconfigurer 52 adopts a combination result with a better evaluation value as a final result. A calculation method may be optionally decided. For example, when a smaller number of generated divided pieces is better, the divided-piece reconfigurer 52 calculates an evaluation value on the basis of the number of divisions. When a uniform size of generated divided pieces is better, the divided-piece reconfigurer 52 calculates an evaluation value on the basis of a standard deviation of areas of divided pieces. When the sizes of generated divided pieces are desirably as large as possible, the divided-piece reconfigurer 52 calculates an evaluation value on the basis of a deviation between areas of generated divided pieces and an upper limit value of areas of divided pieces decided in advance. Note that a method of calculating an evaluation value may be one method or a plurality of methods may be combined. When the plurality of methods are combined, weighting may be performed for each of the methods. Weight may be optionally decided.

An adoption reference and a value of the adoption reference, for example, an upper limit value of an area can be designated from the "adoption reference" and the "maximum area" displayed on the input screen of the machining-parameter setter 2.

The divided-piece reconfigurer 52 updates divided piece information concerning divided pieces by the reconfiguration adopted as the final result and the machining section information. Consequently, the division by the divided-piece generating method 1 ends.

(Divided-Piece Generating Method 2)

A method of setting the position of a designated element as the center of gravity, generating Voronoi boundaries, and dividing a reference plane is explained. When a plurality of generatrixes are present on a plane and the plane is divided into a plurality of regions on the basis of to which of the generatrixes points on the plane are closest, divided regions are referred to as Voronoi regions and boundary lines of the Voronoi regions are referred to as Voronoi boundaries. It is conceivable that this method is executed, for example, when equipment is designated in the "division reference" displayed on the input screen of the machining-parameter setter 2. For example, it is conceivable that the method is used, for example, when a BIM model for performing an analysis of a coverage of equipment such as an Indoor unit of an air conditioner, a sensor, or a wireless access point is generated.

FIGS. 28A to 28C are diagrams for explaining generation and reconfiguration of divided pieces by Voronoi boundaries. FIG. 28A is a diagram showing divided pieces by Voronoi boundaries. FIG. 28B is a diagram showing reconfiguration of divided pieces. FIG. 28C is a diagram showing divided pieces generated by reconfiguration and divided pieces unrelated to designated elements. The divided pieces unrelated to the designated elements may be further divided by the divided-piece generating method 1 explained above.

The divided-piece generator 51 acquires a plurality of designated elements (black squares shown in FIG. 28A) present on a reference plane, sets the designated elements as generatrixes, and divides the reference plane according to Voronoi boundaries on the basis of a publicly-known method of generating Voronoi boundaries.

In the reconfiguration of divided pieces shown in FIG. 28B, the divided-piece reconfigurer 52 generates, for each of the designated elements, an inscribed circle with the Voronoi boundary centering on the designated element and closest to the designated element. The divided-piece reconfigurer 52 generates a rectangle circumscribing the inscribed circle and reconfigures a divided piece on the basis of the rectangle. Consequently, a divided piece having an irregular shape shown in FIG. 28A is reconfigured into a divided piece having a regular shape to be a more simplified BIM model.

Note that, although the Inscribed circle with the Voronoi boundary is generated, a radius of a circle may be decided rather than generating the inscribed circle taking into account, for example, a state of a building, a space, or the like. For example, the radius of the circle may be decided taking into account, for example, the performance of equipment, which is a designated element. This is referred to as performance consideration. The radius of the circle may be decided taking into account distribution density of people present, heat sources, elements, which are obstacles, or the like in a space. This is referred to as density consideration. Either one of the performance consideration and density consideration may be performed or both of the performance consideration and the density consideration may be performed. Whether or not the performance consideration and the density consideration are performed can be designated from the "situation consideration" displayed on the input screen of the machining-parameter setter 2. Note that an example of the performance consideration and the density consideration is explained above. However, other matters may be considered.

Figure 29:
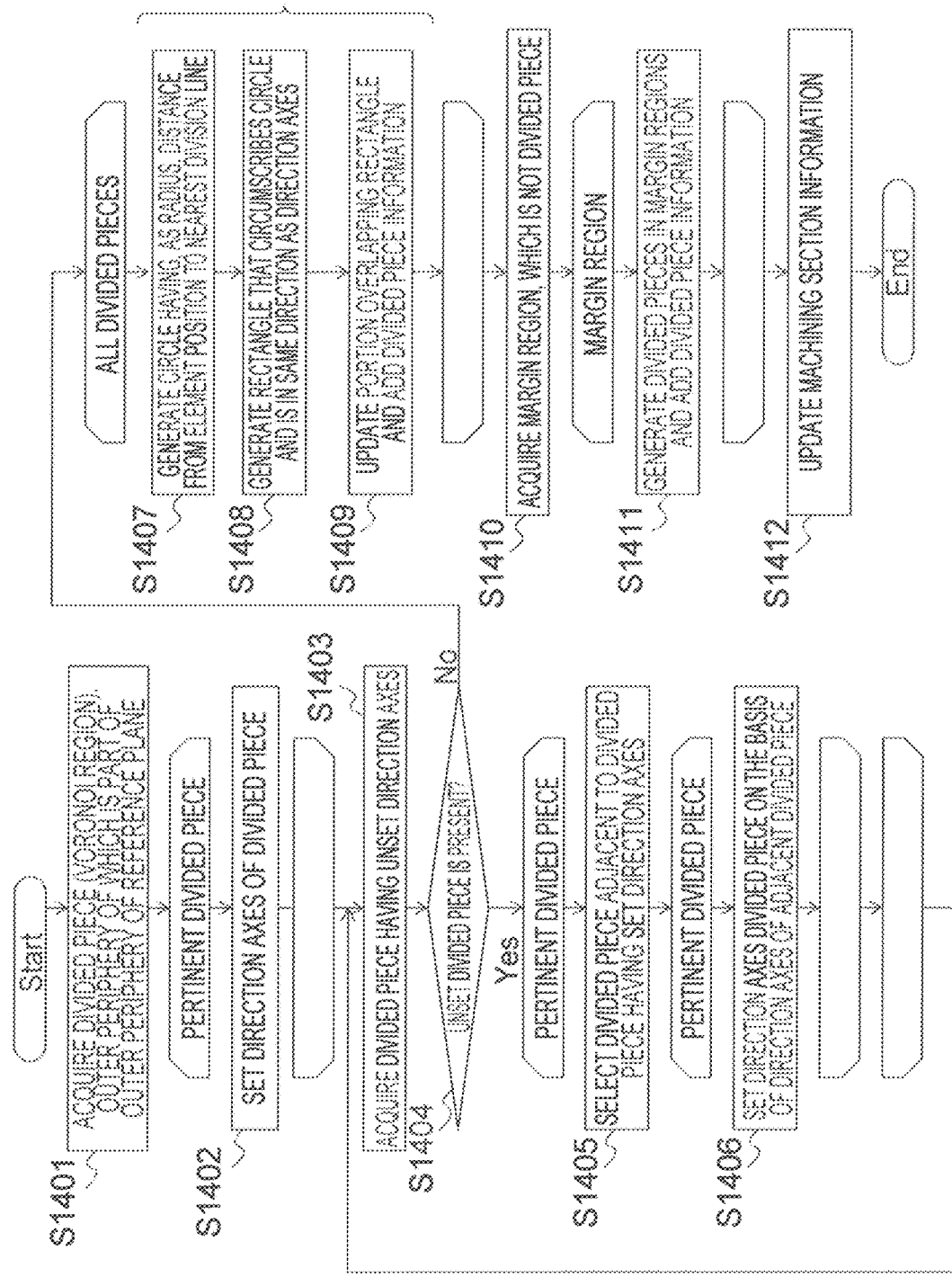
FIG. 29 is a flowchart of reconfiguration of divided pieces in a divided-piece generating method 2.

FIG. 29 is a flowchart of reconfiguration of divided pieces in the divided-piece generating method 2.

In order to set direction axes of divided pieces, the divided-piece reconfigurer 52 acquires a divided piece, a part of the outer periphery of which is a part of the outer periphery of the reference plane (S1401). The divided-piece reconfigurer 52 sets direction axes of the acquired divided piece in the same direction as the outer periphery of the reference plane (S1402). This is to use the outer periphery of the reference plane parallel to the direction axes by shape machining because it is difficult to set direction axes of respective divided pieces, which are Voronoi regions. After setting the direction axes of the divided piece in contact with the outer periphery, the divided-piece reconfigurer 52 determines direction axes of a divided piece not in contact with the outer periphery on the basis of the divided piece having the decided direction axes adjacent to the divided piece.

The divided-piece reconfigurer 52 acquires divided pieces having unset direction axes (divided pieces not in contact with the outer periphery) (S1403). When the divided pieces having the unset direction axes can be acquired (YES in S1404), the divided-piece reconfigurer 52 selects, among the acquired divided pieces, a divided piece adjacent to the divided piece having the set direction axes (S1405). The divided-piece reconfigurer 52 sets direction axes for the selected divided piece on the basis of the direction axes of the adjacent divided piece. When the selected divided piece is adjacent to one divided piece having set direction axes, the divided-piece reconfigurer 52 sets the direction axes of the divided piece the same as the direction axes of the adjacent divided piece. When the selected divided piece is adjacent to a plurality of divided pieces having set direction axes, the divided-piece reconfigurer 52 sets a combined vector of vectors of the direction axes of the adjacent divided pieces as the direction axes (S1406).

After setting direction axes for all the selected divided pieces, the divided-piece reconfigurer 52 acquires a divided piece having unset direction axis again (S1403). By repeating this processing, direction axes of all divided pieces in the reference plane are set. When a divided piece having unset direction axes is absent (NO in S1404), the divided-piece reconfigurer 52 performs, on all the divided pieces, processing depending on the situation consideration. When the situation consideration is not performed, the divided-piece reconfigurer 52 generates a circle having, as a radius, a distance from the position of the designated element to a nearest division line (S1407). The divided-piece reconfigurer 52 generates a rectangle that circumscribes the generated circle and is in the same direction as the direction axes (S1408). The divided-piece reconfigurer 52 sets the rectangle as a divided piece, updates an overlapping portion of divided pieces, and adds divided piece information (S1409). The overlapping portion of the divided pieces only has to be divided by generating lines connecting intersections with the divided pieces.

After performing the processing on all the divided pieces, the divided-piece reconfigurer 52 acquires margin regions, which are not divided pieces (S1410). The divided-piece reconfigurer 52 generates, in the respective acquired margin regions, divided pieces unrelated to the designated element (S1411). The division only has to be performed in the divided-piece generating method 1.

When the processing is completed, the divided-piece reconfigurer 52 updates the machining section information. The flowchart of the reconfiguration of the divided pieces in the divided-piece generating method 2 is as explained above.

Figure 30:
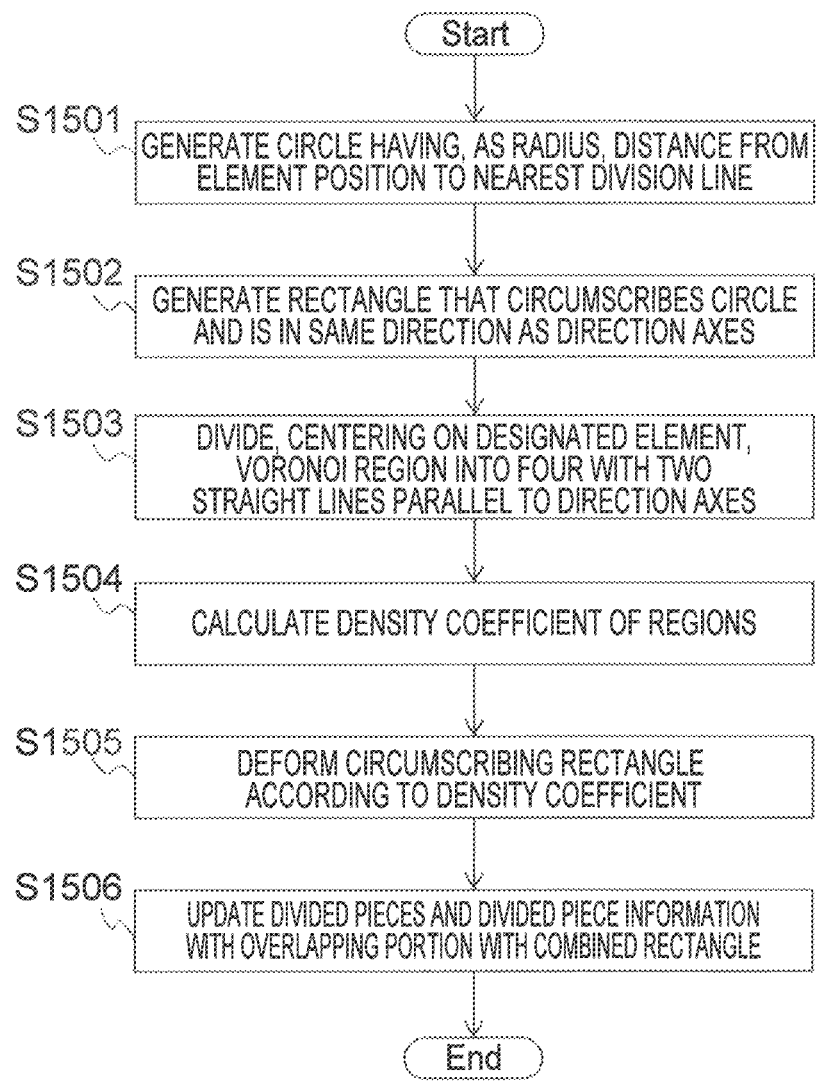
FIG. 30 is a flowchart of processing depending on situation consideration in performing density consideration.

The density consideration performed in the processing depending on the situation consideration is explained. FIG. 30 is a flowchart of the processing depending on the situation consideration in the case in which the density consideration is performed. In the case of the density consideration as well, the divided-piece reconfigurer 52 generates an inscribed circle (S1501) and generates a rectangle circumscribing the inscribed circle (S1502). Subsequently, the divided-piece reconfigurer 52 divides, centering on the designated element, the Voronoi region, the inscribed circle, and the circumscribing rectangle into four with a straight line parallel to the X-axis direction and a straight line parallel to the Y-axis direction of the direction axes (S1503). The divided-piece reconfigurer 52 further divides the divided Voronoi regions into overlapping regions, which are overlapping portions with the circumscribing rectangle, and non-overlapping regions, which are the other portions. The divided-piece reconfigurer 52 calculates, for each of the overlapping regions, density coefficients of the overlapping regions and the non-overlapping regions on the basis of a method decided in advance (S1504). The divided-piece reconfigurer 52 enlarges or reduces the four divided circumscribing rectangles according to the calculated density coefficient and then deforms the circumscribing rectangles (S1505). The divided-piece reconfigurer 52 sets, as new divided pieces, overlapping portions of the deformed circumscribing rectangles and the Voronoi regions and updates the divided piece information (S1506).

FIGS. 31A to 31D are diagrams for explaining processing in the case of the density consideration. A straight line parallel to the X-axis direction and a straight line parallel to the Y-axis direction divide, centering on the designated element, the Voronoi region, the inscribed circle, and the circumscribing rectangle. Overlapping portions of the divided Voronoi regions and the divided circumscribing rectangles are indicated by gray and represented as overlapping regions A1, B1, C1, and D1. In the divided Voronoi regions, portions not overlapping the circumscribing rectangles are represented as non-overlapping regions A2, B2, C2, and D2.

The divided-piece reconfigurer 52 calculates density D of the overlapping regions and the non-overlapping regions. Density may be a distribution degree of people and heat sources such as computers present in the regions. It is conceivable that the density is represented by the number, a heat quantity, or the like of heat sources present per one square meter. The density may be an occupancy degree of obstacles having fixed height. It is conceivable that the density is represented by the number, the capacity, or the like of obstacles present in one cubic meter. Numerical values of the heat quantity and the like may be represented by averages, maximums, upper limit values in a 95% reliability section, or the like.

The divided-piece reconfigurer 52 sets the density of the overlapping regions present in a direction in which a distance from the designated element to the Voronoi boundary is the shortest to 1. In FIGS. 31A to 31D, the density of the overlapping region A1 is 1. The divided-piece reconfigurer 52 calculates a density coefficient Cd of the overlapping regions and the non-overlapping regions on the basis of the density of the overlapping region A1. That is, the density coefficient Cd is obtained by dividing the density of the overlapping regions or the non-overlapping regions by the density of the reference overlapping region (the overlapping region A1). For example, a density coefficient Cd(B1) of the overlapping region B1 is calculated as Cd(B1)=D(B1)/D(A1).

Figure 31A:
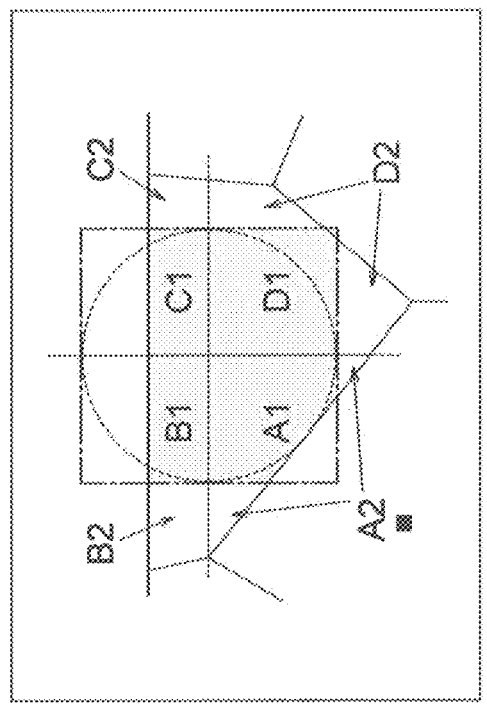
FIGS. 31A to 31D are diagrams for explaining processing in the case of the density consideration.
Figure 31B:
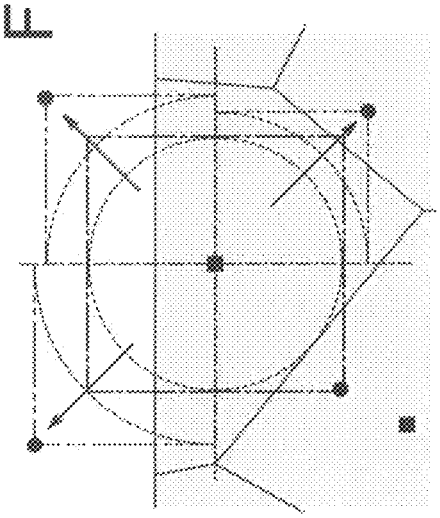

When the density coefficient Cd of the overlapping regions is 1 or more, a radius R of the inscribed circle is multiplied with an inverse of the density coefficient Cd of the overlapping regions to obtain a radius of a new circle. For example, when the density coefficient of the overlapping region B1 Cd(B1)≥1, a radius R(B1) of the overlapping region B1 is calculated as R(B1)=R×{1/Cd(B1)}. When the density coefficient Cd is smaller than 1, the radius R of the inscribed circle is multiplied with a value obtained by adding 1 to the inverse of the density coefficient Cd of the non-overlapping regions to obtain a radius of a new circle. For example, when Cd(B1)<1, R(B1)=R×{1+1/Cd(B2)}. Consequently, as shown in FIG. 31B, the divided inscribed circles (fan shapes) are respectively enlarged or reduced. The positions of vertexes of the circumscribing rectangles are moved according to the enlargement or the reduction of the fan shapes. Specifically, vectors from the designated element to the vertexes of the circumscribing rectangles only have to be multiplied with a ratio obtained by dividing the new radius by the radius R of the inscribed circle.

Figure 31C:
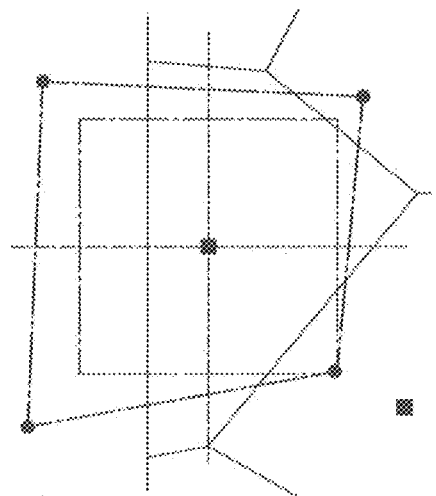
Figure 31D:
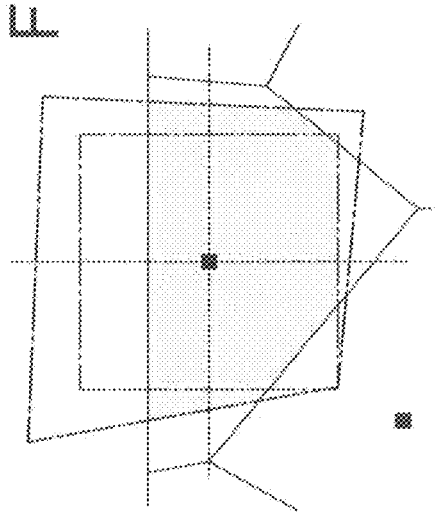

FIG. 31C shows a new rectangle formed by the moved vertexes. An overlapping portion (a gray portion in FIG. 31D) of the deformed new rectangle and the Voronoi region is set as a new divided piece. The divided piece information is updated.

When the performance consideration is performed, the radius of the inscribed circle only has to be enlarged or reduced according to the performance of equipment set as the designated element, for example, a control range of an air conditioner. The other processing is the same as the processing performed when the situation consideration is not performed.

When both of the performance consideration and the density consideration are performed, the density consideration only has to be performed after the performance consideration is performed first, that is, after the enlargement or the reduction of the radius of the inscribed circle is performed.

(Divided-Piece Generating Methods 3 and 4)

Divided-piece generating methods 3 and 4 have a purpose of adjusting widths in the X-axis direction (X-axis widths) and widths in the Y-axis direction (Y-axis widths) of divided pieces to set the widths to the same lengths as much as possible.

FIGS. 32A to 32C are diagrams for explaining division by the divided-piece generating methods 3 and 4. FIG. 32A shows divided pieces divided by the divided-piece generating method 1 shown in FIG. 27D. FIG. 32B shows divided pieces divided by the divided-piece generating method 3. FIG. 32C shows divided pieces divided by the divided-piece generating method 4. New division lines are indicated by dotted lines.

The divided-piece generating method 3 is a method of calculating ratios of the X-axis widths and ratios of the Y-axis widths of the divided pieces to a minimum X-axis width or Y-axis width of the divided pieces and further dividing the divided pieces on the basis of the ratios of the X-axis width and the Y-axis width. In eight divided pieces shown in FIG. 32A, the ratio of the X-axis widths of the divided pieces is approximately 1:1:1:2:2:2:2:2. The ratio of the Y-axis widths of the divided pieces is approximately 1:1:1:1:1:1:1:1. Therefore, the X-axis width of the divided piece, the ratio of the X-axis width of which is 2, is divided into two. Note that the ratio is an integer and decimal places are rounded down. Since all ratios of the Y-axis widths are 1, the Y-axis widths are not divided. Consequently, it is possible to bring the divided pieces close to the same widths as much as possible.

The divided-piece generating method 4 divides a maximum of the X-axis widths designated in advance by a square root of a unit area designated in advance and equally divides the X-axis widths of the divided pieces by an integer value of a calculated quotient. The divided-piece generating method 4 divides a maximum of the Y-axis widths designated in advance by the square root of the unit area explained above and equally divides the Y-axis widths of the divided pieces by an Integer value of a calculated quotient. The unit area means a reference value per one divided piece. Consequently, it is possible to bring the divided pieces close to a square or a rhombus of the same size as much as possible. Note that the X-axis widths and the Y-axis widths are divided on the basis of the square root of the unit area so as to form a square or a rhombus. However, the ratios of the X-axis widths and the Y-axis widths of the unit area to be divided may be optionally determined.

Note that the maximum width and the unit area used in equally dividing a reconfiguration result can be designated from the "subdividing method" displayed on the input screen of the machining-parameter setter 2.

(Aggregating Method)

An aggregating method is explained. FIGS. 33A and 33B are diagrams for explaining aggregation. Portions surrounded by solid lines in FIG. 33A are reference planes (spaces). Dotted lines are division lines. The reference planes indicated by gray are reference planes not designated as division targets. The reference planes indicated by white are reference planes designated as division targets in which divided piece are generated. In this way, when there are a plurality of reference planes, the aggregation is performed targeting the reference planes that are not the division targets.

The divided-piece reconfigurer 52 acquires reference planes, which are considered to be in an adjacent relation because parts of the outer peripheries of the reference planes are adjacent or shared, and combines the reference planes such that the outer periphery of the reference planes is the longest. If a plurality of adjacent reference planes are considered one group, the reference planes can be regarded as divided pieces. If reconfiguration of the divided-piece generating method 1 is performed, the aggregation can be performed. In FIG. 33A, if three reference planes on the upper side among the reference planes indicated by white are set as one group and two reference planes on the lower side among the reference planes indicated by white are set as another one group, as shown in FIG. 33B, the reference planes are aggregated.

When the aggregation is performed, spaces to be aggregated and conditions of the aggregation may be able to be selected. For example, adjacent Space unit aggregation for combining unselected spaces adjacent to each other among unselected spaces into one divided piece and adjacent/same type Space unit aggregation for combining unselected spaces adjacent to each other and for the same type of use among unselected spaces into one divided piece. The conditions of aggregation can be designated from the "aggregation method" displayed on the input screen of the machining-parameter setter 2.

Figure 34:
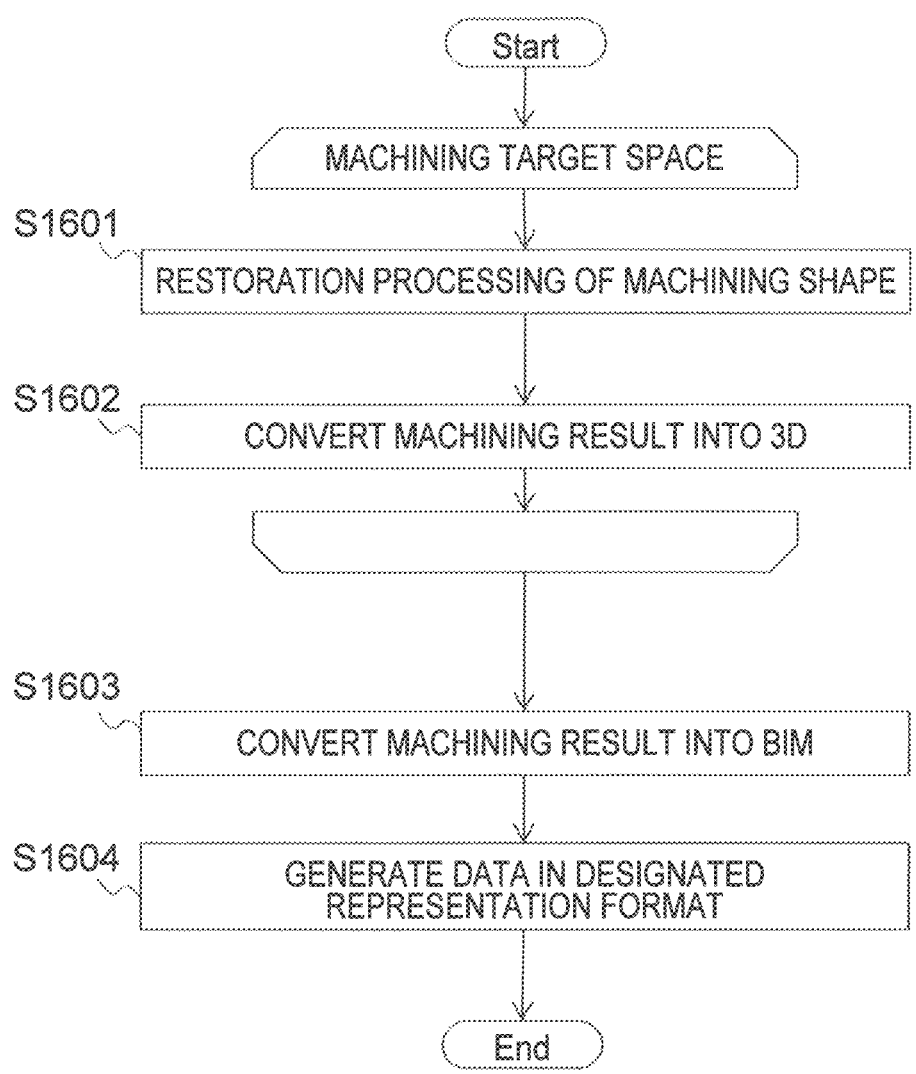
FIG. 34 is a schematic flowchart of shaping processing of a machining-result shaper 6.

The machining-result shaper 6 adjusts a machining result to be able to be utilized and then shapes the machining result on the basis of designated data representation. The adjustment includes restoration of a shape and addition of attributes of the BIM model (conversion into the BIM model). FIG. 34 is a schematic flowchart of shaping processing of the machining-result shaper 6. The machining-result shaper 6 performs restoration processing of a machining shape on respective machining target spaces (S1601). The machining-result shaper 6 converts divided pieces or the like, which are a machining result, into 3D (S1602). The conversion into 3D means granting information concerning height to the divided pieces or the like.

After the processing on all the machining target spaces ends, the machining-result shaper 6 adds the attributes of the BIM model to an object or the like machined or created anew by a series of processing (S1603). The machining-result shaper 6 generates data of a designated representation format (S1604).

The shape restorer 61 restores the machining result on the basis of the machining section information. FIGS. 35A to 35C are diagrams showing an example of a result of restoration processing of the shape restorer 61. FIG. 35A shows divided pieces of the machining result before the restoration. FIG. 35B is an example of a restoration result. Designated elements to be restored are columns. Only columns in an outer peripheral portion are restored. FIG. 35C is another example of the restoration result. In FIG. 35C as well, designated elements to be restored are columns. Only columns on the inside are restored. In this way, even if the designated elements are the same, information concerning a machining step for machining the outer periphery and a machining step for machining the inside are included in the machining section information, whereby it is possible to restore restoration targets for each of the machining steps.

Figure 36:
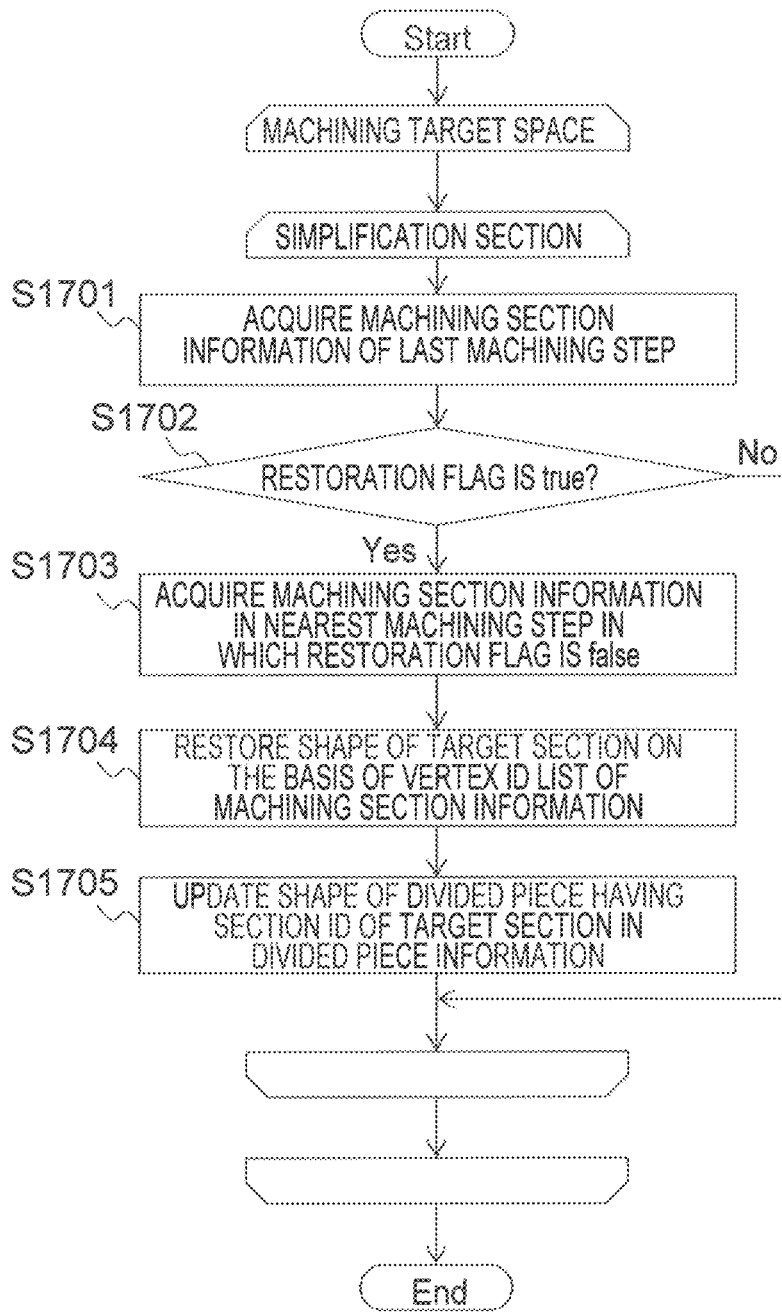
FIG. 36 is a flowchart of the restoration processing.

FIG. 36 is a flowchart of the restoration processing. The shape restorer 61 performs this processing on simplification sections of machining target spaces. The shape restorer 61 acquires machining section information of a last machining step in a simplification section (S1701) and confirms a restoration flag (S1702). Machining information that should be restored is included in a simplification section in which the restoration flag is true.

When the restoration flag is not true (NO in S1702), the shape restorer 61 shifts to the next simplification section. When the restoration flag is true (YES in S1702), the shape restorer 61 traces back machining steps of the simplification flag, in which the restoration flag is true, one by one from the last machining step. Identification numbers are allocated to the machining steps on the basis of a numbering rule decided in advance. It is possible to sort the machining section information in an ascending order or a descending order of the machining steps. When finding a machining step, in which the restoration flag is false, for the first time, the shape restorer 61 acquires machining section information in the machining step (S1703). Machining processing by the machining step is machining processing to be restored.

The machining section information includes a vertex ID list at points in time of the machining steps. The shape restorer 61 restores a shape of a target section on the basis of the vertex ID list (S1704). The shape restorer 61 updates divided piece information concerning divided pieces related to the restored simplification section (S1705). The shape restorer 61 only has to refer to a section ID of the restored simplification section and extract a divided piece having the section ID. The divided piece information only has to be updated with a portion of a divided piece overlapping the section to be restored adjusted to the restored shape. If the processing is finished for all the simplification sections of all the machining target spaces, the restoration processing ends.

The shape restorer 61 also performs conversion into 3D of a reference plane or a divided piece. The conversion into 3D means causing a machined reference plane, divided piece, or the like corresponding to a spatial object (a space) to inherit height information of the spatial object. When the reference-plane acquirer 41 of the spatial-shape machiner 4 generates a reference plane, since the reference plane is generated as a plane, the reference plane and divided pieces obtained by dividing the reference plane do not have height information. Therefore, the shape restorer 61 grants height information to the divided pieces. Consequently, the machining result can also be used for processing in which the height information is used.

As the height, various heights such as a maximum or an average of heights in a space and height of a floor itself in which the space is present are conceivable. However, height is uniformly selected for simplification. Height to be selected only has to be acquired from the machining-parameter setter 2. The height can be designated from the "space height" displayed on the input screen of the machining-parameter setter 2.

Height to be selected and a calculation method in that case are explained below.

[1] Maximum Height $H_{max}^s$ of a Space s

Acquisition Example 1

A z coordinate representing height is acquired from all vertexes configuring the space s. A difference between a maximum $z_{max}^s$ and a minimum $z_{min}^s$ of the z coordinate is represented as $z_{max}^s$. That is, $z_{max}^s = z_{max}^s - z_{min}^s$.

Acquisition Example 2

A difference between a maximum and a minimum of heights of constituent elements is represented as $H_{max}^s$ targeting elements (objects) configuring the space s. For example, concerning z coordinates of all vertexes of all elements on an upper surface such as a ceiling, a maximum of the z coordinates is represented as $z_{max}^{s.ceiling}$. For example, concerning z coordinates of all vertexes of all elements on a side surface such as a wall, a maximum of the z coordinates is represented as $z_{max}^{s.wall}$. For example, concerning z coordinates of all vertexes of all elements on a bottom surface such as a floor, a minimum of the z coordinates is represented as $z_{min}^{s.slab}$. At this point, a difference between $z_{max}^{s.ceiling}$ and $z_{min}^{s.slab}$ or a difference between $z_{max}^{s.wall}$ and $z_{min}^{s.slab}$ is represented as $H_{max}^s$. That is, $H_{max}^s = z_{max}^{s.ceiling} - z_{min}^{s.slab}$ or $H_{max}^s = z_{max}^{s.wall} - z_{min}^{s.slab}$.

Note that, when the thickness of an element is taken into account, concerning the upper surface, thickness only has to be acquired from attribute information of an element having a maximum z coordinate and subtracted from $z_{max}^s$. Concerning the bottom surface, thickness only has to be acquired from attribute information of an element having a minimum z coordinate and added to $z_{min}^s$.

[2] Average Height $H_{ave}^s$ of the Space s

For example, concerning z coordinates of all vertexes of all elements on an upper surface such as a ceiling, an average of the z coordinates is represented as $z_{ave}^{s.ceiling}$. For example, concerning z coordinates of all vertexes of all elements on a bottom surface such as a floor, an average of the z coordinates is represented as $z_{ave}^{s.slab}$. That is, $H_{ave}^s = z_{ave}^{s.ceiling}$ or $H_{ave}^s = z_{ave}^{s.slab}$.

[3] Height $H_{floor}^s$ of a Floor on which the Space s is Present

A floor including the space s and an upper floor of the floor are set as targets and a difference between a reference value $z_{base}^f$ of the height of a bottom surface of the floor including the space s and a reference value $z_{base}^{f+1}$ of the height of a bottom surface of the upper floor of the floor is represented as $H_{floor}^s$. That is, $H_{floor}^s = z_{base}^{f+1} - z_{base}^f$. Note that $z_{base}^f$ and $z_{base}^{f+1}$ only have to be acquired from attribute information of floors.

The BIM-model generator 62 further performs, for example, addition of attributes of the BIM model on the divided pieces or the like converted into 3D by the shape restorer 61 to make it easier to use the divided pieces or the like as the BIM model. For example, the reference plane or the divided piece or the like, which is a plane (floor face), can be granted height information by the shape restorer 61. However, the reference plane or the divided piece or the like does not have attribute information concerning three-dimensional (3D) geometric shapes of a bottom surface, a side surface, an upper surface, and the like. Granting of attribute information (building information) and granting of relation information are explained as an example.

(Granting of Attribute Information)

Attribute information of a spatial object serving as a base of divided pieces is acquired from the machining-target extractor 3 or the like. Elements concerning 3D geometric shapes included in the attribute information, for example, attribute information (building information) of a bottom surface, a side surface, an upper surface, and the like is granted. For example, concerning a certain bottom surface, information indicating that the bottom surface is a "floor (slab)" and a material of the bottom surface is "concrete" is granted.

Note that a type of the building element confirms to a conceptual system of the BIM model. There are, for example, a conceptual system defined by IFC and a conceptual system defined by gbXML.

Original attribute information may be granted to elements not different before and after machining or elements derived from elements present before the machining by the machining. New attribute Information may be granted to elements generated anew by the machining. For example, a side of a divided piece, which is not a part of the outer periphery of a reference plane, is actually absent. Therefore, on the BIM model, the side may be an Imaginary wall and an attribute of a material of the wall may be transmissive or transparent. Attribute information may be estimated on the basis of attribute information of the shape of a plane such as a side or a surface of a divided piece or a shape of a machining result and granted to the side. For example, a space having a similar (including coinciding and analogous) shape machining result and the same use may be acquired from the building information DB 1 or the machining result DB 7 and an attribute of the side may be set the same as an attribute of the same element of the space.

(Granting of Relation Information) Relation Information concerning a relation among elements is generated. As the relation, there are a structural relation, a configuration relation, and a connection relation.

The structural relation means a relation between a building and elements concerning assembly components of the building and is a relation of a tree structure indicating a so-called parent-child relation. The structural relation is decided taking into account a positional relation (spatial disposition) on a space as well. The building, the elements concerning the assembly components of the building, and elements concerning assembly components of the elements are also considered to be in the structural relation.

For example, the structural relation is considered to be present between a machined space and a floor on which the space is present. The structural relation is also considered to be present between the machined space and elements present in the space, for example, fixtures, equipment, and apparatuses. For example, the machined space, walls forming the space, windows attached to the walls, doors, and the like are considered to be in a series of structural relation.

The configuration relation means a relation between a function (a system) of the building and elements functioning as components belonging to the building for the function. The configuration relation is also a so-called parent-child relation. However, spatial disposition does not always have to be taken into account. The function (the system) of the building, the elements functioning as the components belonging to the building for the function, and elements functioning as components belonging to the building for functions of the elements are also considered to be in the configuration relation.

For example, the configuration relation is considered to be present between a machined space concerning a certain use and elements necessary for the use, for example, fixtures, equipment, and apparatuses.

The connection relation means a spatially connected relation without a parent-child relation. For example, a space adjacent to a machined space does not have a parent-child relation but is considered to have the connection relation because the space is adjacent to the machined space.

Note that, when a machining result to which attribute information or the like is added is converted into an actual BIM model, an existing BIM model generation engine used by an existing BIM adapted CAD system only has to be used.

The designated-format-data outputter 63 outputs, on the basis of a data format designated by the machining-parameter setter 2, data to which BIM-defined attribute information generated by the BIM-model generator 62 is granted. As the data format, a schemer of an IFC format such as ifc or ifcXML or a schemer of a gbXLM format such as xml is conceivable.

An output format can be designated from an "output format" displayed on the input screen of the machining-parameter setter 2.

Only location information of the machined space may be output. For example, a topic of MQTT (MQ Telemetry Transport) used in information communication between apparatuses may be output. The topic is communication target information and data Indicating a location of the information. The topic is represented by a hierarchical structure (a tree structure) delimited by slash signs. The location of the communication target information, the communication target information, and the like are represented by the hierarchical structure. That is, relation attributes such as the structural relation, the configuration relation, and the connection relation of the constituent elements configuring the building can be represented by the topic as well. Only information that can specify the location of the machined space such as "/place/building use/building name/floor/room name/zone name/equipment use/equipment name" may be output.

The machining result DB 7 stores machining parameters set by the machining-parameter setter 2, building information 3 before machining extracted by the machining-target extractor, a processing result of the spatial-shape machiner 4, a processing result of the spatial-structure machiner 5, a processing result of the machining-result shaper 6, and the like. Besides, the machining result DB 7 may include machining results by the components explained above, for example, machining section information and divided piece information. The machining result DB 7 may store information other than the information explained above.

Note that the machining result DB 7 may send the machining results to the building information DB 1 and make it possible to use the machining results from the building Information DB 1. Alternatively, the machining result DB 7 and the building Information DB 1 may be combined as one DB.

The machining-result outputter 8 receives an input from the user and outputs a machining result stored in the machining result DB 7. The output only has to be extracted using a function of software such as RDBMS for managing the machining result DB 7 or DBMS of a Key-Value store format. An output format may be optional. For example, the machining result may be displayed as images or may be saved as a file. When the machining result is displayed as images, the images may be displayed side by side or may be displayed one on top of another. When a plurality of results of machining are obtained, for example, the plurality of results may be displayed as a list and a selected result may be drawn and displayed. When the machining result is saved as a file, a data format of the machining result may be used as it is or may be changed to a designated data format.

Figure 37:
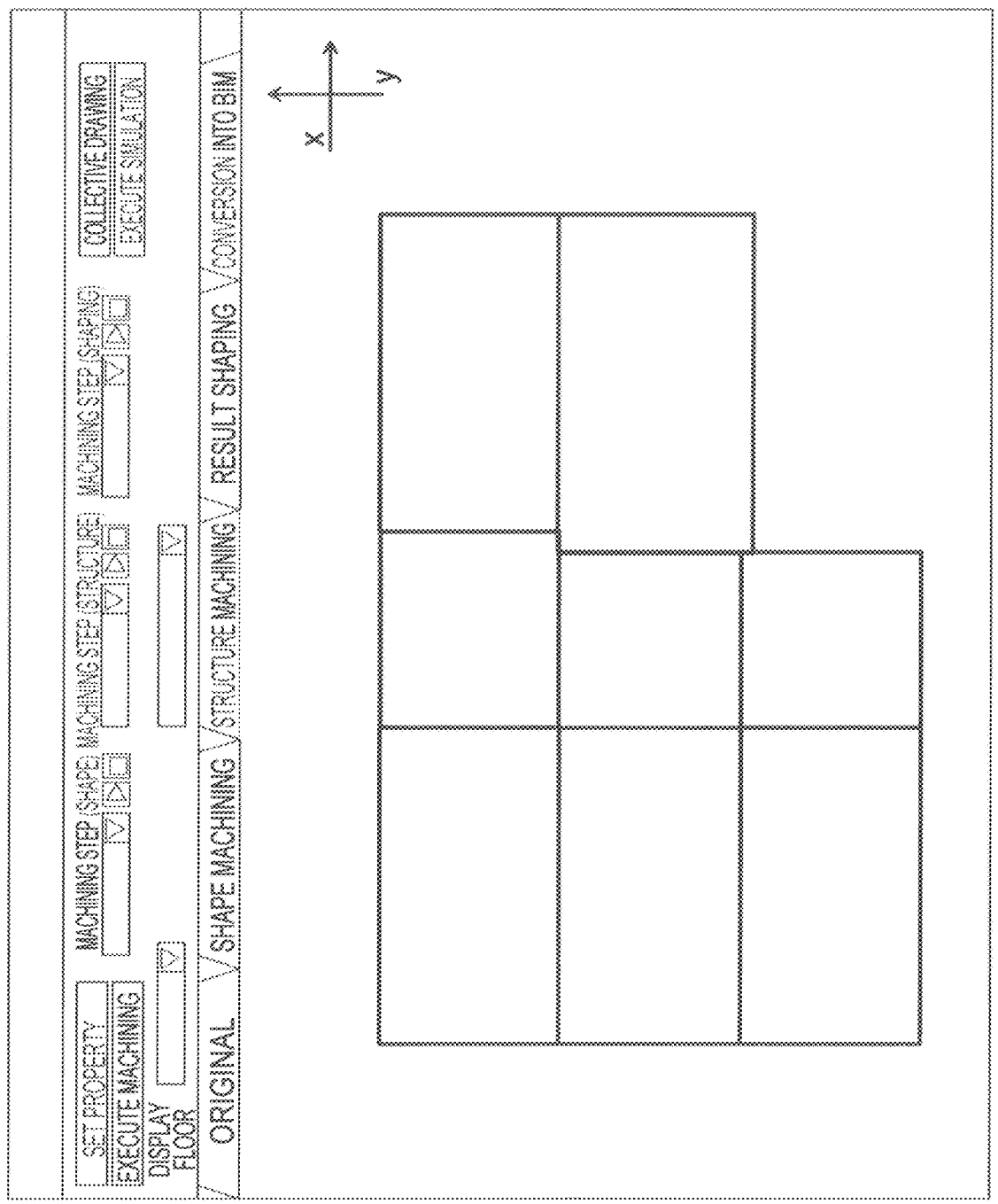
FIG. 37 is a diagram showing an example of an output.

FIG. 37 is a diagram showing an example of an output. In FIG. 37, a machining result is displayed in a drawing area as a figure. A plurality of buttons having various functions are disposed above the drawing area. A change of an output format, display of Information retained by an output result, start of the machining-parameter setter, start of a simulation based on the machining result, and the like may be executed by pressing the buttons.

Not only the figure but also information concerning machining may be displayed. For example, machining steps from a shape machining start to an end obtained from the machining section information may be displayed as a list. A machining result at a point in time of a selected machining step may be drawn. It is also conceivable that drawing and display are automatically switched step by step from a selected machining step to a machining step at a shape machining end.

As explained above, according to the embodiment of the present invention, in disposition design of equipment, an analysis evaluation, and the like, a reduction in cost of generation of space information, a reduction in cost of a simulation, and standardization and improvement of machining quality of BIM data are achieved. By feeding back space information of a machining result to control of equipment, it can also be expected that accuracy of the control of equipment is improved and a re-disposition plan of equipment is acquired through comparison of machining results.

Each process in the embodiments described above can be implemented by software (program). Thus, the embodiments described above can be implemented using, for example, a general-purpose computer apparatus as basic hardware and causing a processor mounted in the computer apparatus to execute the program.

Figure 38:
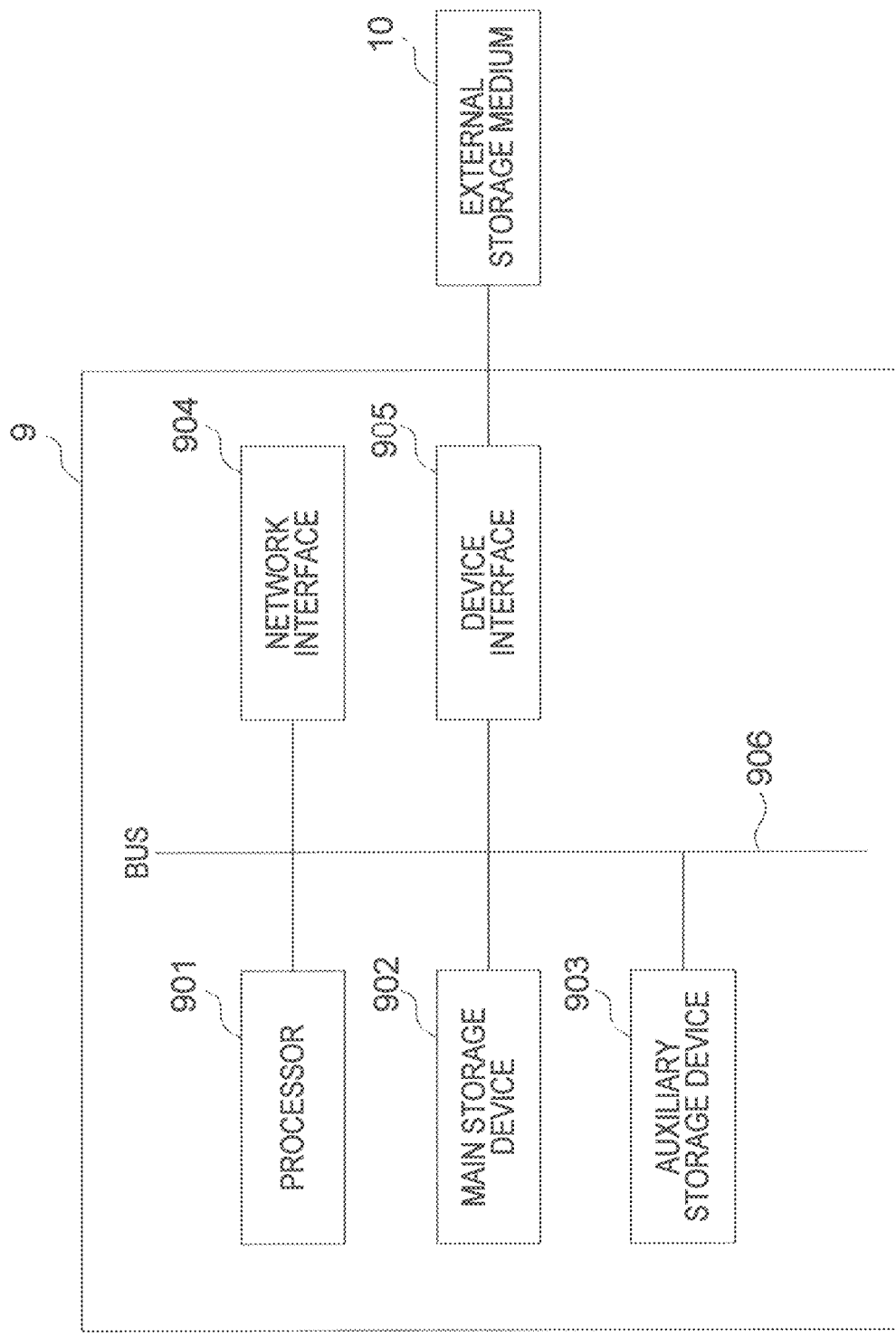
FIG. 38 is a block diagram showing a hardware configuration example in which the spatial-information generation apparatus according to the embodiment is realized.

FIG. 38 is a block diagram showing a hardware configuration example in which the spatial-information generation apparatus according to this embodiment is realized. A spatial-information generation apparatus 1 includes a processor (a CPU) 901, a main storage device 902, an auxiliary storage device 903, a communication device 904, a device interface 905, an input device 906, and an output device 907. The spatial-information generation apparatus 1 can be realized as a computer apparatus 9 in which these devices are connected via a bus.

The processor 901 reads out a program from the auxiliary storage device 903, expands the program in the main storage device 902, and executes the program to realize functions.

The spatial-information generation apparatus in this embodiment may be realized by installing, in the computer apparatus, in advance, a program executed in the spatial-information generation apparatus or may be realized by storing the program in a storage medium such as a CD-ROM or distributing the program via a network and installing the program in the computer apparatus as appropriate.

The network interface 904 is an interface for connecting the spatial-information generation apparatus 1 to a communication network. The setting screen of the machining-parameter setter 2 and an output result from the machining-result outputter 8 may be transmitted to other apparatuses via the network interface 904. Only one network interface is shown. However, a plurality of network interfaces may be mounted.

The device interface 905 is an Interface for connecting the spatial-information generation apparatus 1 to a device such as an external storage medium 7. The external storage medium 7 may be any storage medium such as a HDD, a CD-R, a CD-RW, a DVD-RAM, a DVD-R, or a SAN (Storage area network). The building information DB 1, the machining result DB 7, and the like may be connected to the device interface 905 as an external storage medium 10. An input device that outputs the setting screen of the machining-parameter setter 2 and an output device that outputs an output result of the machining-result outputter 8 may be connected to the device interface 905.

The main storage device 902 is a memory device that temporarily stores a command executed by the processor 901, various data, and the like. The main storage device 902 may be a volatile memory such as a DRAM or may be a nonvolatile memory such as an MRAM. The auxiliary storage device 903 is a storage device that permanently stores a program, data, and the like. There is, for example, a HDD, an SSD, or the like. Data retained by the spatial-information generation apparatus is saved in the main storage device 902, the auxiliary storage device 903, or the external storage medium 7.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A spatial-information generation apparatus generating spatial-information of a building which includes a plurality of spaces as constituent elements thereof, the apparatus comprising a processor configured to execute a program to provide at least:

a reference-plane acquirer that acquires, on the basis of a first spatial object related to a first space, which is one of the constituent elements, first attribute information indicating attributes of the first spatial object, and first relation information indicating a relation between the first spatial object and objects of other constituent elements of the building, a reference plane object related to a plane of a part of the first space from the first spatial object and generates a shape of the reference plane object based on at least one of the first attribute, the first relation information, and the reference plane object;

a simplification section setter that divides the shape of the reference plane object into a plurality of sections on the basis of the first relation information, and sets at least one section of the plurality of sections as a simplification section, which is a target to be simplified;

a shape simplifier that simplifies the shape of the reference plane object in the simplification section to thereby generate the reference plane object in the simplified shape;

a spatial-structure machiner that divides a region of the reference plane object in Voronoi boundaries with second constituent elements, which are one kind of the constituent elements of the building included in the region of the reference plane object, set as generatrixes, respectively generates, for each of the second constituent elements, inscribed circles with the Voronoi boundaries centering on the second constituent elements and closest to the second constituent elements, respectively generates circumscribing rectangles for each of the inscribed circles, and generates, on the basis of the rectangles, divided pieces for dividing the region of the reference plane object into a plurality of regions; and a simulator that feeds back space information to equipment controllers for determining a re-disposition plan of equipment acquired through comparison of machining results.

2. The spatial-information generation apparatus according to claim 1, wherein the simplification-section setter:

finds a section in which the first space is adjacent to another space based on the first relation information;

sets sides of the section as section ends; and sets a section between the section ends as the simplification section.

3. The spatial-information generation apparatus according to claim 2, wherein, the shape simplifier:

confirms whether an overlapping portion is present, the overlapping portion being between a simplified reference plane object in the first space and a simplified reference plane object in a second space which is different from the first space; and further simplifies a shape of the overlapping portion to eliminate the overlapping portion, when the overlapping portion is present.

4. The spatial-information generation apparatus according to claim 1, wherein the shape simplifier:

traces the simplification section in a direction decided in advance; and recognizes a convex section or a concave section present in the simplification section and linearizes the convex section or the concave section to thereby simplify the simplification section.

5. The spatial-information generation apparatus according to claim 1, further comprising the spatial-structure machiner that divides a region of the reference plane object into a plurality of divided pieces on the basis of shapes of third constituent elements, which are one kind of the constituent elements of the building, in the shape of the reference plane object and directions of the third constituent elements and, as long as a new piece of the divided piece having an area exceeding a predetermined threshold is not generated, combines the divided piece having a minimum area among the plurality of divided pieces with another of the divided pieces to thereby generate the new divided piece.

6. The spatial-information generation apparatus according to claim 5, wherein the spatial-structure machiner calculates a ratio of a longitudinal width or a lateral width of a first divided piece among the plurality of divided pieces to a smallest longitudinal width or lateral width in the plurality of divided pieces and divides the longitudinal width or the lateral width of the first divided piece by the ratio.

7. The spatial-information generation apparatus according to claim 5, wherein the spatial-structure machiner divides a longitudinal width or a lateral width of the plurality of divided pieces on the basis of a designated unit area.

8. The spatial-information generation apparatus according to claim 1, wherein the spatial-information generation apparatus enlarges or reduces a radius of the inscribed circle on the basis of performance of the second constituent elements or density of third constituent elements, which are one kind of the constituent elements of the building present in the region of the reference plane object, to thereby deform the rectangle circumscribing the inscribed circle, and generates, on the basis of the deformed rectangle, a divided piece for dividing the region of the reference plane object into a plurality of regions.

9. The spatial-information generation apparatus according to claim 5, wherein the spatial-structure machiner aggregates, on the basis of the first relation information, among a plurality of reference plane objects related to a spatial object related to a plurality of spaces, which are the constituent elements of the building, the reference plane objects adjacent to the reference plane object related to the first space.

10. The spatial-information generation apparatus according to claim 1, further comprising a machining-result shaper that grants, to the simplified reference plane object, on the basis of at least one of the first spatial object, the first attribute information, and the first relation information, information concerning height of the first spatial object and at least one of attribute information and relation information common to the reference plane object and the first spatial object to thereby generate a shaped object.

11. The spatial-information generation apparatus according to claim 5, further comprising a machining-result shaper that grants, to the divided piece, on the basis of at least one of the first spatial object, the first attribute information, and the first relation information, information concerning height of the first spatial object and at least one of attribute information and relation information common to the reference plane object and the first spatial object to thereby generate a shaped object.

12. The spatial-information generation apparatus according to claim 10, wherein the shape simplifier grants, when a part or all of designated third constituent elements are simplified, a restoration indicator for restoring the part or all of the third constituent elements, and the machining-result shaper restores the part or all of the third constituent elements on the basis of the restoration indicator.

13. The spatial-information generation apparatus according to claim 10, wherein the machining-result shaper outputs data representing, in a hierarchical structure, location information of the shaped object on the basis of at least one of a structural relation, a configuration relation, and a connection relation of the constituent elements configuring the building.

14. The spatial-information generation apparatus according to claim 1, further comprising:

an inputter that receives designation of the first spatial object;

an outputter that outputs an image of a shape of the simplified reference plane object of the first spatial object or data concerning the shape or location information of the simplified reference plane object of the first spatial object.

15. The spatial-information generation apparatus according to claim 1, further comprising an extractor that extracts, when the first space is designated, the first spatial object, the first attribute information, and the first relation information from a storage that stores the first spatial object, the first attribute information, and the first relation information, wherein the extractor determines a similarity degree of a shape of the simplified reference plane object related to the first space and a shape of the simplified reference plane object related to a third space, which is one of the constituent elements of the building and, when the similarity degree exceeds a predetermined threshold, extracts a third spatial object related to the third space when being instructed to extract a spatial object related to a space similar to the first space.

16. A spatial-information generation method generating spatial-information of a building which includes a plurality of spaces as constituent elements thereof, the method comprising:

acquiring, on the basis of a first spatial object related to a first space, which is one of the constituent elements, first attribute information indicating attributes of the first spatial object, and first relation information indicating a relation between the first spatial object and objects of other constituent elements of the building, a reference plane object related to a plane of a part of the first space from the first spatial object and generating a shape of the reference plane object based on at least one of the first attribute, the first relation information, and the reference plane object;

dividing the shape of the reference plane object into a plurality of sections;

setting at least one section of the plurality of sections as a simplification section, which is a target to be simplified;

simplifying the shape of the reference plane object in the simplification section to thereby generate the reference plane object in the simplified shape;

dividing a region of the reference plane object in Voronoi boundaries with second constituent elements, which are one kind of the constituent elements of the building included in the region of the reference plane object, set as generatrixes, respectively generates, for each of the second constituent elements, inscribed circles with the Voronoi boundaries centering on the second constituent elements and closest to the second constituent elements, respectively generates circumscribing rectangles for each of the inscribed circles, and generates, on the basis of the rectangles, divided pieces for dividing the region of the reference plane object into a plurality of regions; and generating a simulator feeding back space information to equipment controllers for determining a re-disposition plan of equipment acquired through comparison of machining results.

17. A non-transitory computer readable medium having a computer program for generating spatial-information of a building which includes a plurality of spaces as constituent elements thereof, the program causing a computer, when executed by the computer, to perform processes comprising:

acquiring, on the basis of a first spatial object related to a first space, which is one of the constituent elements, first attribute information indicating attributes of the first spatial object, and first relation information indicating a relation between the first spatial object and objects of other constituent elements of the building, a reference plane object related to a plane of a part of the first space from the first spatial object and generating a shape of the reference plane object based on at least one of the first attribute, the first relation information, and the reference plane object;

dividing the shape of the reference plane object into a plurality of sections;

setting at least one of section of the plurality of sections as a simplification section, which is a target to be simplified;

simplifying the shape of the reference plane object in the simplification section to thereby generate the reference plane object in the simplified shape;

dividing a region of the reference plane object in Voronoi boundaries with second constituent elements, which are one kind of the constituent elements of the building included in the region of the reference plane object, set as generatrixes, respectively generates, for each of the second constituent elements, inscribed circles with the Voronoi boundaries centering on the second constituent elements and closest to the second constituent elements, respectively generates circumscribing rectangles for each of the inscribed circles, and generates, on the basis of the rectangles, divided pieces for dividing the region of the reference plane object into a plurality of regions; and generating a simulator feeding back space information to equipment controllers for determining a re-disposition plan of equipment acquired through comparison of machining results.

18. The spatial-information generation apparatus according to claim 1, wherein the simplification-section setter sets, on the basis of the first relation information, shapes related to designated third constituent elements of the building in the shapes of the reference plane object.

19. A spatial-information generation apparatus generating spatial-information of a building which includes a plurality of spaces as constituent elements thereof, the apparatus comprising a processor configured to execute a program to provide at least:

a reference-plane acquirer that acquires, on the basis of a first spatial object related to a first space, which is one of the constituent elements, first attribute information indicating attributes of the first spatial object, and first relation information indicating a relation between the first spatial object and objects of other constituent elements of the building, a reference plane object related to a plane of a part of the first space from the first spatial object and generates a shape of the reference plane object based on at least one of the first attribute, the first relation information, and the reference plane object;

a simplification-section setter that divides the shape of the reference plane object into a plurality of sections on the basis of the first relation information, and sets at least one section of the plurality sections as a simplification section, which is a target to be simplified;

a shape simplifier that simplifies the shape of the reference plane object in the simplification section to thereby generate the reference plane object in the simplified shape;

a direction-axis acquirer that generates direction axes including orthogonal two axes on the basis of shapes related to second constituent elements, which are one kind of the constituent elements of the building, in the shape of the reference plane object and directions of the second constituent elements; and a simulator that feeds back space information to equipment controllers for determining a re-disposition plan of equipment acquired through comparison of machining results, wherein when there is a third straight line, which is not parallel to both of the direction axes, connected to one ends of first and second straight lines parallel to either one of the direction axes in the shape of the reference plane object, the shape simplifier generates a first intersection and a second intersection, which are intersections of a straight line passing a midpoint of the third straight line and perpendicular to the first and second straight lines and extended lines of the respective first and second straight lines, connects another end of the first straight line and the first intersection, connects another end of the second straight line and the second intersection, and connects the first intersection and the second intersection, and deletes the third straight line from the first straight line to thereby change the shape of the reference plane object to a shape parallel to the direction axes.

20. A spatial-information generation apparatus generating spatial-information of a building which includes a plurality of spaces as constituent elements thereof, the apparatus comprising a processor configured to execute a program to provide at least:

a reference-plane acquirer that acquires, on the basis of a first spatial object related to a first space, which is one of the constituent elements, first attribute information indicating attributes of the first spatial object, and first relation information indicating a relation between the first spatial object and objects of other constituent elements of the building, a reference plane object related to a plane of a part of the first space from the first spatial object and generates a shape of the reference plane object based on at least one of the first attribute, the first relation information, and the reference plane object;

a simplification-section setter that divides the shape of the reference plane object into a plurality of sections on the basis of the first relation information, and sets at least one section of the plurality of sections as a simplification section, which is a target to be simplified;

a shape simplifier that simplifies the shape of the reference plane object in the simplification section to thereby generate the reference plane object in the simplified shape;

a machining-result shaper that grants, to the simplified reference plane object, on the basis of at least one of the first spatial object, the first attribute information, and the first relation information, information concerning height of the first spatial object and at least one of attribute information and relation information common to the reference plane object and the first spatial object to thereby generate a shaped object; and a simulator that feeds back space information to equipment controllers for determining a re-disposition plan of equipment acquired through comparison of machining results, wherein the simplification-section setter determines, for each the simplification section, an allowable range of a sum of areas of portions to be simplified by the shape simplifier, the shape simplifier stores, for the simplification section, every time the simplification is performed, information concerning order of the simplification and a simplified portion, the spatial-information generation apparatus further comprises a machining-degree evaluator that grants, for each the simplification section, until the sum of the areas of the simplified portion decreases to be within the allowable range, a restoration indicator for restoring the simplified portion in the order of the simplification while tracing back the order of the simplification from last to first, and the machining-result shaper restores, for each the simplification section, on the basis of the restoration indicator in the order of the simplification, a portion simplified by the simplification.

* * * * *